United States Patent
Condello et al.

(10) Patent No.: US 10,666,872 B2
(45) Date of Patent: May 26, 2020

(54) SYSTEMS AND METHODS FOR IMPROVED FOCUS TRACKING USING A HYBRID MODE LIGHT SOURCE

(71) Applicant: ILLUMINA, INC., San Diego, CA (US)

(72) Inventors: Danilo Condello, San Diego, CA (US); Simon Prince, San Diego, CA (US); David Hargis, San Diego, CA (US); Jeffrey Bendick, San Diego, CA (US); Christophe Sigel, San Diego, CA (US)

(73) Assignee: ILLUMINA, INC., San Diego, CA (US)

( * ) Notice: Subject to any disclaimer, the term of this patent is extended or adjusted under 35 U.S.C. 154(b) by 0 days.

(21) Appl. No.: 15/913,878

(22) Filed: Mar. 6, 2018

(65) Prior Publication Data

US 2018/0262670 A1 Sep. 13, 2018

Related U.S. Application Data

(60) Provisional application No. 62/468,360, filed on Mar. 7, 2017.

(30) Foreign Application Priority Data

May 5, 2017 (NL) ..................................... 2018853

(51) Int. Cl.
*H01S 3/0941* (2006.01)
*G02B 21/06* (2006.01)
(Continued)

(52) U.S. Cl.
CPC ........... *H04N 5/2354* (2013.01); *G02B 21/06* (2013.01); *G02B 21/245* (2013.01); *G02B 21/361* (2013.01); *H01S 5/0653* (2013.01)

(58) Field of Classification Search
CPC .. G02B 21/245; G02B 21/06; G02B 21/0032; G02B 21/002; G02B 7/09; G02B 21/241;
(Continued)

(56) References Cited

U.S. PATENT DOCUMENTS

| 4,450,547 A | 5/1984 | Nakamura et al. |
| 5,453,835 A | 9/1995 | Ward et al. |

(Continued)

FOREIGN PATENT DOCUMENTS

| CN | 1904712 | 1/2007 |
| CN | 101109703 | 1/2008 |

(Continued)

OTHER PUBLICATIONS

T.A. Heumier et al. "Mode Hopping in Semiconductor Lasers", ILXLightwave Corporation, 2005, 7 pages (Year: 2005).*

(Continued)

*Primary Examiner* — Alison Slater
(74) *Attorney, Agent, or Firm* — Illumina, Inc.

(57) ABSTRACT

Systems and methods disclosed herein include an imaging system that may include a laser diode source; an objective lens positioned to direct a focus tracking beam from the light source onto a location in a sample container and to receive the focus tracking beam reflected from the sample; and an image sensor that may include a plurality of pixel locations to receive focus tracking beam that is reflected off of the location in the sample container, where the reflected focus tracking beam may create a spot on the image sensor. Some examples may further include a laser diode light source that may be operated at a power level that is above a power level for operation at an Amplified Spontaneous Emission ("ASE") mode, but below a power level for single mode operation.

23 Claims, 43 Drawing Sheets

(51) Int. Cl.
*G02B 21/00* (2006.01)
*G02B 21/36* (2006.01)
*G02B 27/10* (2006.01)
*H04N 5/235* (2006.01)
*G02B 21/24* (2006.01)
*H01S 5/065* (2006.01)

(58) Field of Classification Search
CPC .......... G02B 21/0056; G02B 27/4227; H01S 3/0941
See application file for complete search history.

(56) References Cited

U.S. PATENT DOCUMENTS

| | | | |
|---|---|---|---|
| 5,530,237 A | 6/1996 | Sato et al. | |
| 5,579,112 A | 11/1996 | Sugiyama et al. | |
| 6,307,636 B1 | 10/2001 | Spink | |
| 6,485,413 B1* | 11/2002 | Boppart | A61B 1/00096 356/450 |
| 6,657,216 B1 | 12/2003 | Poris | |
| 6,974,938 B1 | 12/2005 | Leblans et al. | |
| 7,550,699 B1 | 6/2009 | Marshall et al. | |
| 8,446,573 B1 | 5/2013 | Buermann et al. | |
| 9,036,021 B2* | 5/2015 | Kuster | G02B 21/025 348/79 |
| 9,164,242 B1 | 10/2015 | Li et al. | |
| 9,389,120 B2 | 7/2016 | Konradi et al. | |
| 9,557,549 B2 | 1/2017 | Yaqoob et al. | |
| 2008/0049223 A1 | 2/2008 | Iyoki | |
| 2008/0218849 A1 | 9/2008 | Uhl et al. | |
| 2009/0284727 A1 | 11/2009 | Muramatsu et al. | |
| 2010/0085992 A1* | 4/2010 | Rakuljic | G01D 5/266 372/20 |
| 2010/0208993 A1 | 8/2010 | Sambongi | |
| 2011/0188053 A1 | 8/2011 | Buermann et al. | |
| 2011/0286477 A1 | 11/2011 | Kuksenkov et al. | |
| 2012/0163789 A1 | 6/2012 | Masuno et al. | |
| 2013/0070076 A1 | 3/2013 | Kuster | |
| 2013/0161484 A1 | 6/2013 | Hu et al. | |
| 2014/0268149 A1 | 9/2014 | Zavislan et al. | |
| 2015/0172631 A1 | 6/2015 | Kasahara | |
| 2016/0018221 A1 | 8/2016 | Cha | |
| 2016/0220129 A1* | 8/2016 | Ostroverkhov | A61B 5/0261 |
| 2017/0229842 A1* | 8/2017 | Hatori | H01S 5/0427 |
| 2018/0351326 A1* | 12/2018 | Gorman | H01S 5/0428 |
| 2019/0063898 A1* | 2/2019 | Zalevsky | G01P 3/38 |

FOREIGN PATENT DOCUMENTS

| | | |
|---|---|---|
| CN | 100389339 | 5/2008 |
| CN | 102290706 | 12/2011 |
| CN | 102893213 | 1/2013 |
| CN | 104204722 | 12/2014 |
| CN | 104487803 | 4/2015 |
| CN | 208921603 U | 5/2019 |
| CN | 209215731 U | 8/2019 |
| EP | 2110696 | 10/2009 |
| GB | 2076176 | 11/1981 |
| JP | H09178666 | 7/1997 |
| JP | 10-68889 | 3/1998 |
| JP | 2001108684 | 4/2001 |
| JP | 2001174685 | 6/2001 |
| JP | 2005-217080 | 8/2005 |
| JP | 2006-023624 | 1/2006 |
| JP | 2013-506162 | 2/2013 |
| JP | 2015090404 | 5/2015 |
| JP | 2015-526764 | 9/2015 |
| JP | 2016089470 | 5/2016 |
| TW | 201326954 | 7/2013 |
| WO | 9206359 | 4/1992 |
| WO | 1992006359 | 4/1992 |
| WO | 2001020252 | 3/2001 |
| WO | 2003/025658 | 3/2003 |
| WO | 2006/037222 | 4/2006 |
| WO | 2010/103389 | 9/2010 |

OTHER PUBLICATIONS single_mode_operation.pdf, https://www.rp-photonics.com/single_mode_operation.html (Year: 2019).*
NL Search Report and Written Opinion for NL Application No. 2018853 dated Jan. 29, 2018, 14 pages.
T.A. Heumier et al. "Mode Hopping in Semiconductor Lasers", ILXLightwave Corporation, 2005, 7 pages.
Geroge R. Gray and Rajarshi Roy, "Bisability and Mode Hopping in a Semiconductor Laser", School of Physics, Georgia Institute of Technology, Atlanta, GA, J. Opt., Soc. Am, B. vol. 8, No. 3. Mar. 1991, 4 pages.
NL2018854, Search Report and Written Opinion dated Feb. 20, 2018, 14 pages.
NL2018857, Search Report and Written Opinion dated Feb. 5, 2018, 14 pages.

* cited by examiner

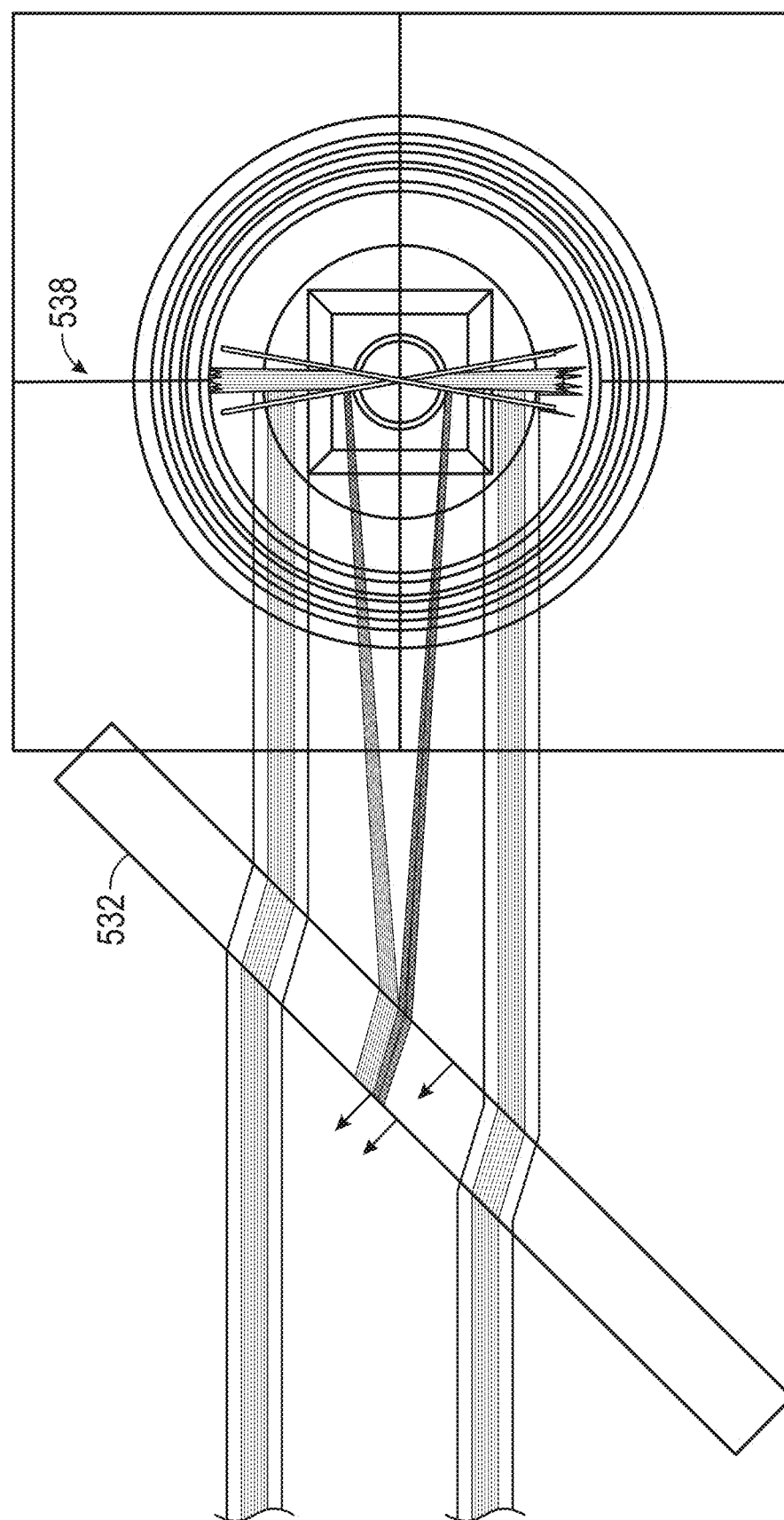

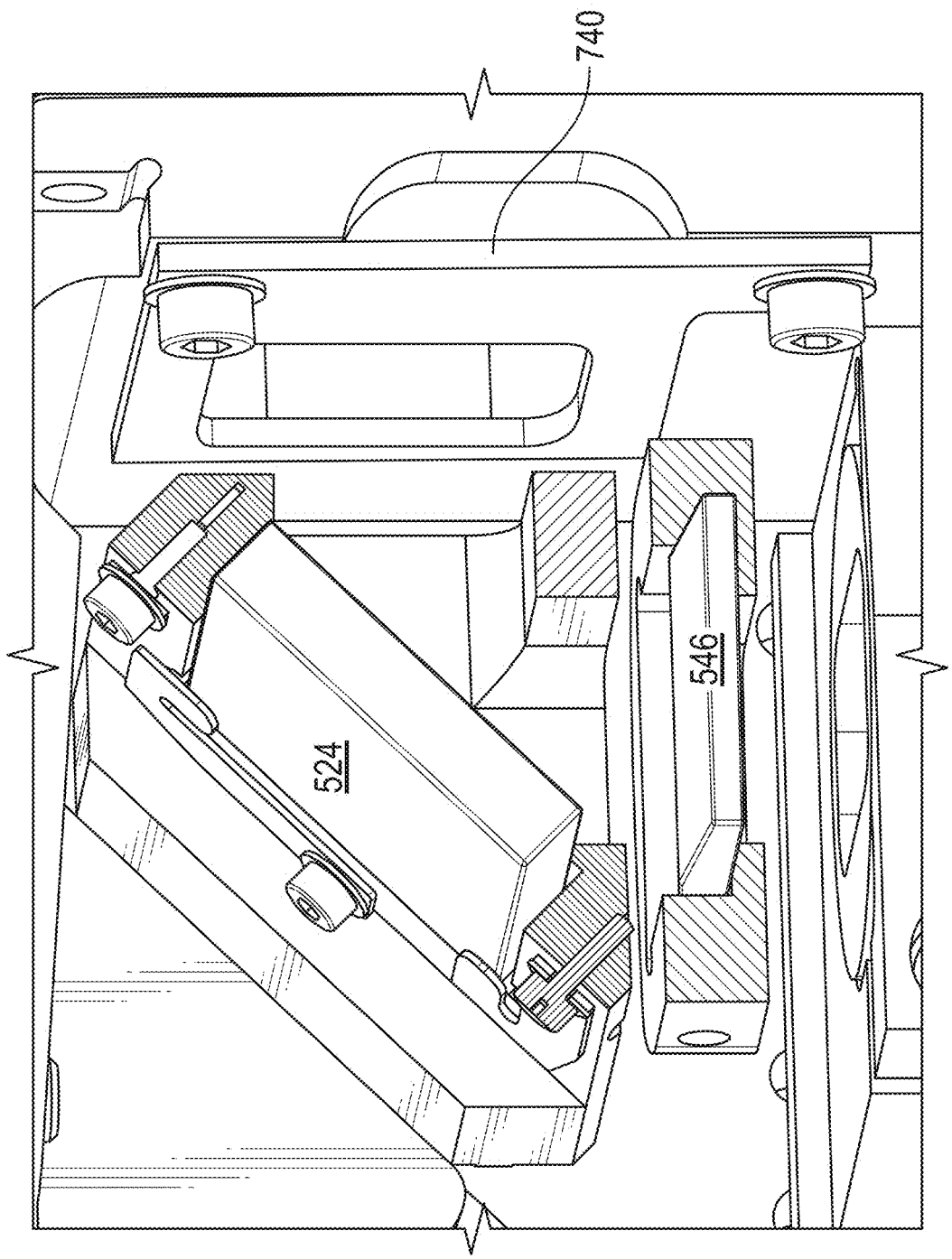

SYSTEMS AND METHODS FOR IMPROVED FOCUS TRACKING USING A HYBRID MODE LIGHT SOURCE

CROSS REFERENCE TO RELATED APPLICATIONS

This application claims the benefit of U.S. Provisional Application No. 62/468,360, filed Mar. 7, 2017, which is hereby incorporated herein by reference in its entirety. This application also claims priority to Netherlands Patent Application No. N2018853, filed on May 5, 2017, which is hereby incorporated herein by reference in its entirety.

BACKGROUND

Numerous advances in the field of biology have benefited from improved imaging systems and techniques, such as, for example, those used in optical microscopes and scanners. Obtaining accurate focus during imaging using these imaging systems can be important for successful imaging operations. Additionally, decreasing the latency associated with focusing the system on a sample increases the speed at which the system can operate.

Many pre-existing scanning systems use a multi-beam focus track system to determine focus distances for a given sample. The multi-beam system focuses two beams onto the sample using objective lens. The focus beams are reflected from the surface of the sample and reflected beams are directed toward an image sensor. Reflected beams form spots on the image sensor and the distance between the spots can be used to determine the focus distance.

Designers of pre-existing systems are constantly striving to improve focus accuracy and the speed with which the system can determine the focus setting. Improving accuracy can be important in that it can allow the system to achieve better results. Reducing latency can be an important consideration because it can allow the system to reach a focus determination more quickly, thus allowing the system to complete scanning operations faster.

SUMMARY

Various examples of the technologies disclosed herein provide systems and methods for improving accuracy of focus tracking in optical systems. Further examples provide systems and methods for reducing latency associated with focus tracking in optical scanners. In some examples, the imaging system includes a laser diode source, an objective lens positioned to direct a focus tracking beam from the light source onto a location in a sample container and to receive the focus tracking beam reflected from the sample. Additionally, the image sensor may further include a plurality of pixel locations to receive a focus tracking beam that is reflected off of the location in the sample container, where the reflected focus tracking beam creates a spot on the image sensor. The laser diode light source may be operated at a power level that is above a power level for operation at an Amplified Spontaneous Emission ("ASE") mode, but below a power level for single mode operation.

In further examples, the power level at which the laser diode light source is operated may be at an input current that is between about 2%-10% above the lasing threshold current for the laser diode. Furthermore, by way of example only, the laser operating current may be set between at about 0.6 and 3.0 mA above the threshold current.

In some examples, the laser power may be set such that the laser spectrum full width at about 5% is greater than 2 nm. In other instances, by way of example only, the laser power may be set such that the laser spectrum full width at about 5% is greater than 3 nm. Additionally, the power level at which the laser diode light source is operated may be selected such that the dominant peak in the laser diode output at a given frequency has a normalized intensity of between about 15%-100% greater than any secondary peaks in the laser diode output. In other instances, by way of example only, the power level at which the laser diode light source is operated may be selected such that the dominant peak in the laser diode output at a given frequency has a normalized intensity of between about 15%-25% greater than a normalized intensity of a secondary peak in the laser diode output. By way of another example only, the power level at which the laser diode light source is operated may be selected such that the dominant peak in the laser diode output at a given frequency has a normalized intensity of between about 15%-100% greater than a normalized intensity of a secondary peaks in the laser diode output. By way of further example only, the dominant peak in the laser diode output at a given frequency has a normalized intensity of between about 15%-200% greater than a normalized intensity of a secondary peak in the laser diode output.

In additional examples, the imaging system may further include a beam splitter to split the focus tracking beam from the light source into at least two focus tracking beams to be reflected off of the location in the sample container and provide at least two spots on the image sensor, such that the power level at which the laser diode light source is operated is selected with a spot stability separation of at least two spots on the image sensor is less than about +/−25 nm. In another example, by way of example only, the spot stability separation of the at least two spots on the image sensor is less than about +/−18 nm.

Additionally, by way of example, the power level at which the laser diode light source is operated may be selected such that the amount of fringing on the spot on the image sensor is less than about 10% peak to peak across the profile. In other examples, the power level at which the laser diode light source is operated is selected such that the amount of fringing on the spot of the image sensor affects spot separation stability greater than a predetermined amount.

In some examples, the imaging system may further include a windowed sinc filter or Blackman window filter communicatively coupled to the image sensor to receive output signals from the image sensor to reduce a standard deviation of a position of the spot over time on the image sensor.

By further way of example only, the power level at which the laser diode light source is operated may be selected as the minimum power at which an exposure time for the image sensor to sense the beam is not longer than a time limit to meet a predetermined latency requirement for focus tracking. Additionally, the exposure time required by the image sensor may be less than about 250 µs by way of example only.

In other examples, the imaging system may include a laser diode light source, a beam splitter disposed in the imaging system at a position to receive a focus tracking beam from the light source and to split the focus tracking beam into at least two focus tracking beams; an objective lens positioned to direct the at least two focus tracking beams from the light source onto a location in a sample container and to receive reflections of the focus tracking beams reflected from the sample; an image sensor comprising a plurality of pixel locations to receive the focus tracking beams reflected off of the location in the sample container, such that at least two reflected focus tracking beams create at least two spots on the image sensor; where the power level at which the laser diode light source is operated is selected such that spot stability separation of the at least two spots on the image sensor is less than about 20 nm. Additionally, by way of further example only, the power level at which the laser diode light source is operated is selected such that spot stability separation of at least two spots on the image sensor is between about 15 and 17 nm.

In further examples, the imaging system may further include a windowed sinc filter circuit or a Blackman window filter circuit communicatively coupled to the image sensor to receive output signals from the image sensor and to reduce a standard deviation of a position of at least two spots over time on the image sensor. Furthermore, by way of example only, the power level at which the laser diode light source is operated may be the amount fringing on the spot on the image sensor is less than about 10% peak to peak across the profile. In other instances, the laser diode light source is operated such that the amount of fringing on the spot on the image sensor does affect spot separation stability greater than a predetermined amount.

By way of example only, the power level at which the laser diode light source is operated may be selected such that a standard deviation of each of at least two spots on the image sensor is less than 10% of the pixel size of the image sensor. In other instances, the spot stability separation of at least two spots on the image sensor is less than about 5% of the pixel size of the image sensor. In other instances, the power level at which the laser diode light source is operated may be selected as the minimum power at which an exposure time required by the image sensor to sense the beam is not longer than a time limit required to meet a predetermined latency requirement for focus tracking. Additionally, in some instances, the exposure time required by the image sensor is less than about 250 µs.

In some examples, the laser diode may be operated at a low power level to reduce fringing of the focus tracking beam spots on the image sensor. In other instances, the laser power is set below that corresponding to onset of fringes. Additionally, the laser operating current may be set between about 0.6 and 3.0 mA above the threshold current. Additionally, the laser power may be set such that laser spectrum full width at about 5% is greater than 2 nm. In other instances, the laser power is set such that laser spectrum full width at about 5% is greater than 3 nm.

Other features and aspects of the disclosed technology will become apparent from the following detailed description, taken in conjunction with the accompanying drawings, which illustrate, by way of example, the features in accordance with examples of the systems and methods described herein. The summary is not intended to limit the scope of the invention, which is defined solely by the claims attached hereto.

BRIEF DESCRIPTION OF THE DRAWINGS

The technology disclosed herein, in accordance with one or more example implementations, is described in detail with reference to the following figures. These figures are provided to facilitate the reader's understanding of the disclosed technology, and are not intended to be exhaustive or to limit the disclosure to the precise forms disclosed. Indeed, the drawings in the figures are provided for purposes of illustration only, and merely depict example implementations of the disclosed technology. Furthermore, it should be noted that for clarity and ease of illustration, the elements in the figures have not necessarily been drawn to scale.

Some of the figures included herein illustrate various examples of the disclosed technology from different viewing angles. Although the accompanying descriptive text may refer to such views as "top," "bottom" or "side" views, such references are merely descriptive and do not imply or require that the disclosed technology be implemented or used in a particular spatial orientation unless explicitly stated otherwise.

FIG. 2A illustrates an example optical design for focus tracking in accordance with one example implementation of the systems and methods described herein. FIG. 2B is a diagram illustrating an alternative view of a portion of the optical system shown in FIG. 2A.

FIG. 15A is a top-down view illustrating an example of the focus tracking beams reflected off surfaces S2 and S4 returned from the objective lens and directed toward splitter.

FIG. 18B illustrates an example placement of the aperture in front of the beam splitter normal to the beam axis.

Figure 1:
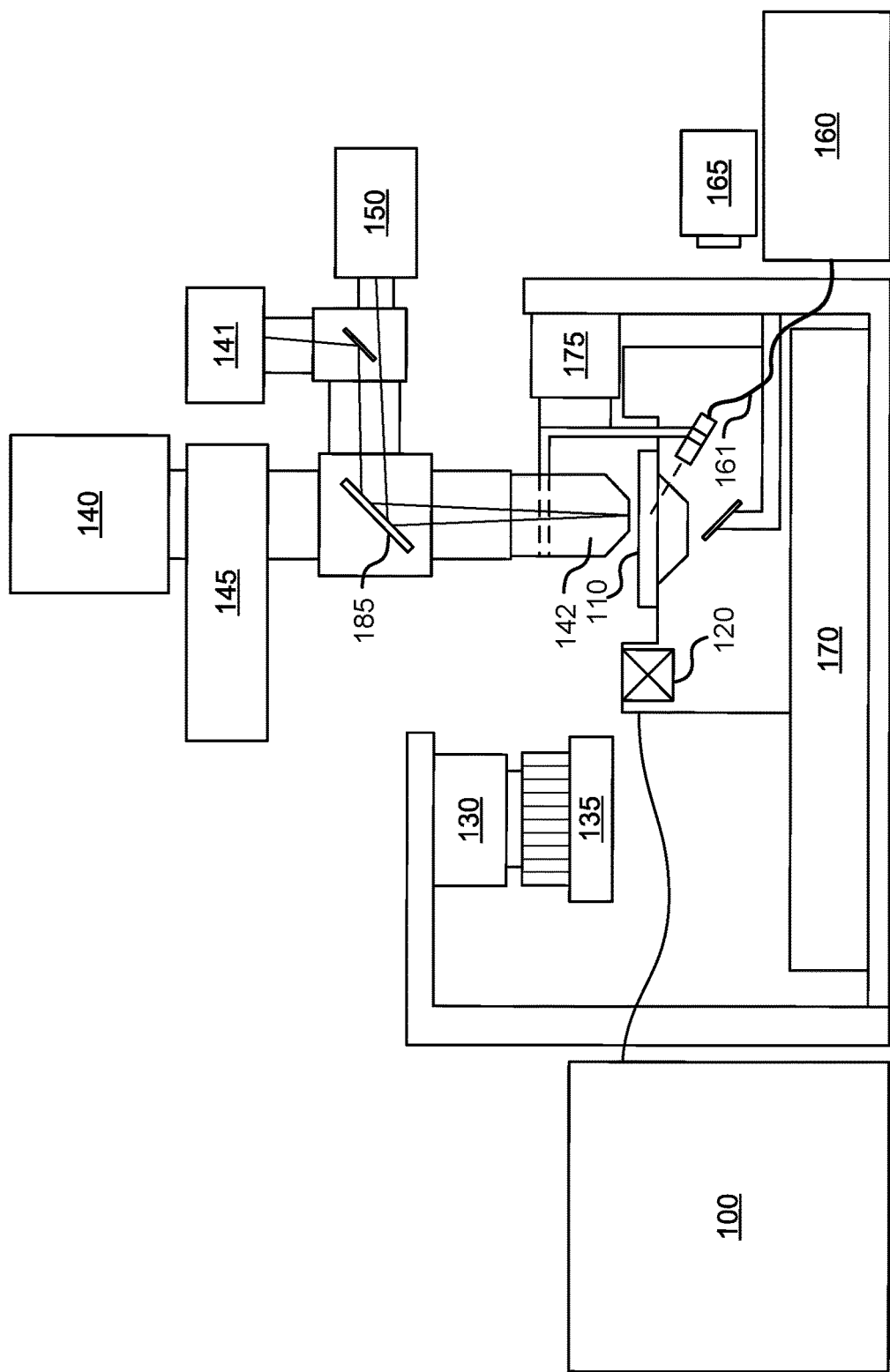
FIG. 1 illustrates a simplified block diagram of one example of an image scanning system with which systems and methods disclosed herein may be implemented.

It should be understood that the disclosed technology can be practiced with modification and alteration, and that the disclosed technology be limited only by the claims and the equivalents thereof.

DETAILED DESCRIPTION

Various example implementations of the technologies disclosed herein provide systems and methods for improving or reducing latency associated with focus tracking in optical scanners. Various additional examples provide systems and methods for improving the accuracy of focus tracking systems in optical scanners. Still further examples combine aspects of both. For example, in some examples, systems and methods are provided to block stray light caused by unwanted reflections from a sample container from reaching the image sensor and hindering the detection of the focus tracking beams. In some applications, a sample container for the scanning system may include a sample layer sandwiched between two or more other layers. In such applications, the surfaces presented by the multi-layer sample container may each present a reflected beam back to the objective lens and into the return path of the scanning system. Unwanted reflections, which in some cases may be much stronger than reflections from the sample layer, can decrease the signal-to-noise ratio at the image sensor making it difficult to detect the actual focus tracking beams amid all the other optical noise. Unwanted reflections or scattered beams may also overlap with and coherently interfere with focus tracking spots at the image sensor, and cause fringes to appear, thereby degrading accuracy of focus tracking. Examples of the systems and methods disclosed herein can place apertures, blocking bars, or other blocking members at one or more points along the return signal path to provide optically opaque structures to block the unwanted beams reflected off of the other surfaces from reaching the image sensor.

As another example, further configurations can include an optical structure, such as a lens or other curved or partially curved optical element in the optical path to shape the focus tracking laser beams. In various examples, this can be implemented by inserting the optical element in the optical path prior to the objective lens to position a beam waist within the system. More particularly, in some implementations, the optical element is positioned in the optical path at a determined distance from the output of the optical fiber so as to place a beam waist of the one or more focus tracking beams at a desired location along the optical path. The position of the beam waist along the optical path may be chosen such that the resultant spots from the focus tracking beams reflected off multiple surfaces of interest of the sample container are the same size or substantially the same size as one another at the image sensor plane to improve focus tracking accuracy and latency. In further implementations, an adjustment mechanism can be provided to adjust the location of the optical element for optimal placement of the beam waist along the optical path.

As yet another example, further implementations include configuration and adjustment of the optical source for the focus tracking beams. More particularly, some examples may be configured to adjust and set the power level at which a laser diode source operates to reduce fringing of the focus tracking beam spots on the image sensor and to provide a more stable and consistent spot placement. The power level of the laser can be set such that the laser diode is operating in a quasi-lasing mode or hybrid mode, combining aspects of both an ASE mode of operation and a lasing mode of operation. The power level can be set within a range that is at the high end below the power at which the laser diode emits what would normally be considered as highly coherent light, with a single dominant spectral peak and negligible secondary peaks; and at the low end above the power at which the laser fully emits temporally incoherent light, also called amplified spontaneous emission (ASE).

Before describing further examples of the systems and methods disclosed herein, it is useful to describe an example environment with which the systems and methods can be implemented. One such example environment is that of an image scanning system, such as that illustrated in FIG. 1. The example imaging scanning system may include a device for obtaining or producing an image of a region. The example outlined in FIG. 1 shows an example imaging configuration of a backlight design implementation.

As can be seen in the example of FIG. 1, subject samples are located on sample container 110, which is positioned on a sample stage 170 under an objective lens 142. Light source 160 and associated optics direct a beam of light, such as laser light, to a chosen sample location on the sample container 110. The sample fluoresces and the resultant light is collected by the objective lens 142 and directed to a photo detector 140 to detect the florescence. Sample stage 170 is moved relative to objective lens 142 to position the next sample location on sample container 110 at the focal point of the objective lens 142. Movement of sample stage 110 relative to objective lens 142 can be achieved by moving the sample stage itself, the objective lens, the entire optical stage, or any combination of the foregoing. Further examples may also include moving the entire imaging system over a stationary sample.

Fluid delivery module or device 100 directs the flow of reagents (e.g., fluorescent nucleotides, buffers, enzymes, cleavage reagents, etc.) to (and through) sample container 110 and waist valve 120. In particular examples, the sample container 110 can be implemented as a flowcell that includes clusters of nucleic acid sequences at a plurality of sample locations on the sample container 110. The samples to be sequenced may be attached to the substrate of the flowcell, along with other optional components.

The system also comprises temperature station actuator 130 and heater/cooler 135 that can optionally regulate the temperature of conditions of the fluids within the sample container 110. Camera system 140 can be included to monitor and track the sequencing of sample container 110. Camera system 140 can be implemented, for example, as a CCD camera, which can interact with various filters within filter switching assembly 145, objective lens 142, and focusing laser/focusing laser assembly 150. Camera system 140 is not limited to a CCD camera and other cameras and image sensor technologies can be used.

Light source 160 (e.g., an excitation laser within an assembly optionally comprising multiple lasers) or other light source can be included to illuminate fluorescent sequencing reactions within the samples via illumination through fiber optic interface 161 (which can optionally comprise one or more re-imaging lenses, a fiber optic mounting, etc). Low watt lamp 165, focusing laser 150, and reverse dichroic 185 are also presented in the example shown. In some examples focusing laser 150 may be turned off during imaging. In other examples, an alternative focus configuration can include a second focusing camera (not shown), which can be a quadrant detector, a Position Sensitive Detector (PSD), or similar detector to measure the location of the scattered beam reflected from the surface concurrent with data collection.

Although illustrated as a backlit device, other examples may include a light from a laser or other light source that is directed through the objective lens 142 onto the samples on sample container 110. Sample container 110 can be ultimately mounted on a sample stage 170 to provide movement and alignment of the sample container 110 relative to the objective lens 142. The sample stage can have one or more actuators to allow it to move in any of three dimensions. For example, in terms of the Cartesian coordinate system, actuators can be provided to allow the stage to move in the X, Y and Z directions relative to the objective lens. This can allow one or more sample locations on sample container 110 to be positioned in optical alignment with objective lens 142.

A focus (z-axis) component 175 is shown in this example as being included to control positioning of the optical components relative to the sample container 110 in the focus direction (referred to as the z axis, or z direction). Focus component 175 can include one or more actuators physically coupled to the optical stage or the sample stage, or both, to move sample container 110 on sample stage 170 relative to the optical components (e.g., the objective lens 142) to provide proper focusing for the imaging operation. For example, the actuator may be physically coupled to the respective stage such as, for example, by mechanical, magnetic, fluidic or other attachment or contact directly or indirectly to or with the stage. The one or more actuators can be configured to move the stage in the z-direction while maintaining the sample stage in the same plane (e.g., maintaining a level or horizontal attitude, perpendicular to the optical axis). The one or more actuators can also be configured to tilt the stage. This can be done, for example, so that sample container 110 can be leveled dynamically to account for any slope in its surfaces.

Focusing of the system generally refers to aligning the focal plane of the objective lens with the sample to be imaged at the chosen sample location. However, focusing can also refer to adjustments to the system to obtain a desired characteristic for a representation of the sample such as, for example, a desired level of sharpness or contrast for an image of a test sample. Because the usable depth of field of the focal plane of the objective lens is very small (sometimes on the order of about 1 μm or less), focus component 175 closely follows the surface being imaged. Because the sample container is not perfectly flat as fixtured in the instrument, focus component 175 may be set up to follow this profile while moving along in the scanning direction (referred to as the y-axis).

The light emanating from a test sample at a sample location being imaged can be directed to one or more detectors 140. Detectors can include, for example a CCD camera. An aperture can be included and positioned to allow only light emanating from the focus area to pass to the detector. The aperture can be included to improve image quality by filtering out components of the light that emanate from areas that are outside of the focus area. Emission filters can be included in filter switching assembly 145, which can be selected to record a determined emission wavelength and to cut out any stray laser light.

In various applications, sample container 110 can include one or more substrates upon which the samples are provided. For example, in the case of a system to analyze a large number of different nucleic acid sequences, sample container 110 can include one or more substrates on which nucleic acids to be sequenced are bound, attached or associated. In various implementations, the substrate can include any inert substrate or matrix to which nucleic acids can be attached, such as for example glass surfaces, plastic surfaces, latex, dextran, polystyrene surfaces, polypropylene surfaces, polyacrylamide gels, gold surfaces, and silicon wafers. In some applications, the substrate is within a channel or other area at a plurality of locations formed in a matrix or array across the sample container 110.

Although not illustrated, a controller can be provided to control the operation of the scanning system. The controller can be implemented to control aspects of system operation such as, for example, focusing, stage movement, and imaging operations. In various implementations, the controller can be implemented using hardware, machine-readable instructions or algorithm, or a combination of the foregoing. For example, in some implementations the controller can include one or more CPUs or processors with associated memory. As another example, the controller can comprise hardware or other circuitry to control the operation. For example, this circuitry can include one or more of the following: field programmable gate array (FPGA), application specific integrated circuit (ASIC), programmable logic device (PLD), complex programmable logic device (CPLD), a programmable logic array (PLA), programmable array logic (PAL) or other similar processing device or circuitry. As yet another example, the controller can comprise a combination of this circuitry with one or more processors.

Generally, for focusing operations, a focus beam generated by a focusing laser is reflected off of the sample location to measure the required focus, and the sample stage is moved relative to the optical stage to focus the optical stage onto a current sample location. The movement of the sample stage relative to the optical stage for focusing is generally described as movement along the z-axis or in the z direction. The terms "z-axis" and "z direction" are intended to be used consistently with their use in the art of microscopy and imaging systems in general, in which the z-axis refers to the focal axis. Accordingly, a z-axis translation results in increasing or decreasing the length of the focal axis. A z-axis translation can be carried out, for example, by moving a sample stage relative to an optical stage (e.g., by moving the sample stage or an optical element or both). As such, z-axis translation can be carried out by driving an objective lens, the optical stage, or the sample stage, or a combination of the foregoing, any of which can be driven by actuating one or more servos or motors or other actuators that are in functional communication with the objective lens or the sample stage or both. In various implementations, the actuators can be configured to tilt the sample stage relative to the optical stage to, for example, effectively level the sample container on a plane perpendicular to the optical imaging axis. Where this dynamic tilting is performed to effectively level the sample locations on the sample container, this can allow the sample container to be moved in the x and y directions for scanning with little or no movement in the z-axis required.

Figure 2A:
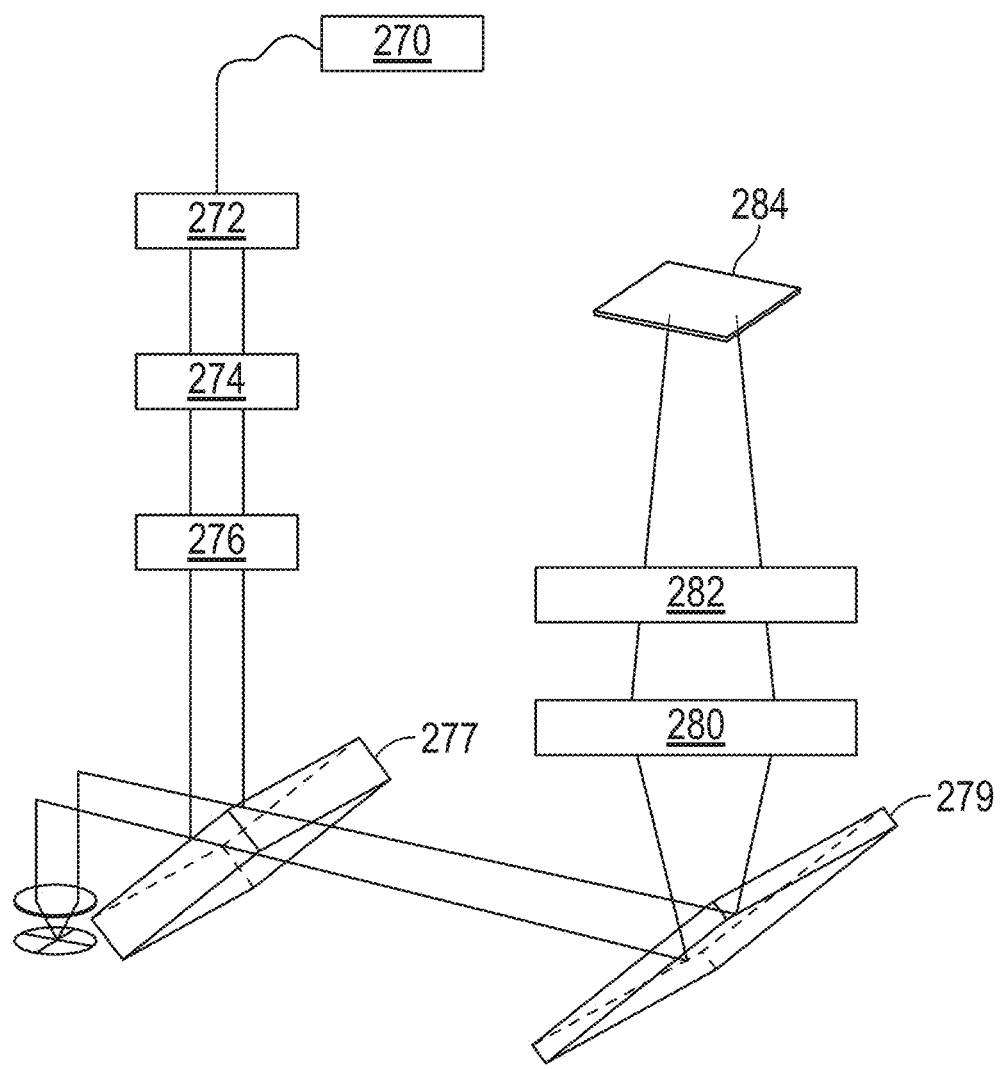
FIGS. 2A and 2B illustrate an example optical system for focus tracking. Particularly.
Figure 2B:
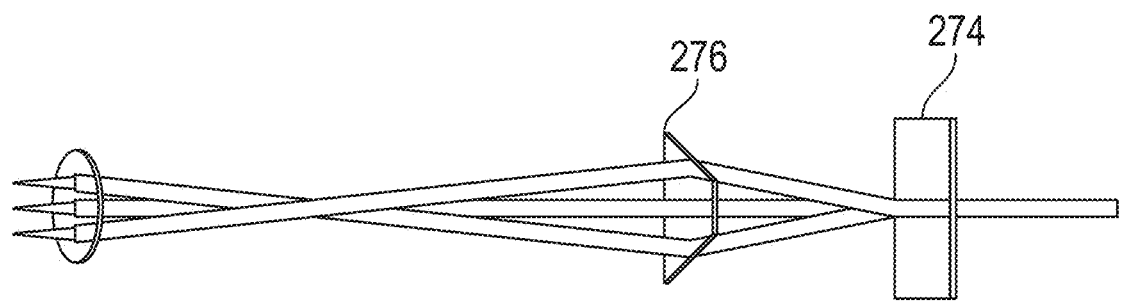

FIG. 2, which comprises FIGS. 2A and 2B illustrates an example optical system for focus tracking. Particularly, FIG. 2A illustrates one example optical design for focus tracking. FIG. 2B is a diagram illustrating an alternative view of a portion of the optical system shown in FIG. 2A. To avoid clutter and facilitate the reader's understanding, the example shown in FIG. 2A is illustrated with a single beam, which is a center beam in this case. The system may operate with more than one beam such as, for example, with 3 beams. A three-beam system can provide, for example, look-ahead and look-behind focus tracking.

Referring now to FIG. 2A, laser 270 generates light for the focusing beams and is optically coupled into the system. Light from laser 270 can be coupled via a fiber for example to a beam splitter prism 272, such as a lateral displacement beam splitter. Filters may be included, if needed, such as for source selection. Prism 272 splits the transmit beam into two substantially parallel, spots of roughly equal intensity. This can be included to provide for differential measurement in the focusing model.

A diffraction grating 274 generates multiple copies of the input beams. In other configurations, a beam splitter cube or multiple laser sources can be used to generate the multiple beams. In the case of a three-beam system, diffraction grating 274 may generate three output beams for each of the two input beams. An example of this for one input beam is shown at FIG. 2B. Because the diffraction grating can generate beams that are divergent (as also shown in FIG. 2B), a flat-top, or dove prism, 276 redirects the multiple beams. In some implementations, the prism is configured such that the beams converge at the pupil of the objective lens 142 so the beams at the sample container are normal to the sample container. An example of this for a three-output-beam configuration is shown at FIG. 2B. The received signal from the sample container returns through the beam splitter 277 and reflects off mirror 279. Because each beam pair is diverging, receive prisms 280 and 282 consolidate the spots onto the focal plane of image sensor 284. In some examples, these can be implemented as dove and roof prisms to refract and aim the rays exiting the microscope object to fit on the image sensor array. A roof prism can be used to refract the return beams to consolidate the spots within a spot pair onto the focal plane of the image sensor, and a dove prism to refract the fore/aft spot pairs to consolidate all spot pairs onto the focal plane. With three-beam look-ahead, 3 beams pass through each of the two prism halves of the roof prism. However, in the other axis, the beams are diverging, which is why the dove prism is included to correct those.

In the various examples described above with reference to FIG. 2, various optical components are implemented using prisms. Some or all of these may be implemented using lenses, however prisms may be desirable as these components are generally less sensitive to misalignment as compared to their lens counterparts. Prisms may also be more desirable than lens systems because prisms are generally more compact and include fewer elements.

Objective lens 142 in the examples of FIGS. 1 and 2 provides a generally circular field of view on the sample container. In one implementation, the center of the field of view is the current sample location being imaged. The direction of scan within that field of view is either the x or the y axis. For purposes of discussion, the direction of scan will be assumed to be in the y direction. A light source, such as an LED or laser light source generates the focusing beams. In the illustrated example, three beams are used to provide a three-point differential off-axis predictive focus estimation—one beam for the current sample location and two additional beams for look-ahead and look-behind focus tracking. These two additional beams are used to determine the focus distance along the z axis between the optical stage and sample locations on the sample container.

The system described in FIGS. 1 and 2 illustrates an example system with which the systems and methods described herein may be implemented. Although the systems and methods may be described herein from time to time in the context of this example system, this is only one example with which these systems and methods might be implemented. The systems and methods described herein can be implemented with this and other scanners, microscopes and other imaging systems.

Pre-existing scanning systems use collimated light for focusing operations. In such systems, collimated light, which maintains a fairly consistent diameter throughout the length of the beam, is directed to the objective lens. An example of this is shown in FIG. 2A (described above), in which the collimated beams are delivered to the objective lens. The objective lens focuses the collimated light onto the sample. Light reflected from the sample returns through the objective, and is re-collimated. The reflected, collimated beam is then directed to the system's image sensor (e.g., image sensor 284 in the example of FIG. 2A). The reflected beams' locations on the image sensor are determined for focusing purposes. For example, with a two beam system the distance between spot locations on the image sensor is measured to determine focusing.

While collimated light is a known light source in scanning systems, the inventors have discovered that collimated light can adversely affect focus tracking operations in various applications. One adverse effect relates to the spot size resulting from using collimated light for the focus tracking beams. Because collimated light retains a relatively consistent diameter throughout the optical path the focus tracking beams image a relatively large spot size on the image sensor. The larger spot sizes encompass a greater number of pixels on the image sensor, which increases the number of rows of pixels of the image sensor that need to be measured. This increases the amount of time required for focus tracking operations.

Figure 3A:
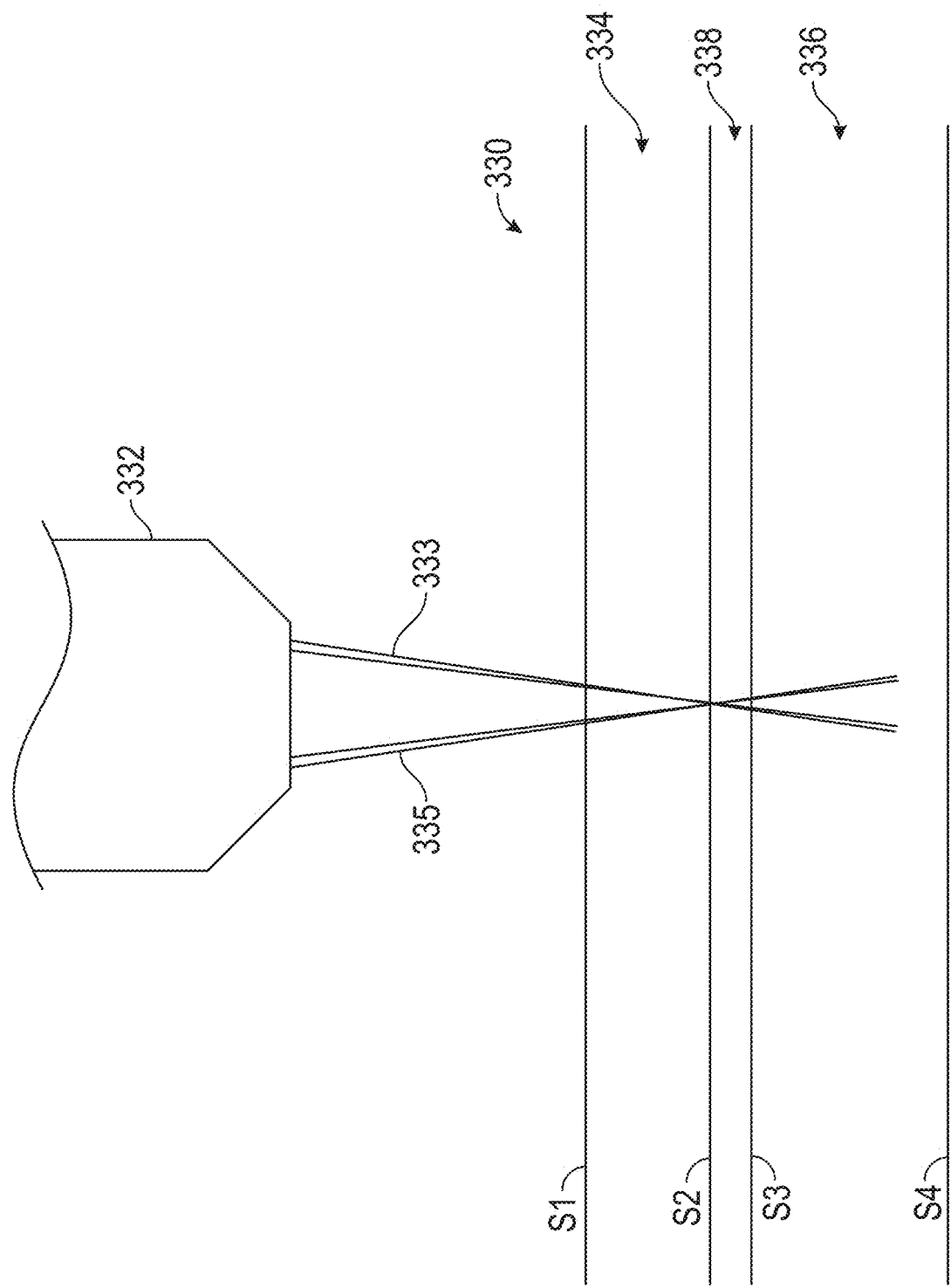
FIG. 3A illustrates an example of a sample container configured to house one or more samples to be imaged that comprises multiple layers.
Figure 3B:
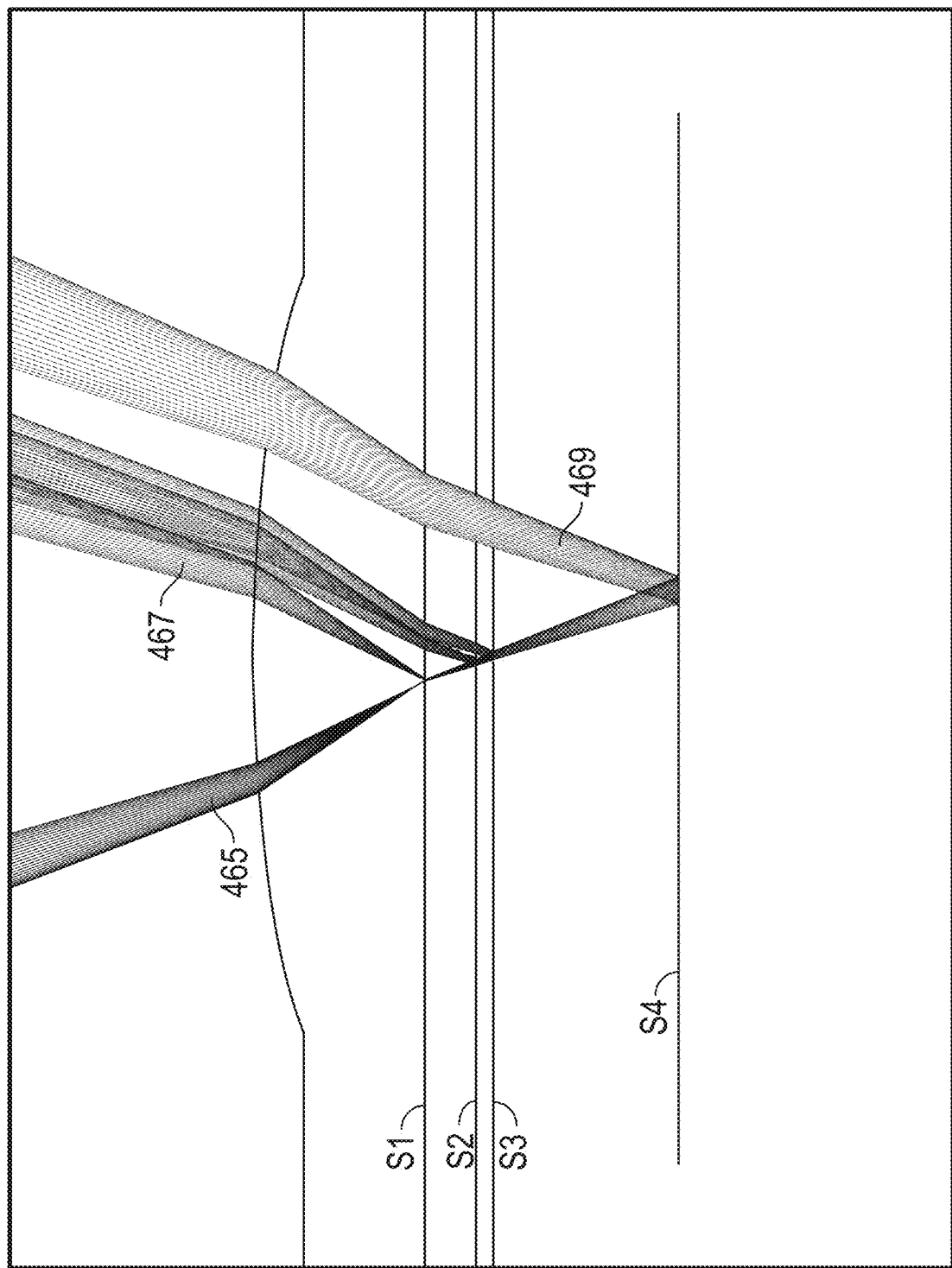
FIG. 3B is a diagram illustrating an example of the creation of desired and unwanted reflections off of the multiple surfaces of a multilayer sample container in some environments.
Figure 3C:
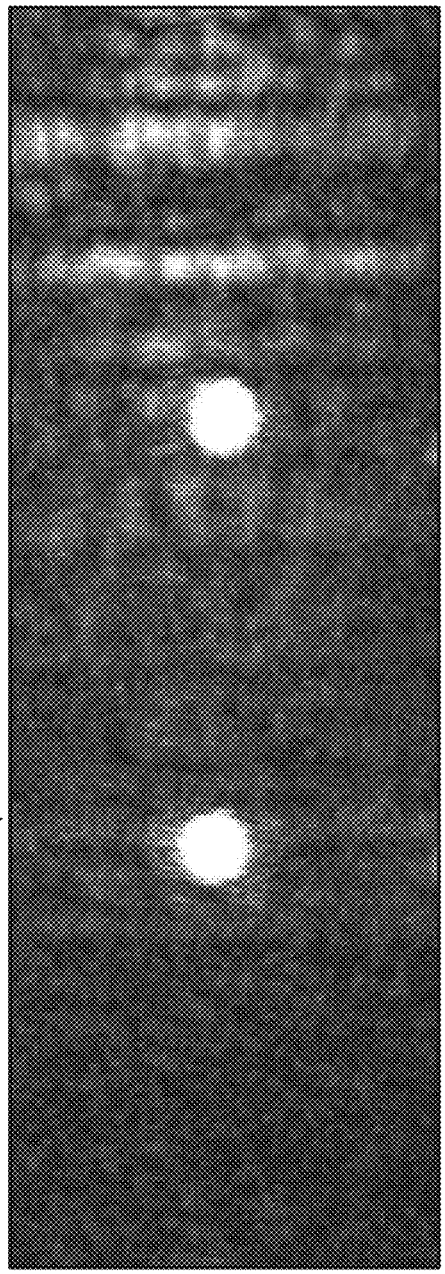
FIG. 3C is a diagram illustrating an example of the effect of the unwanted reflections on the image sensor.

Another adverse effect can arise in systems where the objective may be used to focus at multiple different surfaces but is not moved in an amount equal the distance between those different surfaces. In this scenario, different spot sizes for the focus tracking beams reflected off the different surfaces can appear on the image sensor, impacting focus tracking operations. FIGS. 3A-C are diagrams illustrating an example of such a phenomenon. More particularly, FIG. 3A illustrates an example in which a sample container containing one or more samples to be imaged comprises multiple layers. With reference now to FIG. 3A, sample container 330 includes 3 layers 334, 338 and 336. In this 3-layer example, there are four surfaces between the layers. These are illustrated at surfaces S1, S2, S3 and S4. Also illustrated in this example is an objective lens 332 which focuses the focus tracking beams 333, 335 (there are 2 in a 2-beam system) onto sample container 330 for focusing operations.

For focus tracking operations, it may be important to focus the imaging beam to surface S2 in some instances and to surface S3 in other instances. Assume that the separation between the surfaces S2 and S3 is fixed at a distance X. In some applications, depending on the operation of objective lens 332, objective lens may move a distance greater than or less than distance X when changing focus between surfaces S2 and S3. Consequently, focusing tracking beams 333, 335 reflected off surfaces S2 and S3 may be re-collimated at a different diameter causing the S2 beams to present a different spot size from the S3 beams.

Figure 4A:
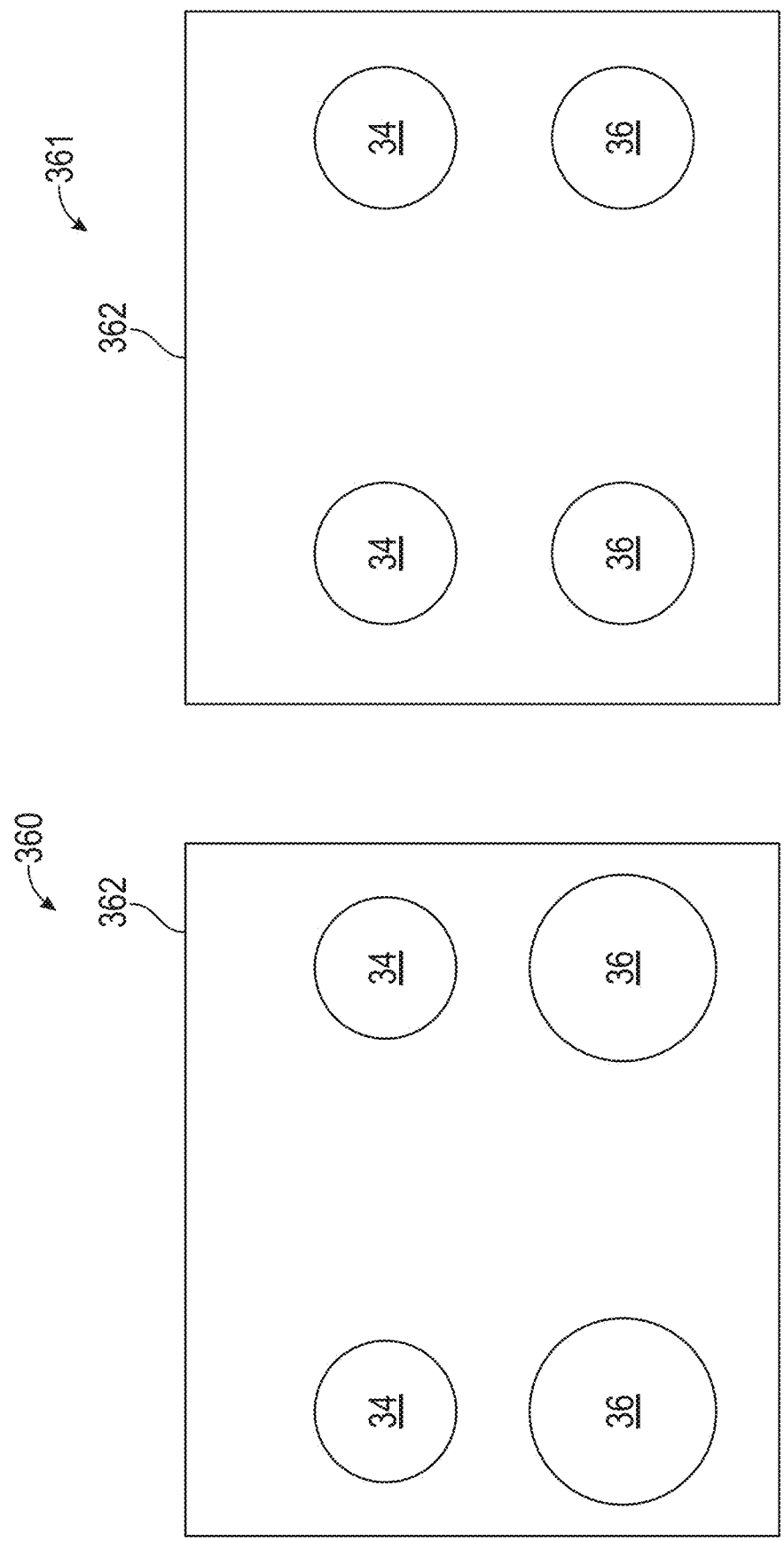
FIG. 4A illustrates a portion of an image sensor comprising a plurality of pixels (not shown for clarity of illustration) onto which the focus tracking beams are directed in accordance with one example implementation of the systems and methods described herein.

An example of this is illustrated in FIG. 4A. More particularly, FIG. 4A illustrates a portion of an image sensor 362 comprising a plurality of pixels (not shown for clarity of illustration) onto which the focus tracking beams are directed. On the left-hand side of the figure in scenario 360, this illustrates an image sensor portion 362 with beam spots 34, 36 from each of the two focus tracking beams in a two-beam system. Spots 34 are from the left and right beams reflected off of one of the two imaging surfaces (assume S2 in this example), and spots 36 are from the left and right beams reflected off of the other of the two imaging surfaces (assume S3 in this example). As illustrated in this example, based on the movement of the objective lens, the two focus tracking beams, which are both collimated and which both have substantially the same beam diameter before entering the objective lens, now have different diameters and therefore produce different spot sizes on the image sensor. The larger two of the spots each encompass a greater number of pixels and therefore increases the number of rows of pixels of the image sensor that need to be measured. This increases the amount of time required for focus tracking operations. For these reasons, it is desired to achieve a scenario such as scenario 361 illustrated on the right-hand side of FIG. 4A in which the spots 34, 36 from the left and right beams reflected off of surfaces S2 and S3, respectively, are substantially the same spot size and are relatively small.

Pre-existing systems may use a focusing lens to cause the focus tracking beams to converge on the image sensor and to reduce or minimize their spot sizes on the sensor. However because a lens introduces a curved surface in the optical system, slight changes in alignment of the lens, including changes that can arise through thermal variations in the system, can cause inaccuracies in the placement of the focus tracking beams on the sensor. Movement or changes in the lens can cause a lateral translation that affects the multiple focus tracking beams differently. Accordingly, as described above with reference to FIG. 2, in some examples the focusing lens is replaced with a roof prism.

Figure 5A:
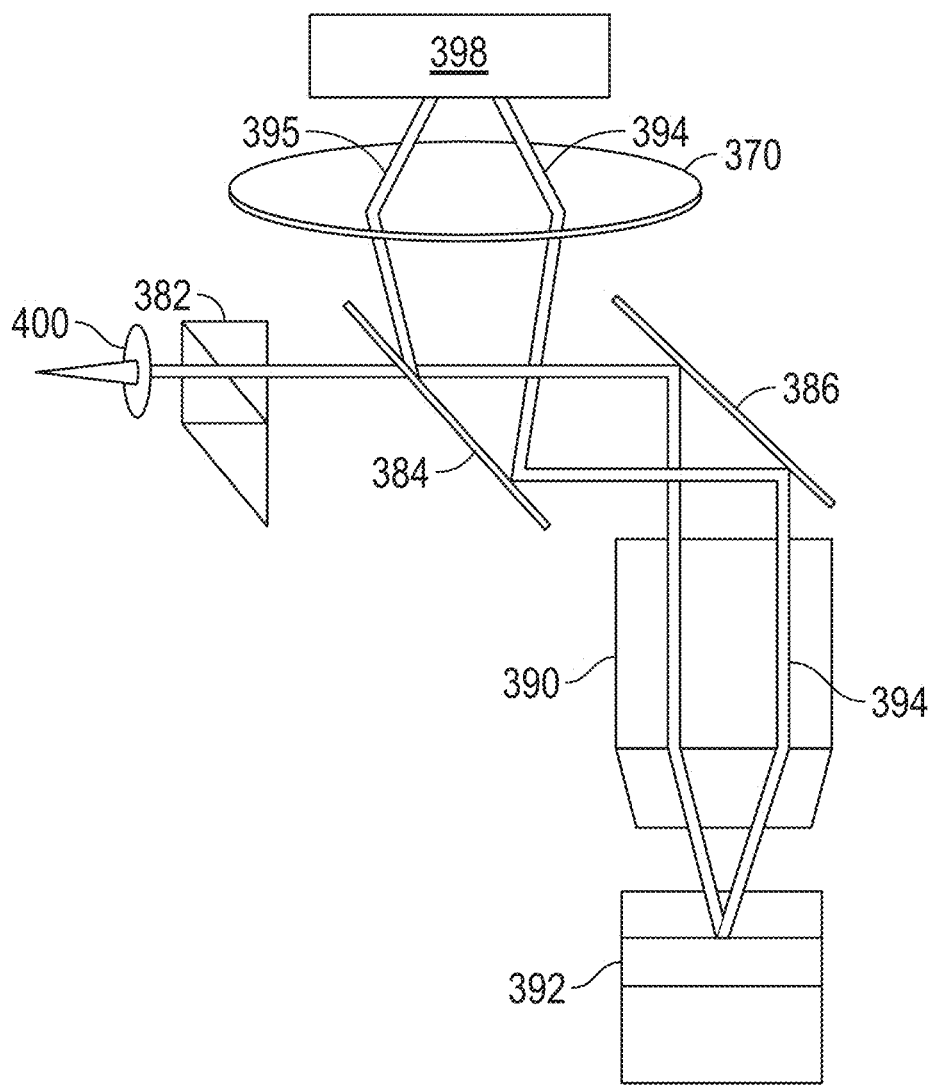
FIG. 5A is a diagram illustrating an example of a lens implemented to cause focus tracking beams to converge on a sample plane and be focused onto an image sensor.

FIG. 5A is a diagram illustrating an example of a focusing lens implemented to cause to focus tracking beams to converge onto an image sensor. With reference now to FIG. 5A, light from a light source (e.g. the laser diode 270 of FIG. 2) is delivered by a fiber (laser and fiber are not shown) to a collimating lens 400. The collimated light is split into two beams such as by a beam splitter prism 382 (e.g., beam splitter prism 272 of FIG. 2). To avoid unnecessary clutter in the illustration two reflected focus tracking beams 394, 395 are illustrated at the lens 370 and image sensor 398; however, only one of the two focus tracking beams is illustrated in the remaining portions of FIG. 5A.

The focus tracking beams from beam splitter prism 382 pass through beam splitter 384 and are reflected by mirror 386 through objective lens 390. Objective lens focuses the beams onto the sample in the sample container 392 (e.g., sample container 330 of FIG. 3A). In this example, the focus tracking beams is reflected off of the S2 surface from sample container 392. The reflected beams (still only one beam 394 illustrated) returns through objective lens 390, are reflected off of mirror 386 and beam splitter 384, and are directed toward lens 370. Because return beams 394, 395 are diverging at this point, lens 370 is implemented to cause the return beams 394, 395 converge on to the image sensor 398. Also, because the focus tracking beams 394, 395 are collimated light, lens 370 serves the additional function of focusing the beams into a smaller spot size on image sensor 398. However because changes in the lateral placement of lens 370 affect the positioning of the beams on image sensor 398, these changes introduce focus tracking error.

Figure 5B:
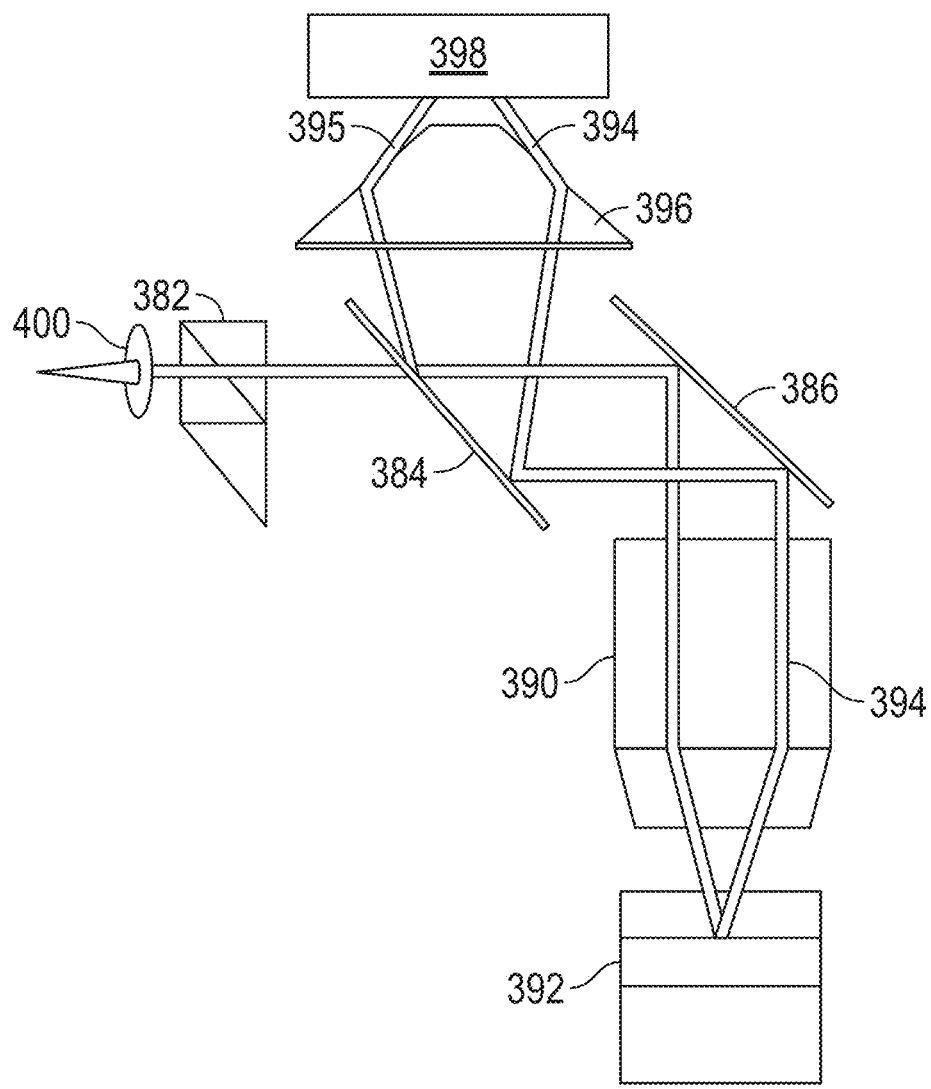
FIG. 5B is a diagram illustrating an example of a roof prism implemented to cause to focus tracking beams to converge onto an image sensor.

FIG. 5B is a diagram illustrating an example in which lens 370 is replaced with a roof prism 396 to avoid issues caused by changes in the lateral placement of lens 370. Replacing the lens with a roof prism 396 reduces or eliminates sensitivity of the system to the lateral position of the lens. Changes of the prism due to thermal and other variations do not impact the spacing of the focus tracking beams 394, 395 on image sensor 398. Because the angular deviation of a prism is completely determined by the angle of the glass, lateral displacement of the roof prism 396 does not affect the beams.

The inclusion of a roof prism 396 in place of a lens 370 can improve the accuracy of the focus tracking system. Because the separation between the spots is used to measure distance from the objective lens to the sample container, higher levels of accuracy are achieved when the separation of the beams is dependent only on the distance to the sample container. Other variables that affect the beam separation, such as those introduced by lateral imprecision in placement of lens 370, negatively impact the accuracy of the focus tracking system. Accordingly, including a roof prism, which presents the same angle to the focus tracking beams even in the presence of some lateral displacement, can greatly benefit the system's accuracy.

There is a drawback to removing the lens. Because the lens is eliminated, the focus tracking beams (beams 394, 395 in this example) are not focused on the sensor. Therefore, in various examples, rather than use collimated light as is done with pre-existing scanning systems, the focus tracking beams are focused to place a waist at a given point along the optical path. This presents a smaller spot size on the image sensor. For example, in one application, collimating lens 400 is moved farther away from the fiber output than it would otherwise be placed to collimate the light from the fiber. The point along the optical path at which collimating lens 400 is placed dictates the position at which beam waist is placed along the optical path. Collimating lens 400 can be positioned to provide a waist such that, despite replacing the lens 370 with roof prism 396, the reflected focus tracking beams 394, 395 can be focused on to the image sensor 398 with a reduced spot size.

Another benefit of moving collimating lens 400 to place a beam waist in the optical path is that this may help to reduce or eliminate an imbalance in spot size that was discussed above with reference to FIG. 4A. Lens 400 can be provided and positioned in the optical path such that the light returned from the sample, through the objective lens, and through the remainder of the optical path, impinges on the sensor with substantially the same spot size as illustrated in scenario 361. More particularly, in some instances a lens is positioned a distance from the fiber output to place a beam waist at a predetermined distance away from the collimator to balance the diameters of the beams that propagate from the upper and lower surfaces of the sample container to the image sensor.

In one application, the beam waist is positioned at a distance of 690 mm-700 mm away from the collimator to balance and reduce the diameters of the beams impinging on the image sensor. In some examples, the spot size can be reduced to approximately 400 µm. In other examples, spot size can be in the range of 300 µm to 500 µm. In yet other examples, other spot sizes can be used.

Figure 4B:
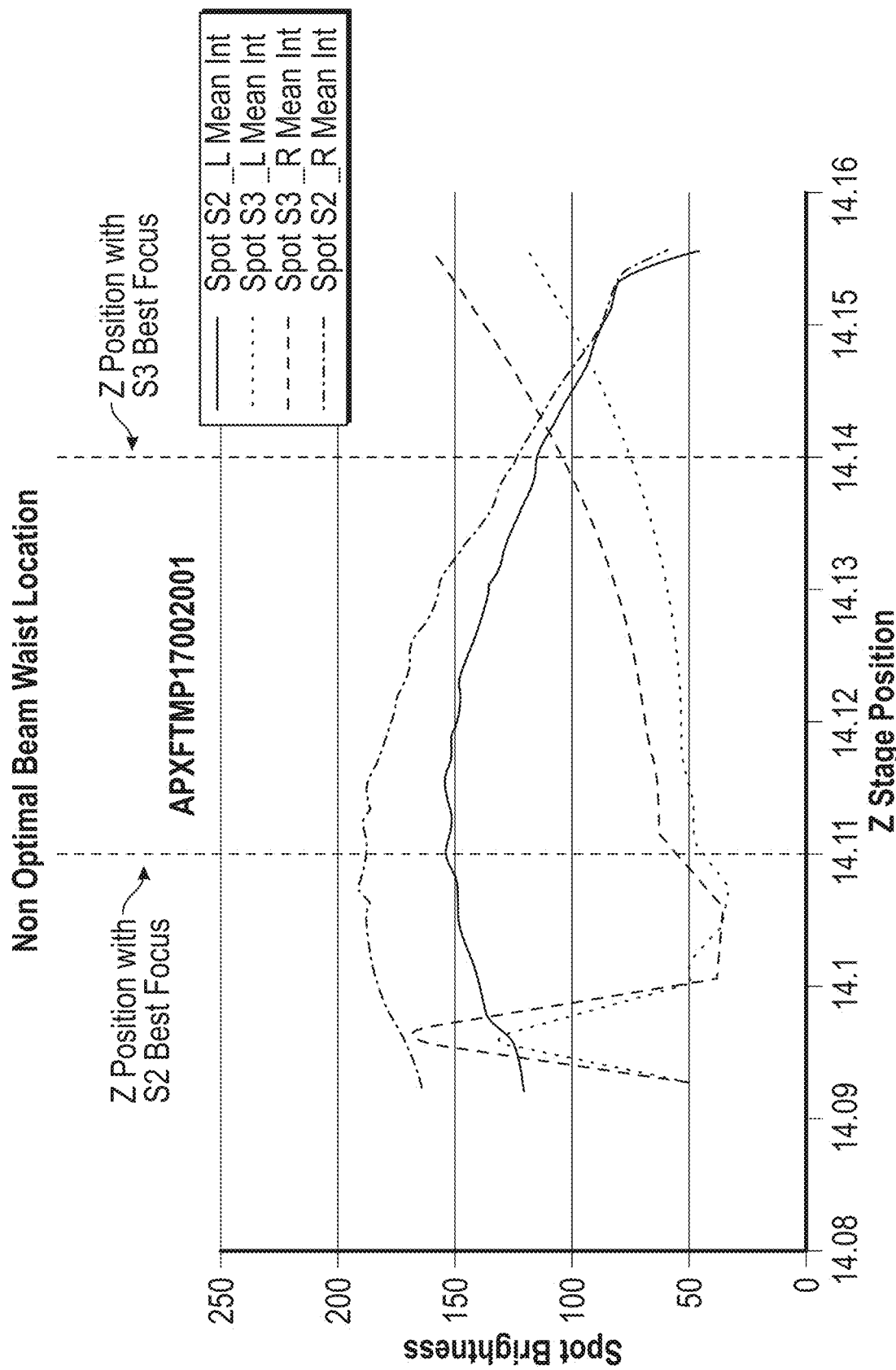
FIG. 4B is a diagram illustrating intensities of left and right focus beams reflecting onto the image sensor from the S2 and S3 surfaces at different focus settings with the collimating lens adjusted to position a beam waist along the optical path of the focus tracking beams.

Additionally, movement of collimating lens 400 to place a beam waist in the optical path can help to balance the intensities of the light impinging on the image sensor. FIG. 4B is a diagram illustrating intensities of left and right focus beams reflecting onto the image sensor from the S2 and S3 surfaces at different focus settings with the collimating lens adjusted to provide a beam waist at a non-optimal location. In this diagram, spot brightness is on the vertical axis and the position of the focusing stage is on the horizontal axis. The vertical dashed line on the left-hand side of the diagram illustrates an optimal focusing position for the S2 reflections in one example implementation. Similarly, the vertical dashed line on the right-hand side of the diagram illustrates an optimal focusing position for the S3 reflections in this example implementation. As this diagram illustrates, the average spot brightness for the S2 beams is approximately 170 at the S2 focusing position, while the average spot brightness for the S3 beams is approximately 85 at the optimal S3 focusing position. Accordingly, spot intensity for the S2 and S3 beams is not balanced.

Figure 4C:
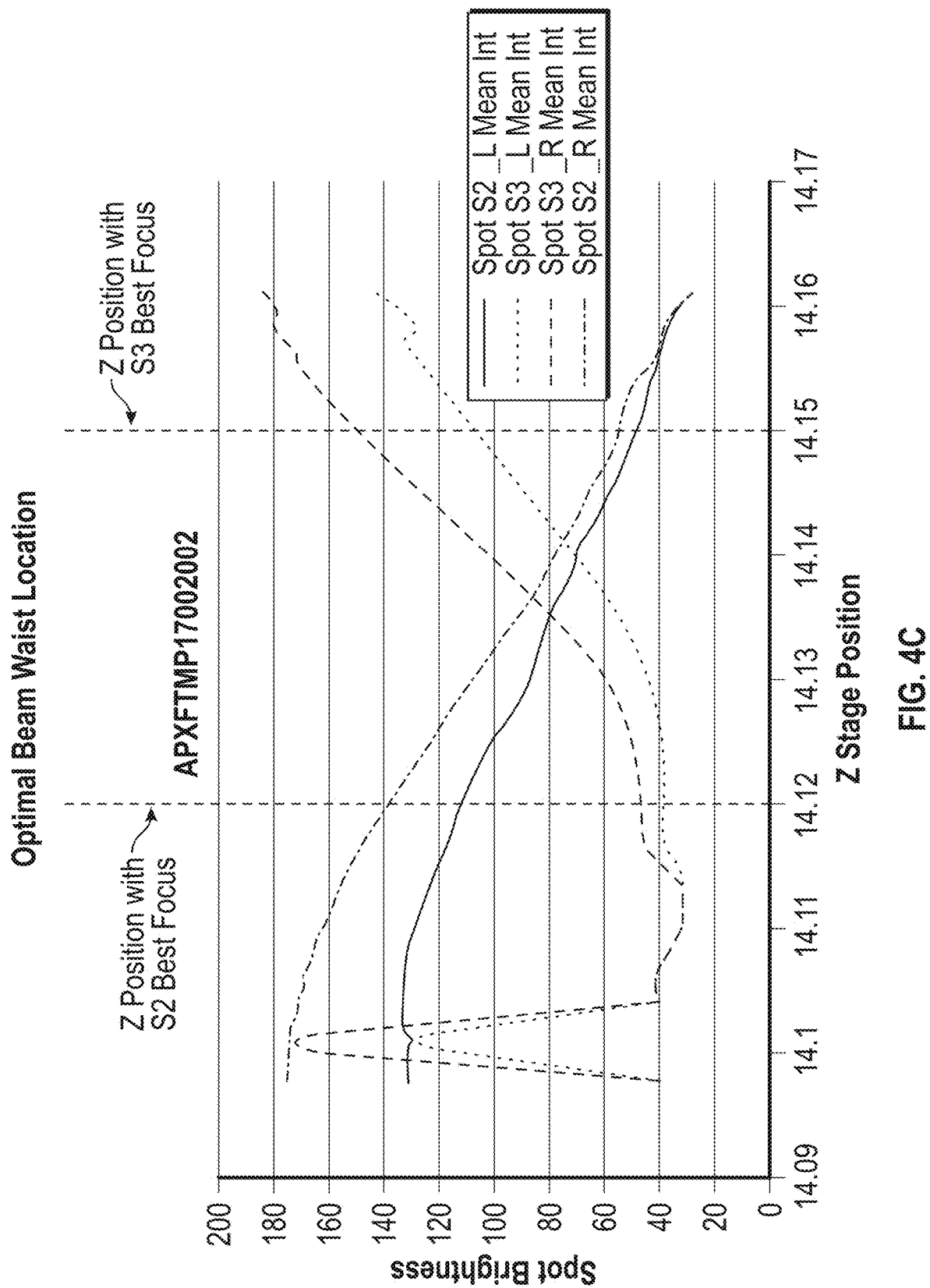
FIG. 4C is a diagram illustrating intensities of the left and right focus beams reflecting onto the image sensor from the S2 and S3 surfaces at different focus settings with the collimating lens adjusted to position at the beam waist more optimally along the optical path of the focus tracking beams.

FIG. 4C is a diagram illustrating intensities of the left and right focus beams reflecting onto the image sensor from the S2 and S3 surfaces at different focus settings with the collimating lens adjusted to position at the beam waist more optimally along the optical path of the focus tracking beams. Here, with a beam waist is positioned along the optical path, the intensities of the S2 and S3 reflected beams are more balanced. Particularly, the diagram illustrates that the left and right S2 beams have an average spot brightness of approximately 125 at the S2 best focus position. This also illustrates the left and right S3 beams have an average spot brightness of approximately 130 at the S3 best focus position. As a comparison of FIGS. 4B and 4C illustrates, placement of a beam waist along the optical path can affect the balance of intensities of the S2 and S3 focus tracking beams.

Figure 6:
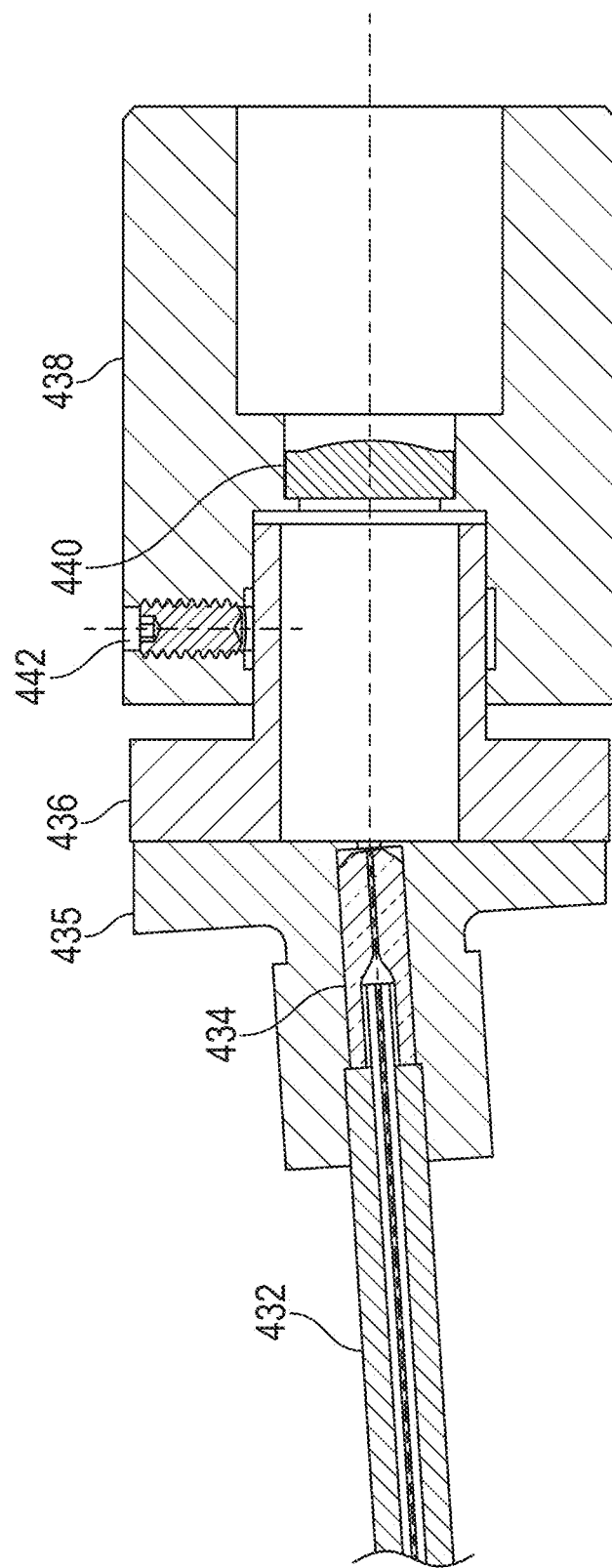
FIG. 6 is a diagram illustrating an example configuration including a lens positioned to place a beam waist of the focus tracking beam at a selected position.

FIG. 6 is a diagram illustrating an example configuration including a lens positioned to place a beam waist of the focus tracking beam at a select position. In this example, light from a light source (not illustrated), such as a laser light source (e.g., light source 270), is carried by fiber-optic cable 432 which is connected to a lens housing assembly via a ferrule 434. Ferrule 434 is mounted in a mounting block 435 that is fixedly attached to insert 436. Lens 440 of a given focal length is placed at a determined distance from the output of fiber 432, and can be maintained at this distance by the lens housing assembly. In this example, light from the fiber travels through an aperture in an insert 436 mounted in body portion 438. The focal length of the lens 440 and its distance from the output of fiber 432 are chosen to place the beam waist at the desired position along the optical path. As noted above, the distance between the output of the fiber and lens 440 is chosen to place the beam waist at the desired position, as described more fully below.

In this example, separation between lens 440 and the fiber output is 14.23 mm, which is the working distance between the lens surface and the fiber. 15.7 mm is the effective focal length of the lens (which is higher than the back focal length of the lens because it is in respect to the lens principal plane). Because the back focal length of the lens in the collimator is 13.98 mm, which is the distance from the lens vertex to the focal point of the lens on the optical axis, the back focal length is shorter than 14.23 mm.

In the illustrated example, insert 436 is slidably mounted within a cavity defined by body portion 438 such that the distance between the fiber output and lens 440 can be adjusted by insert 436 slidably mounted within the cavity of body portion 438. A set screw 442 or other locking mechanism can be included to lock insert 436 into place within body portion 438. Use of a slidable insert 436 allows the system to be adjusted to tune or optimize the spot size on the image sensor. This can allow for final system configuration adjustments or in-field tuning. The example illustrated in FIG. 6, lens 440 is a plano-convex lens. However, after reading this description, one of ordinary skill in the art will understand that other lens structures can be used, including, for example, a biconvex lens.

In some applications, the lens is configured such that the beam waist is positioned within the objective lens. More particularly, in some applications, the lens is configured such that the beam waist is positioned within the objective lens before the beam impinges on the sample while in other applications the lens is configured such that the beam waist is positioned within the objective lens after the beam is reflected off the sample. In other applications, the lens is configured such that the beam waist occurs before the objective lens, after the reflected beam leaves the objective lens or between the objective lens and the sample. Placement of the lens can be determined by an iterative process, such as through the use of modeling software, to achieve the desired spot size and balance on the image sensor.

In addition to balancing the spot sizes, smaller spot sizes are generally utilized to improve the speed with which focusing can be determined. The time required to read information from the image sensor affects the latency of the focus tracking system. More particularly, for a sensor with a given pixel density, a larger spot size covers more pixels and more time is required to read the data from each pixel within the spot diameter. Accordingly, as discussed above the lens used to balance the beam diameters can also be used to reduce the size of the spot impinging on the image sensor, thereby reducing the amount of time required to determine the spot location (or locations for multiple beam focusing) for focusing operations.

As discussed above with reference to FIG. 3A, in some applications, a multilayer sample container can be used to carry the sample to be imaged by the scanning system. As discussed in that example, the sample to be imaged may be contained in solution in layer 338. In order for imaging to occur, at least layer 334 must be optically transparent to the beam used for imaging. Layer 336 may be optically transparent as well. Accordingly, surfaces S1, S2, S3 and S4 are generally reflective. Likewise, because it is important for the imaging beam to reach the sample at layer 338, it is undesirable to use antireflective coating on the surfaces. Accordingly, unwanted reflections from surfaces S1 and S4 during focus tracking and imaging operations can create unwanted optical noise in the system and can obscure the reflected beams from S2 and S3, which are the beams to be collected at the image sensor.

FIG. 3B is a diagram illustrating an example of the creation of unwanted reflections off of the multiple surfaces of a multilayer sample container in some environments. As seen in this example, a three-layer sample container includes surfaces S1, S2, S3 and S4. For clarity, a single focus tracking beam 465 is illustrated. However, in other applications, multiple focus tracking beams can be used. For instance, examples below describe a system in which two focus tracking beams are described. As also seen in this example, a beam is reflected off each of the surfaces S1, S2, S3 and S4. Because the sample is between surfaces S2 and S3, those are the surfaces on which the system is designed to focus. Accordingly, the reflected beam 467 off of surface S1 and the reflected beam 469 off of surface S4 do not return any useful information and are unwanted reflections. The reflections of interest for focus tracking are reflections off of surfaces S2 and S3. Accordingly, if light from the reflections off of surfaces S1 and S4 were to reach the detector, this could introduce noise that could interfere with detection of the focus tracking beam reflections.

Figure 3D:
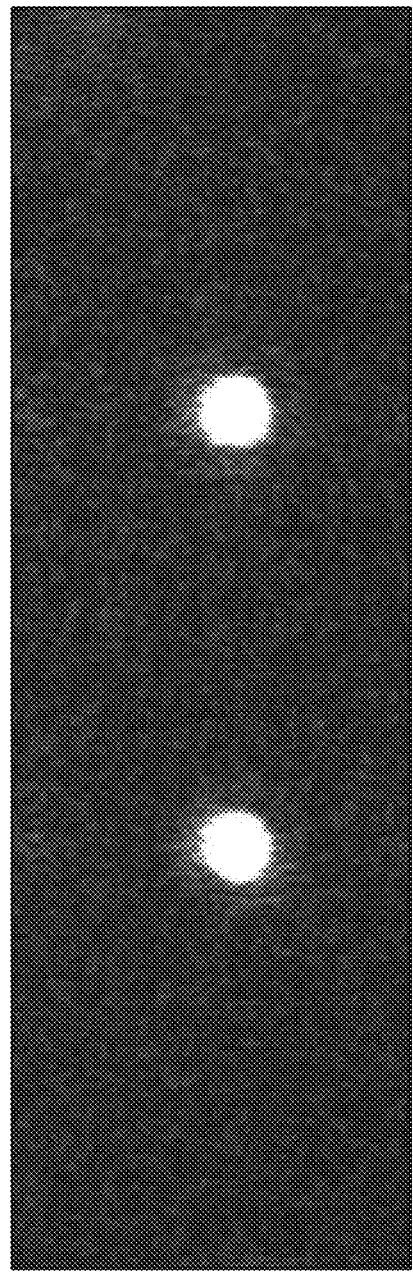
FIG. 3D is a diagram illustrating a reduction in noise at the image sensor as a result of the placement of blocking structures in accordance with example applications of the technology disclosed herein.

FIG. 3C is a diagram illustrating an example of the effect of the unwanted reflections on the image sensor. As seen in this example, in addition to the spots 482 presented by the focus tracking beams, there is a significant amount of noise appearing on the image sensor as a result of the unwanted reflections. In other examples, the unwanted reflections can also appear as additional spots on the image sensor. FIG. 3D is a diagram illustrating a reduction in noise at the image sensor as a result of the placement of blocking structures in accordance with examples discussed below.

This problem is exacerbated in circumstances in which the reflections off of surfaces S1 and S4 are of greater intensity than the reflections off of the sample. Because it is important for the sample container to be optically transparent, antireflective coatings are not provided on the sample container. Likewise, reflections off a glass surface tend to be stronger than reflections off of a biological sample. Additionally, in applications in which the sample container contains a nano-well or other like pattern on surfaces S2 and S3, this can further diminish the reflections off of those surfaces. Accordingly, the unwanted reflections from surfaces S1 and S4 tend to be of greater intensity than the reflections off of surfaces S2 and S3. For example, in some applications the reflections off of surface S1 can be as much as 100 times (or greater) the intensity of the reflections off of surfaces S2 and S3. To remedy this problem and remove the impact of these unwanted reflections from the focus tracking operations, various examples may be implemented to include blocking structures at determined locations along the optical path between the sample and the image sensor to block this unwanted light from reaching the image sensor.

Figure 7:
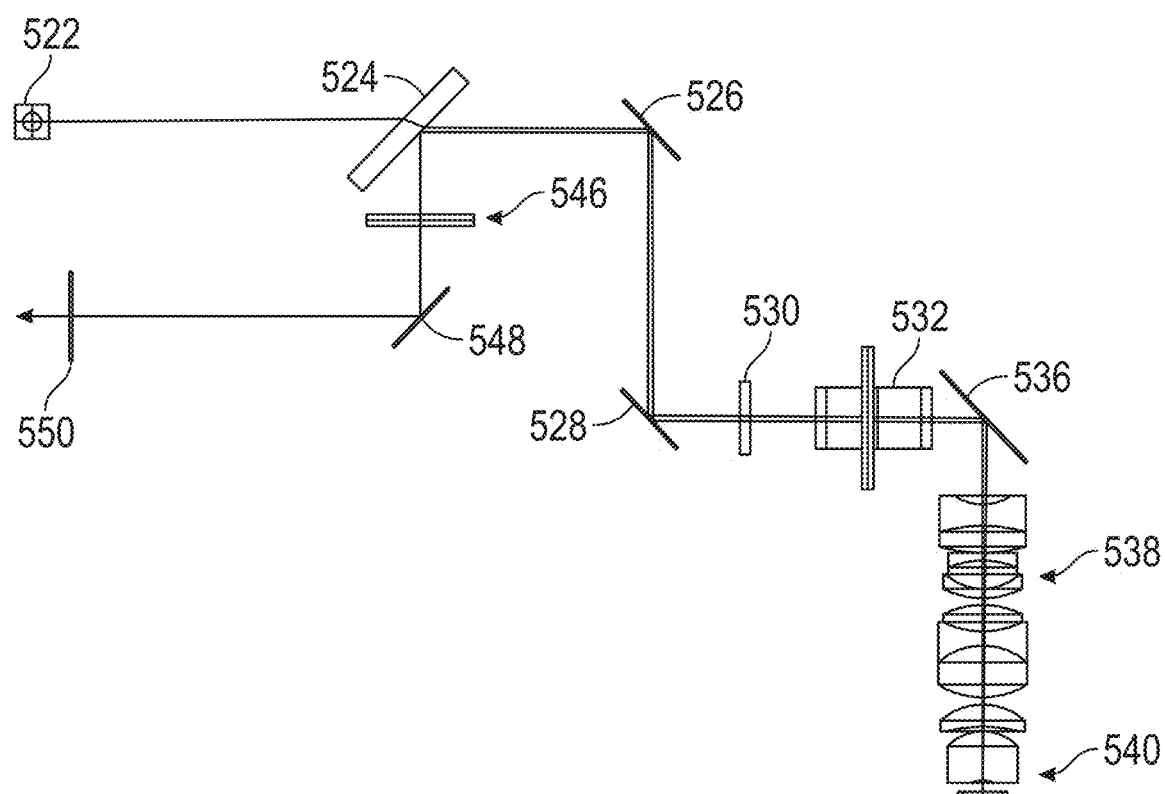
FIG. 7 is a diagram illustrating an example of a focus tracking system with which systems and methods described herein may be implemented.

FIG. 7 is a diagram illustrating another example of the scanning system with which examples of the systems and methods described herein may be implemented. With reference now to FIG. 7, this example includes a light source (not illustrated), such as a laser light source. For example, in one application, the light source can be configured as a laser diode coupled to the system using a fiber coupler and a lens structure such as the example illustrated in FIG. 6. As another example, the light source can be configured as a laser diode with a collimator to provide collimated light for focus tracking operations.

In this example, light from the laser is introduced into a lateral displacement prism 522 to separate the light into two parallel beams. Other configurations may be implemented with a single focus tracking beam or with more than two focus tracking beams. In operation, the focus tracking beams are sent through beam splitter 524 and are reflected off of upper periscope mirror 526 and lower periscope mirror 528. The focus tracking beams are delivered through periscope window 530 and beam splitter 532 (which may also be implemented as a dichroic filter). The beams are then reflected off of mirror 536 and focused by objective lens 538 onto the sample container 540. Reflections from the sample container are returned through the objective lens and follow the same path until they are reflected off of beam splitter 524. Because the beams may be diverging from one another slightly, a roof prism 546 may be included to redirect the beams to a parallel orientation or even to a slightly converging configuration such that they can both be directed toward a relatively small area image sensor. In this example, camera turning mirror 548 directs the focus tracking beams to the image sensor 550. Although the example blocking structures described herein are described in terms of this example configuration, one of ordinary skill in the art after reading this description will appreciate how different geometries or placement of blocking structures can be used in differently configured systems to block unwanted reflections from a multi-surface sample container.

The example system of FIG. 7 was modeled to determine the paths of the beams reflected off of the S1-S4 surfaces in the system to identify points along the return path at which the unwanted reflections from the S1 and S4 surfaces could be blocked from reaching the image sensor. The spatial relationship of the beams at various points along the path as a result of this modeling is illustrated at FIGS. 8, 9, 11, 12, 19, 20, 21, 22, 23 and 24. As these figures illustrate, the spatial relationships of the beams reflected off of surfaces S1-S4 varies throughout the return path of the system. The beam locations are changing relative to one another along the length of their return path, and the locations also change depending on placement of the sample container in respect to the objective. Adding to the complexity is that there are focus beams running in the forward and return directions and there are also imaging beams running in both directions as well. Therefore, it is not a trivial task to configure in place blocking structures within the optical path that effectively block unwanted reflections from imparting noise on the image sensor while avoiding interference with the desired focus tracking and imaging beams.

Figure 8:
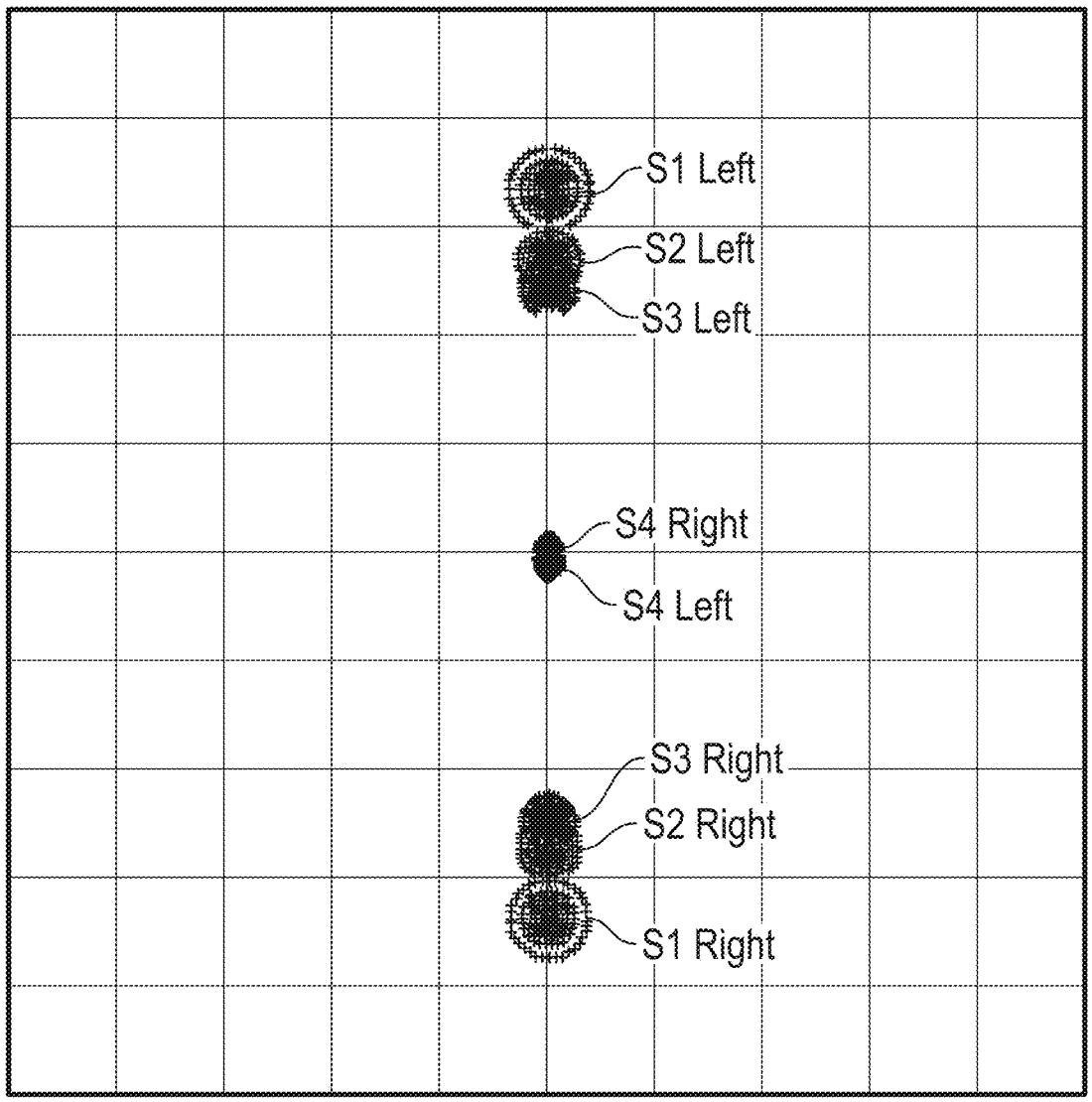
FIGS. 8 and 9 are diagrams illustrating spatial relationships of reflected focus tracking beams in one example.
Figure 9:
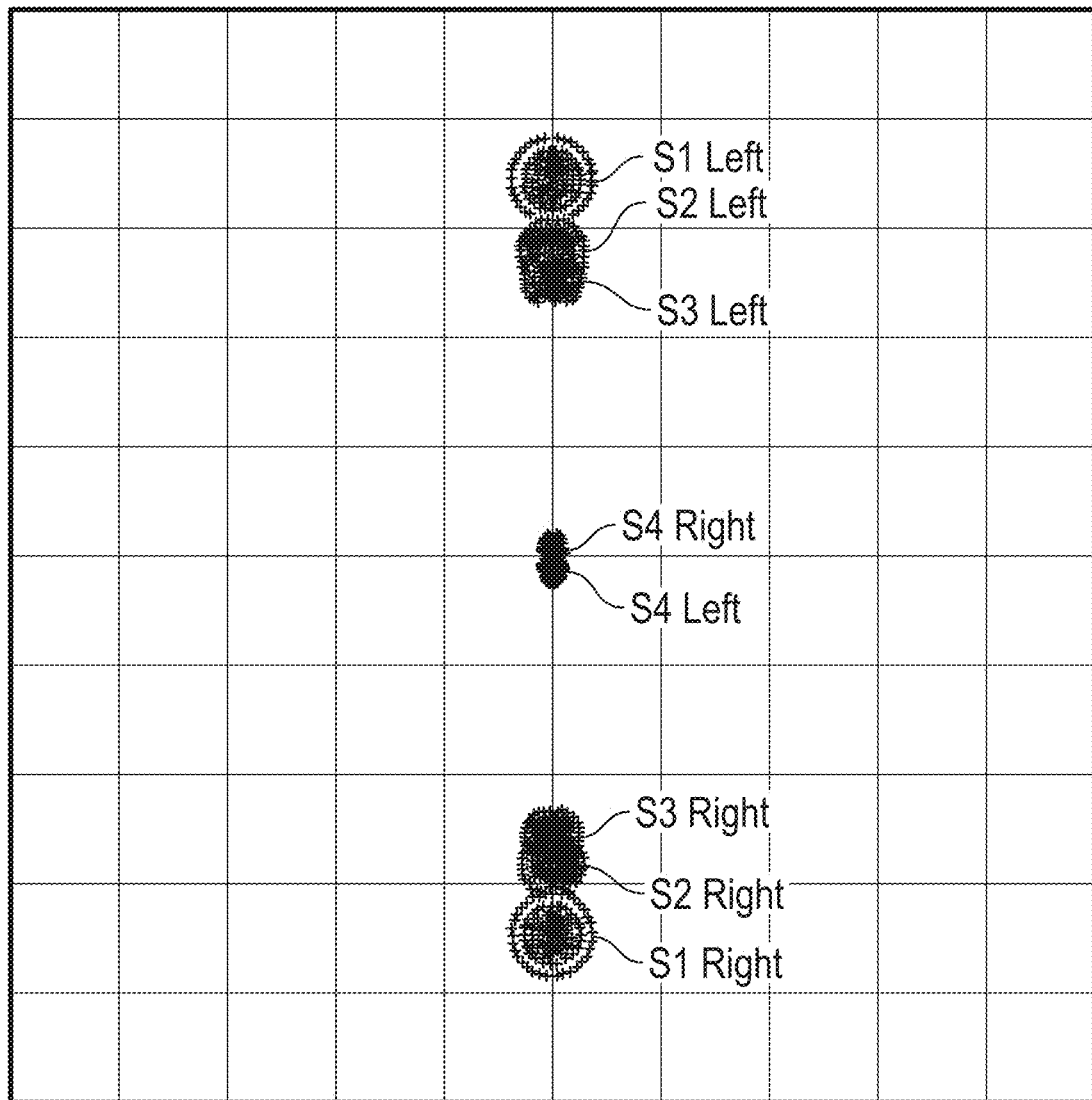

FIGS. 8 and 9 are diagrams illustrating the spatial relationship of reflected focus tracking beams at beam splitter 532 in the example configuration of FIG. 7 using a multi-layer sample container such as that illustrated in FIG. 3B. FIGS. 8 and 9 show the beams within a 21 mm×21 mm area. FIG. 8 shows the spatial relationship of the beams at beam splitter 532 when the system is configured to focus on the top of the sample well at surface S2, while FIG. 9 shows the spatial relationship of the beams at beam splitter 532 with the system configured to focus on the bottom of the sample well at surface S3. These figures illustrate that at beam splitter 532 the reflected beams, with the system focused at S2 and S3, impinge on the surface in three spatial groups: the reflection of the left focus tracking beam off of surfaces S1, S2 and S3 are in a first group; the reflection of the right focus tracking beam off of surfaces S1, S2 and S3 are in a second group that is physically separated from the first group; and that left and right focus tracking beams reflected off of surface S4 are in the area in between these two groups. With this spatial relationship among the beams, it would be difficult to use an aperture configuration to effectively block the left and right reflections off of surface S1 while allowing the desired reflections off of surfaces S2 and S3 to pass uninhibited. However, because there is good spatial separation of the reflections off of surface S4 relative to the other reflections, the reflections from the S4 surface may be blocked at this point along the return path.

Figure 10:
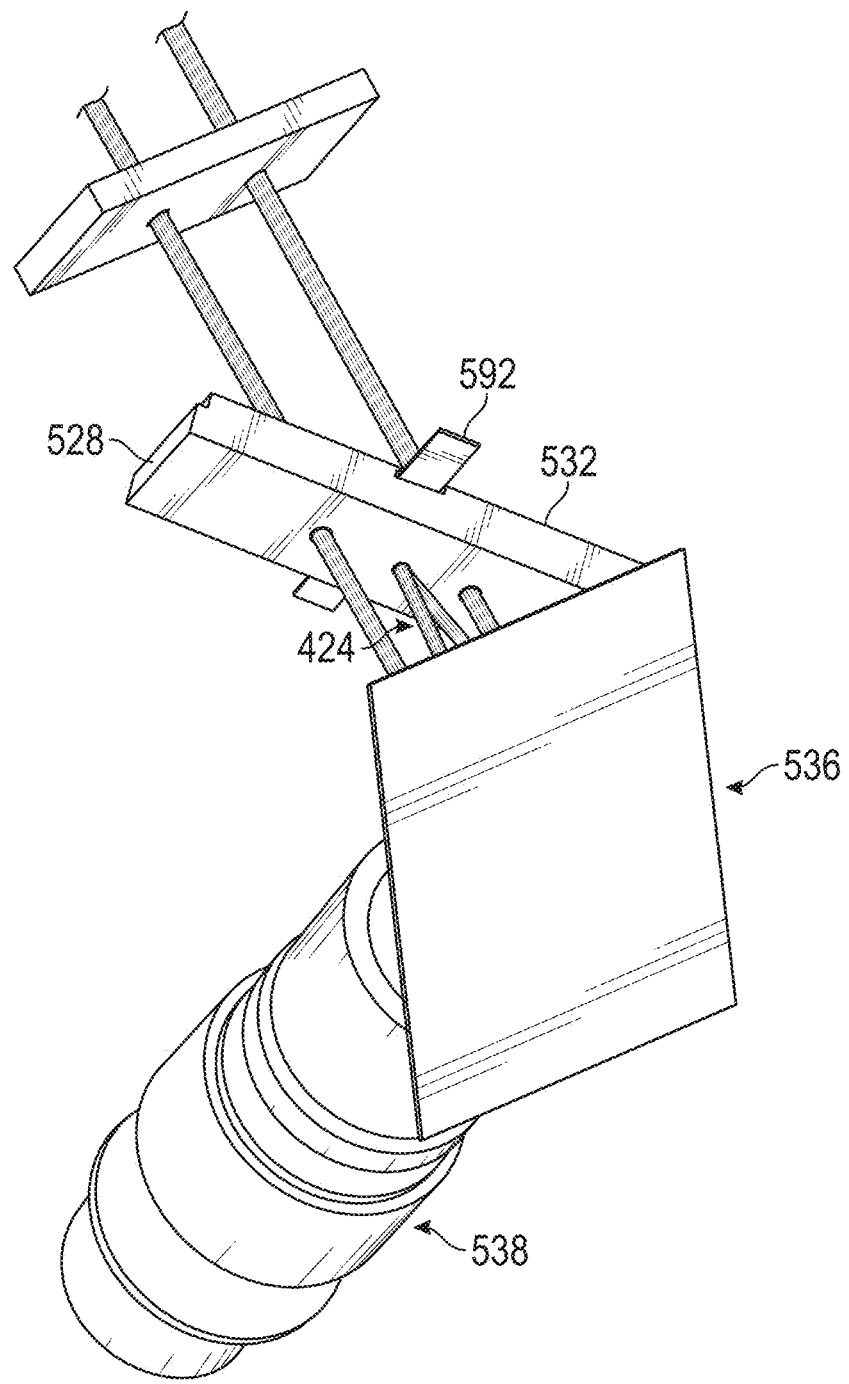
FIG. 10 is a diagram illustrating an example placement of a beam blocker to block reflections of the left and right focus tracking beams from the S4 surface.

FIG. 10 is a diagram illustrating an example placement of a beam blocker to block reflections of the left and right focus tracking beams from the S4 surface in accordance with one example implementation. This example shows the reflections 424 from surface S4 converging with one another at beam splitter 532 as was seen in FIGS. 8 and 9. This example also illustrates how a blocking structure can be included to block these reflections from surface S4 without interfering with the desired reflections from the S2 and S3 surfaces. This can be implemented in the illustrated example using a 4 mm wide obscuration on the focus tracking module side of beam splitter 532.

Figure 11:
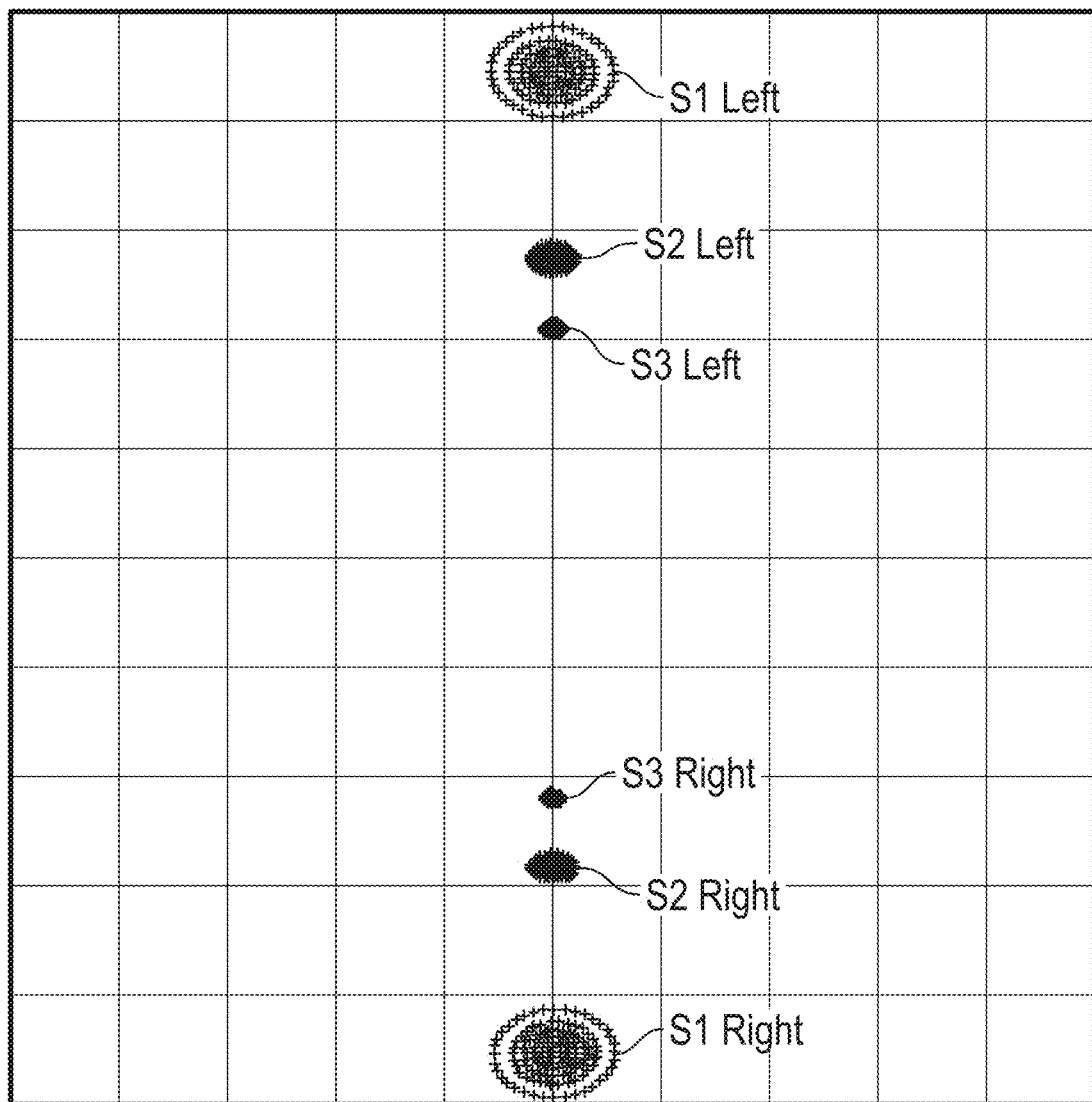
FIGS. 11 and 12 are diagrams illustrating the spatial relationship of reflected focus tracking beams at beam splitter in the example configuration of FIG. 7, with the beam blocker placed as shown in FIG. 10.
Figure 12:
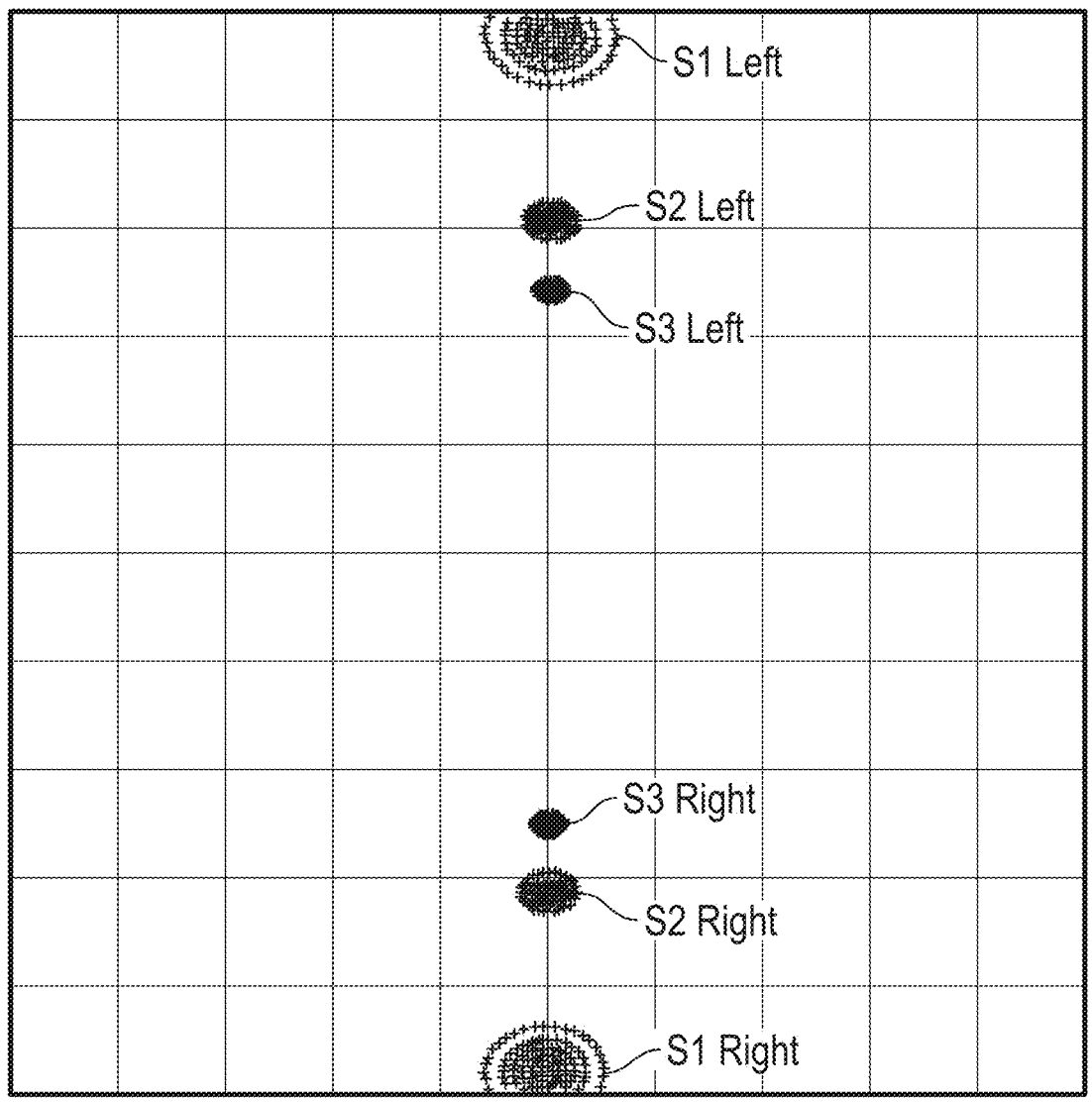

FIGS. 11 and 12 are diagrams illustrating the spatial relationship of reflected focus tracking beams at beam splitter 532 in the example configuration of FIG. 7 using a multi-layer sample container such as that illustrated in FIG. 3B. FIGS. 11 and 12 show the beams within a 25 mm×25 mm area. FIG. 11 shows the spatial relationship of the beams at top periscope mirror 526 when the system is configured to focus on the top of the sample well at surface S2, while FIG. 12 shows the spatial relationship of the beams at top periscope mirror 526 with the system configured to focus on the bottom of the sample well at surface S3. Because reflections of the focus tracking beam off of the S4 surface in this example are blocked at beam splitter 532 before reaching this point in the return path, there are no spots from surface S4. More importantly, this shows that the reflected beams from surface S1 have good spatial separation from the desired reflections off of the S2 and S3 surfaces.

Figure 13:
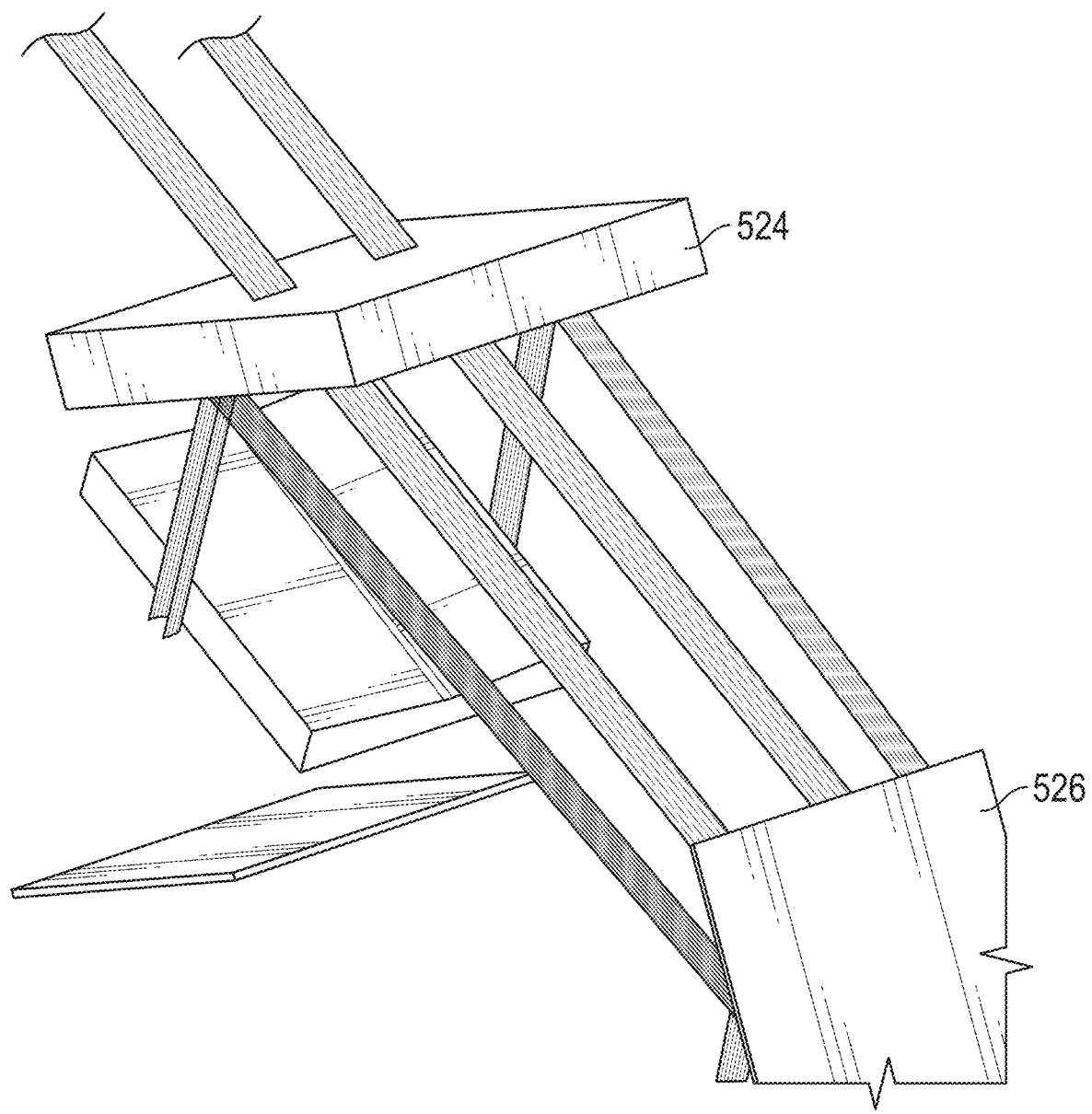
FIGS. 13 and 14 illustrate the beams reflected off of the top periscope mirror and the beam splitter in one example.
Figure 14:
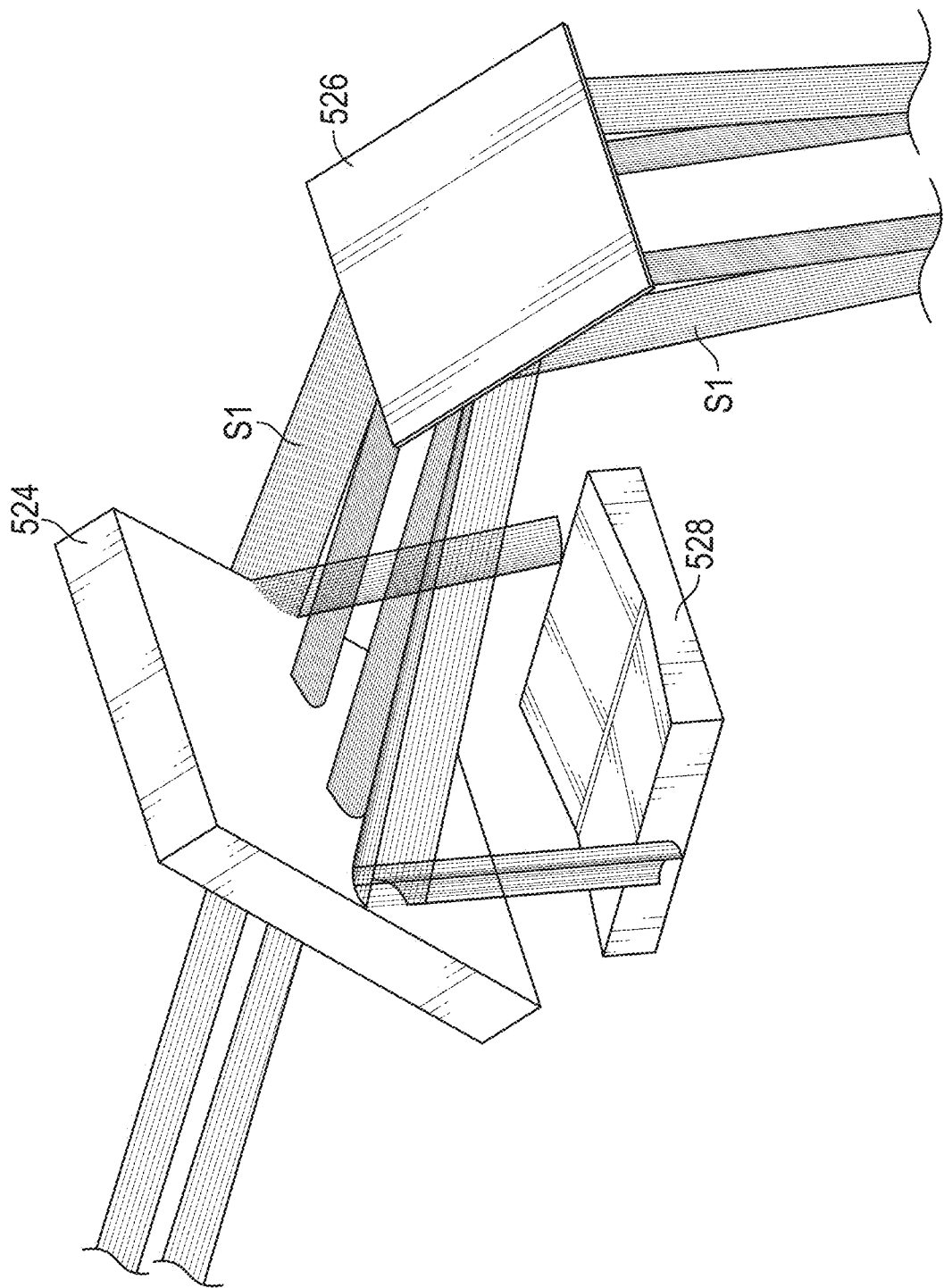

With this spatial placement of the beams, an aperture can be used to block the S1 reflections while allowing the reflected beams from the S2 and S3 surfaces to pass through and ultimately reach the image sensor. FIGS. 13 and 14 illustrate the beams reflected off of top periscope mirror 526 and beam splitter 524. As this illustrates, if the beams were not blocked at top periscope mirror 526, they would reflect off of beam splitter 524 and impinge on the edges of roof prism 546. As this modeling illustrates, reflected beams from surface S1 can be blocked by placing a 20 mm×20 mm aperture at upper periscope mirror 526. Alternatively, the size of upper periscope mirror 526 can be reduced to a 20 mm×20 mm dimensions so that the reflected beams from the S1 surface are not returned to the image sensor. In other applications or for other placement locations for the aperture, the size of the aperture implemented can vary based on the position of the S1 beams. In another example implementation, the aperture is 20.8 mm wide. This width was chosen to accommodate an S2 image at about −20 μm to +30 μm (about best focus for S2 in one application) and an S3 image at about −25 μm to +25 μm (about best focus for S3 in one application).

FIG. 15A provides a top-down view illustrating the focus tracking beams reflected from the sample through objective lens 538 and directed toward beam splitter 532. Although mirror 536 is not shown in FIG. 15A, this illustrates the reflected focus tracking beams being reflected toward beam splitter 532. This example also illustrates the S4 reflected beams being blocked by a beam blocker positioned at the back face of beam splitter 532. Although the beam blocker is not illustrated in FIG. 15A, one illustrative example is provided in FIGS. 16A and 16B.

Figure 15B:
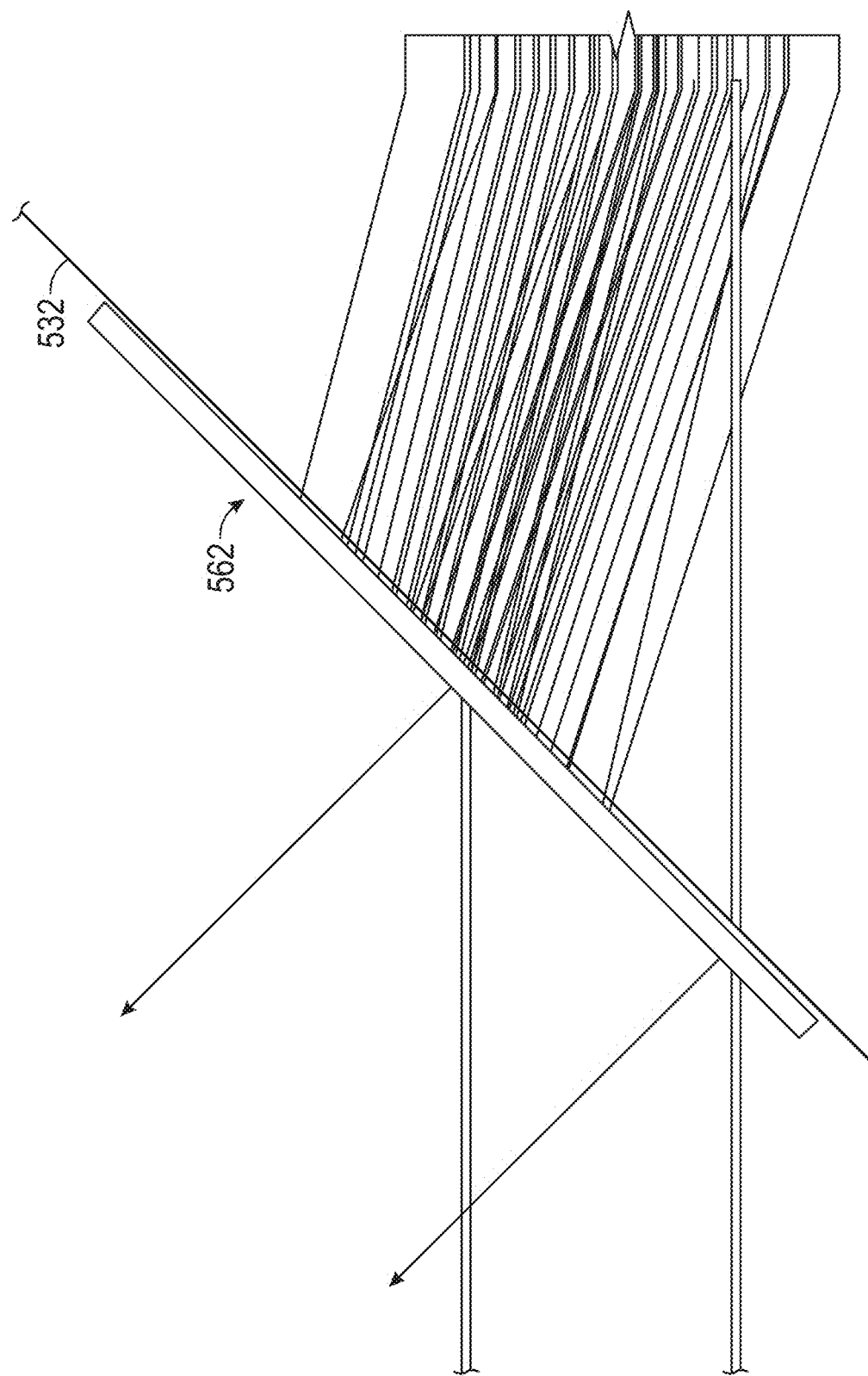
FIG. 15B is a close up view of FIG. 15A illustrating how the S4 reflected beams can be blocked at the rear face of the splitter by a blocking member.

FIG. 15B provides a close up view of FIG. 15A, illustrating an example of the focus tracking beams reflected from surface S4 at the rear face of beam splitter 532. As this example illustrates, the focus tracking beams reflected from surface S4 are blocked by a blocking member 562. As this example also illustrates, the front face of blocking member 562 is oriented to be substantially parallel with the back face of beam splitter 532. In one example implementation, blocking member 562 is disposed in the system to be separated from the back face of beam splitter 532 by 50 μm. In other examples, other separation spacings can be provided. For example, in some implementations, the spacing can be in the range of 25 μm-100 μm. Although this example illustrates blocking member 562 as having a rectangular cross-section, blocking member 562 can be implemented using other shapes or geometries, an example of which is illustrated below with reference to FIGS. 16A and 16B.

Figure 15C:
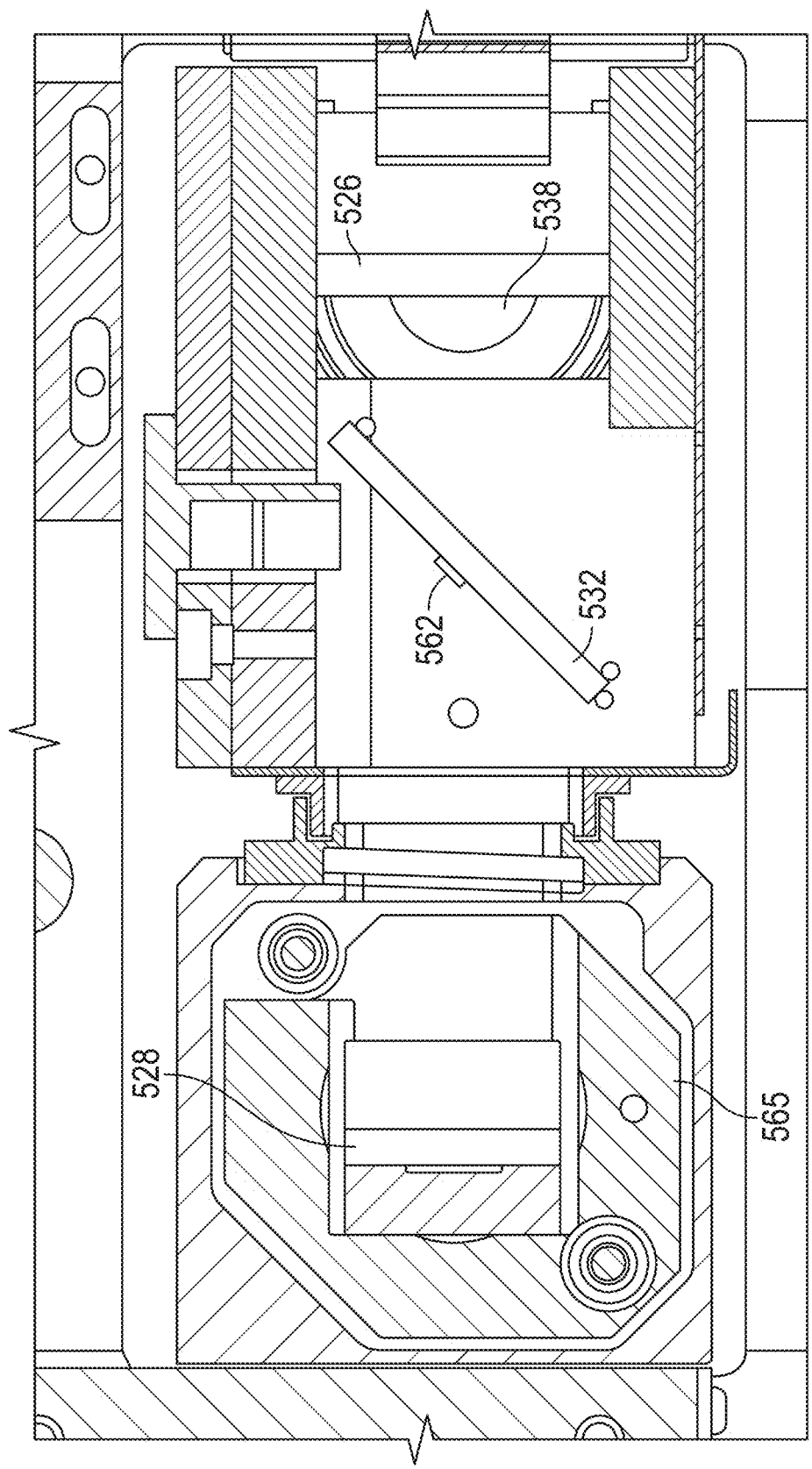
FIG. 15C is a diagram illustrating a top-down view of an example of a blocking member positioned at the rear face of a splitter.

FIG. 15C is a diagram illustrating a top-down view of an example of a blocking member and splitter positioned within a portion of an imaging system. In this example, blocking member 562 is positioned at the rear face of beam splitter 532 to block beams reflected from the S4 surface. The reflected beams emerging from objective lens 538 are reflected by mirror 536 toward beam splitter 532. Blocking member 562 is positioned to block the beams reflected from the S4 surface and is of a sufficiently small width so as to not interfere with the beams reflected from the S2 and S3 surfaces.

In the illustrated example, blocking member 562 is 4 mm wide and 2 mm in length, and it is slightly offset from the optical axis of objective lens 538. It is, however, aligned with the center of lower periscope mirror 528, which is mounted in housing 565. More particularly, in one example implementation, blocking member 562 is offset 1.1 millimeters to the left of the objective optical axis to ensure that it is centered relative to the beams reflected from the S4 surface.

Figure 15D:
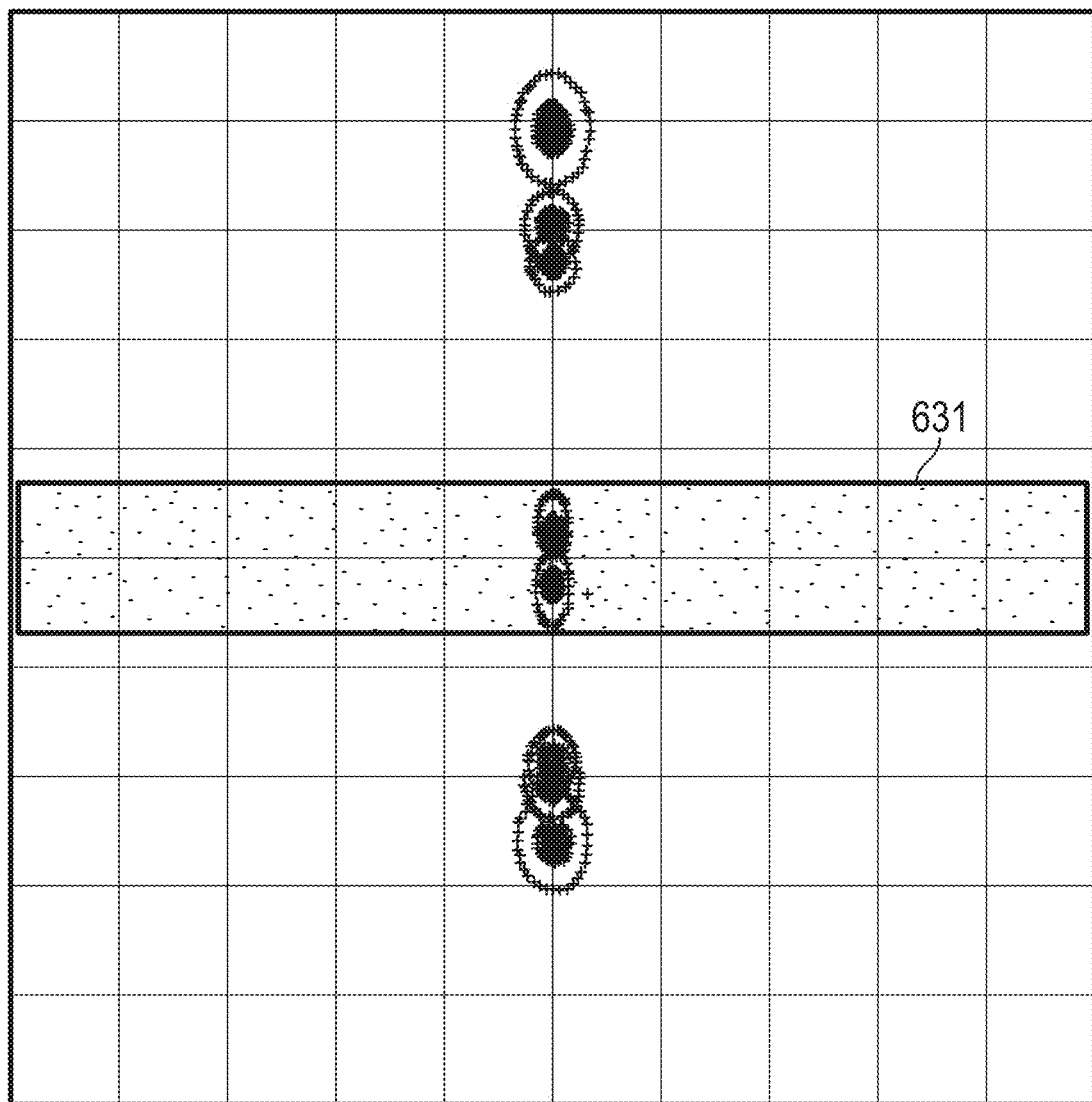
FIG. 15D is a diagram illustrating a representation of a 4 mm wide blocking structure in the beam path of the reflected focus tracking beams at the splitter.

FIG. 15D is a diagram illustrating a representation of a 4 mm wide blocking structure in the beam path of the reflected focus tracking beams at the splitter. As this example illustrates, a 4 mm wide blocking structure (represented by rectangle 631) is of sufficient width to block the focus tracking beams reflected from surface S4, which are shown in the center of the diagram. As this example also illustrates, the width of the blocking member is chosen to be wide enough to block the unwanted reflected beams, but still provide the largest possible capture ranges for S2 and S3 imaging. Because slight changes in the focusing can have a corresponding change in the position of the beams at the splitter, the width of the blocking member can be chosen as being somewhat wider than that which would be necessary to block the beams in a perfect focus condition. In other words, the blocking member can be wide enough to accommodate a determined degree of imprecision in the focusing system.

Figure 16A:
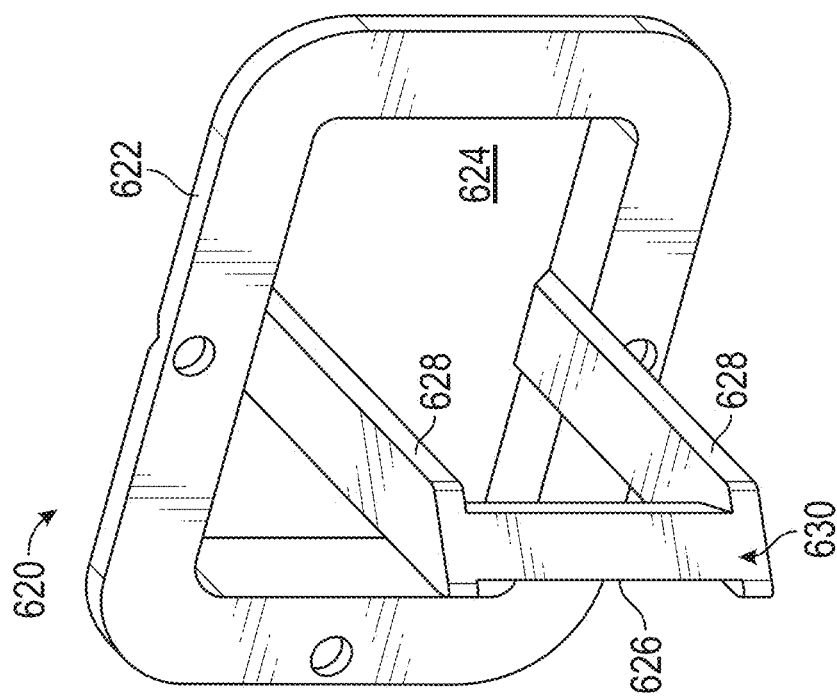
FIGS. 16A and 16B are diagrams illustrating an example of a beam blocker that can be used to block the S4 reflections at the filter/splitter in accordance with the example implementations described with reference to FIGS. 8-10.
Figure 16A:
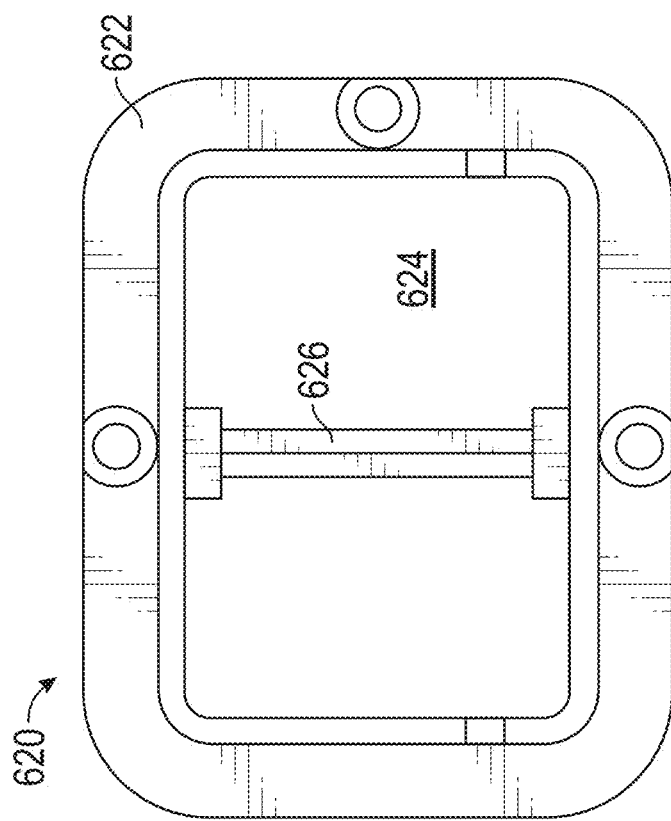
Figure 16B:
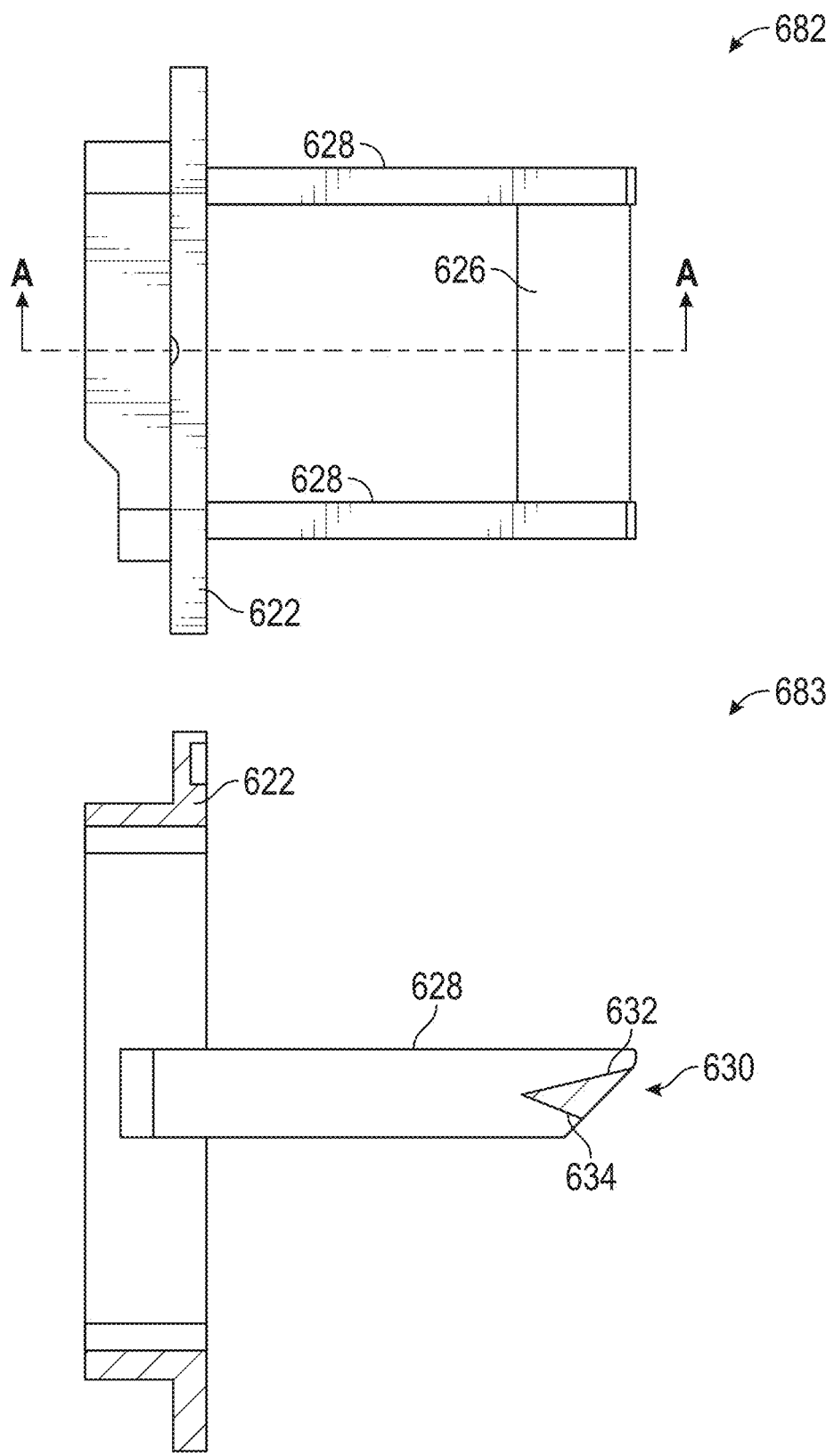

FIGS. 16A and 16B are diagrams illustrating an example of a beam blocker that can be used to block the S4 reflections at beam splitter 532 in accordance with the example implementations described with reference to FIGS. 8-10. FIGS. 17 and 18 are diagrams illustrating an example placement of the beam blocker illustrated in FIGS. 16A and 16B. The left-hand side of FIG. 16A illustrates a rear view (from the perspective of the beam) of beam blocker 620; and the right-hand side illustrates a perspective view of beam blocker 620. Beam blocker 620 includes a frame portion 622 defining an aperture 624 through which the reflected beams can pass. A beam blocking member 626, which includes a blocking face 630, is supported in position by extension arms 628 to block the unwanted reflection beams from S4. In the illustrated example, extension arms 628 are elongate structural members attached, affixed, joined or otherwise connected to opposite sides of frame portion 622, and beam blocking member 626 extends across the distal ends of extension arms 628.

Frame portion 622 and extension arms 628 provide a mounting structure by which the beam blocking member 626 can be mounted in position at beam splitter 532 without interfering with reflections from surfaces S2 and S3. Beam blocker 620 can be cast, molded, machined or otherwise fabricated as a unitary structure. In other examples, the elements that make up beam blocker 620 can be separate components that are attached, joined, fastened or otherwise connected together to form the resulting assembly. Beam blocker 620 can be implemented using light-absorbing, opaque surfaces to avoid other unwanted reflections within the system. For example, beam blocker 620 can be made using black anodized aluminum or other light-absorbing, or light-absorbing-coated materials. Beam blocker 620 can be dimensioned for a particular application. In one example application, beam blocker 620 is dimensioned to provide: an aperture width of 30 mm and a height of 21 mm; extension arms 628 of 25 mm in length; and a blocking surface that is 2.8 mm wide and 21 mm in length.

With reference now to FIG. 16B, view 682 illustrates a top-down view of beam blocker 620, and view 683 illustrates a cross-sectional side view at A of beam blocker 620. The front edge of extension arms 628 is tapered to conform to the angle of beam splitter 532 as further illustrated in FIG. 17 (described below). The beam blocking member has a triangular cross-section and is oriented to present flat blocking face 630 to the incoming beam. Although beam blocker 620 can be made using light-absorbing materials, presenting a triangular cross-section to the unwanted beams can have the effect of reflecting any unabsorbed light out of the return path.

Figure 17A:
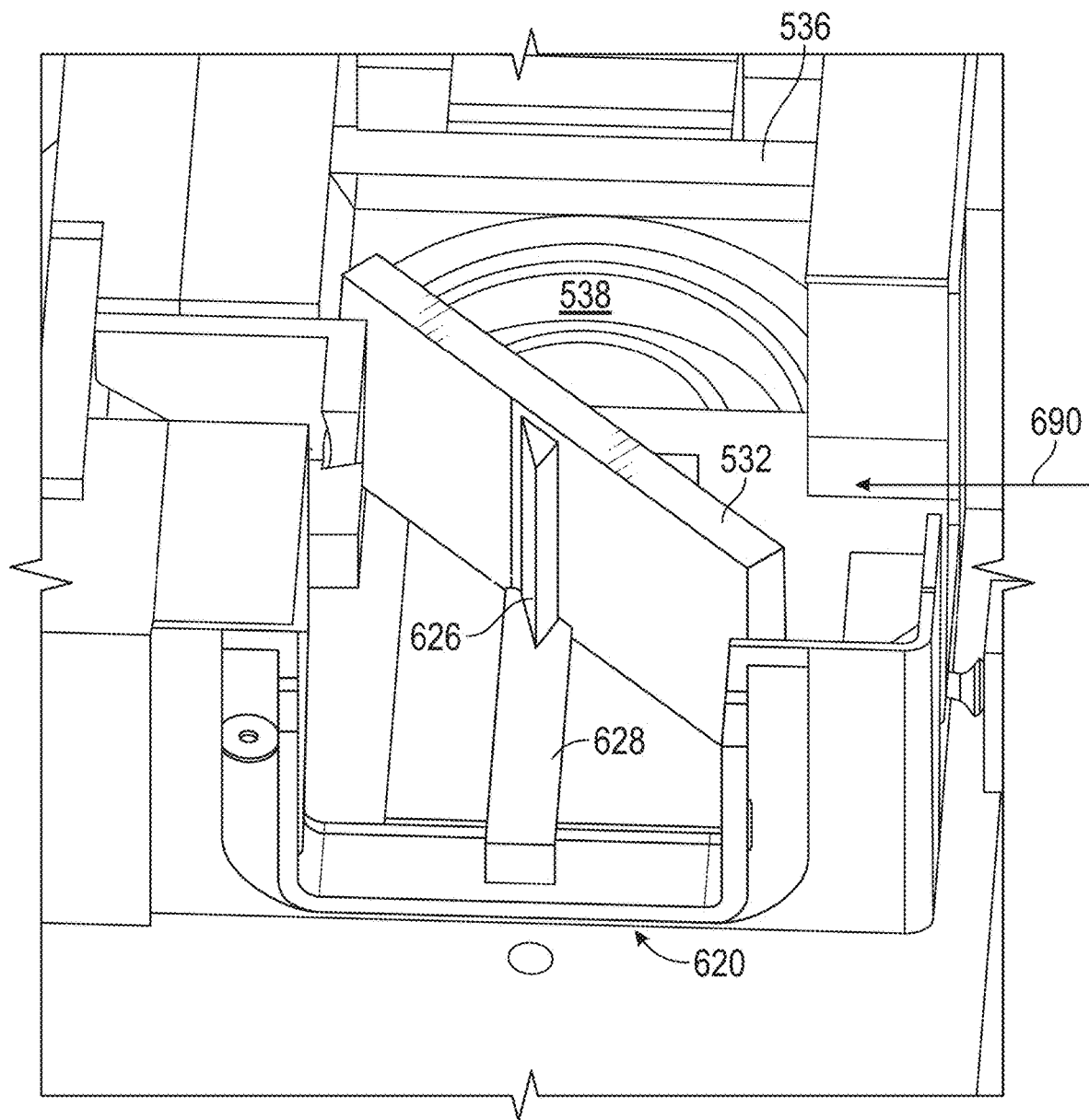
FIG. 17A presents a cutaway view of a beam blocker installed at the beam splitter in one example.

FIG. 17A presents a cutaway view of beam blocker 620 installed at beam splitter 532. With reference now to FIG. 17A, in operation, reflections of the focus tracking beams from surfaces S1, S2, S3 and S4 travel up from the objective lens, are reflected off of mirror 536 and directed toward beam splitter 532. Blocking face 630 (see FIGS. 16A and 16B) of blocking member 626 blocks the S4 reflections from continuing past beam splitter 532. It is shown in this example that extension arm 628 is dimensioned so as to place blocking member 626 at or near the surface of beam splitter 532. This figure also illustrates the tapered front angle of extension arm 628 to allow the blocking face 630 of blocking member 626 to be placed adjacent to and at substantially the same angle as beam splitter 532. In some examples, blocking member 626 is positioned such that blocking face 630 is in touching relation with beam splitter 532. In other examples, blocking member 626 is positioned such that blocking face 630 is separated from the face of beam splitter 532 by a small amount such as, for example, by 50 µm to 500 µm.

In alternative examples, a blocking element can be disposed on the back side of beam splitter 532 without the structure illustrated in FIGS. 16 and 17. For example, in some instances, a strip of opaque material can be attached to the rear surface of beam splitter 532. In other instances, an opaque or optically absorbent coating can be applied in a narrow stripe to the back of beam splitter 532.

For scanning operations, the imaging beams, which for example can be red and green imaging beams, enter the system from the right-hand side as illustrated by arrow 690. These beams are reflected off the front face of beam splitter 532 toward mirror 536. Mirror 536 reflects the imaging beams downward into the objective lens. Accordingly, the position of blocking member 626 is also selected so as not to interfere with the imaging beams reflected toward the sample (by front surface of beam splitter 532).

This example also illustrates that blocking member 626 presents a triangular cross-section, with the rear edges of blocking member 626 tapering to meet at an acute angle. Other cross-sectional geometries for blocking member 626 can be used, provided that blocking face 630 is properly dimensioned to block or substantially block reflections from surface S4. However, a geometry such as that illustrated, which reduces the cross-section toward the rear of blocking member 626 can minimize the chance that blocking member 626 may otherwise provide unwanted interference with desired beams.

Figure 17B:
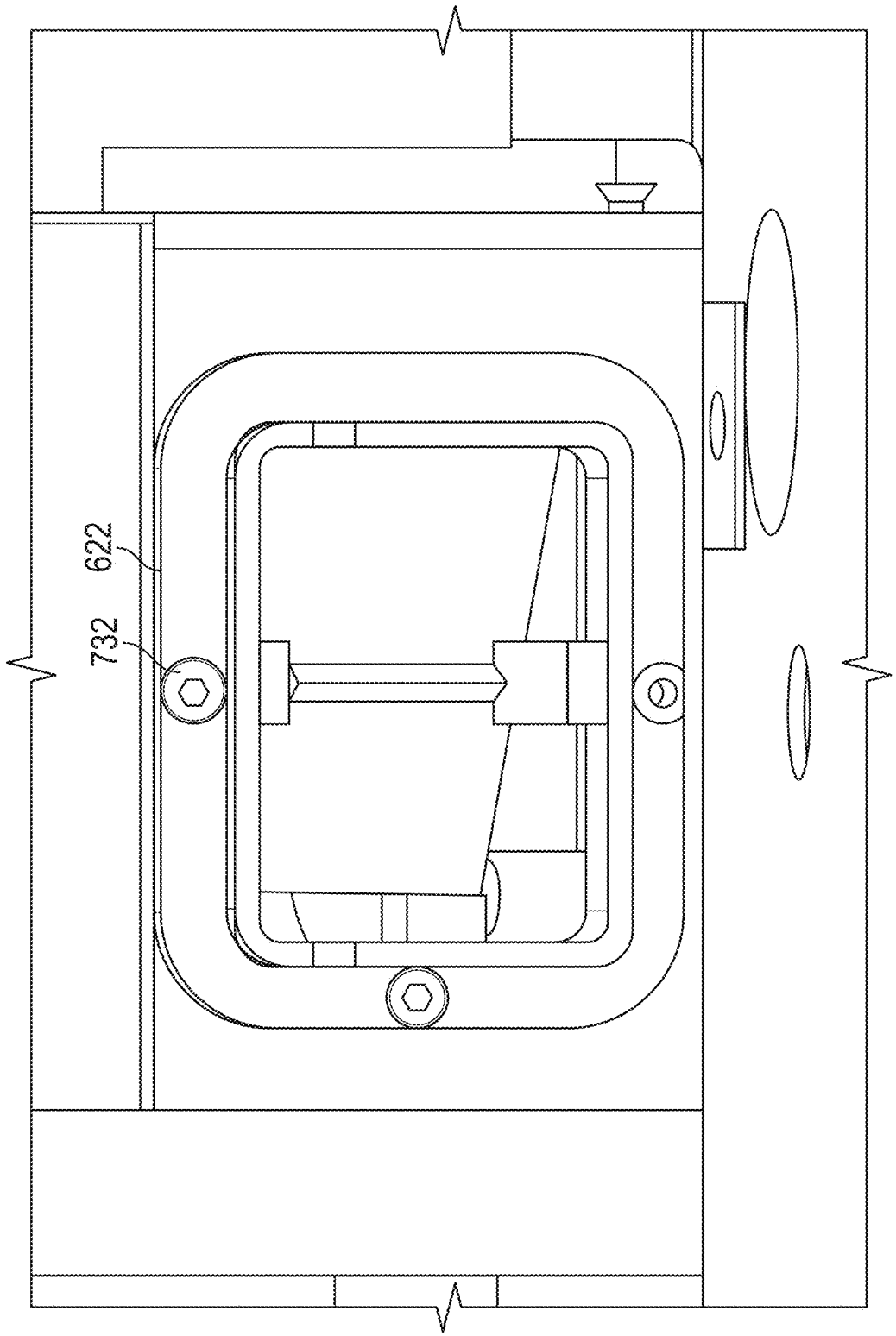
FIG. 17B presents a rear view of a beam blocker installed at the beam splitter.

FIG. 17B presents a rear view of beam blocker 620 installed at beam splitter 532. This illustrates the frame portion 622 mounted in place using bolts 732. This illustrates the window provided by aperture 624 that allows the light reflected from surfaces S2 and S3 (and S1, which is blocked later in the path) to pass, while blocking member 626 blocks the light from surface S4 before as it leaves beam splitter 532.

Figure 18A:
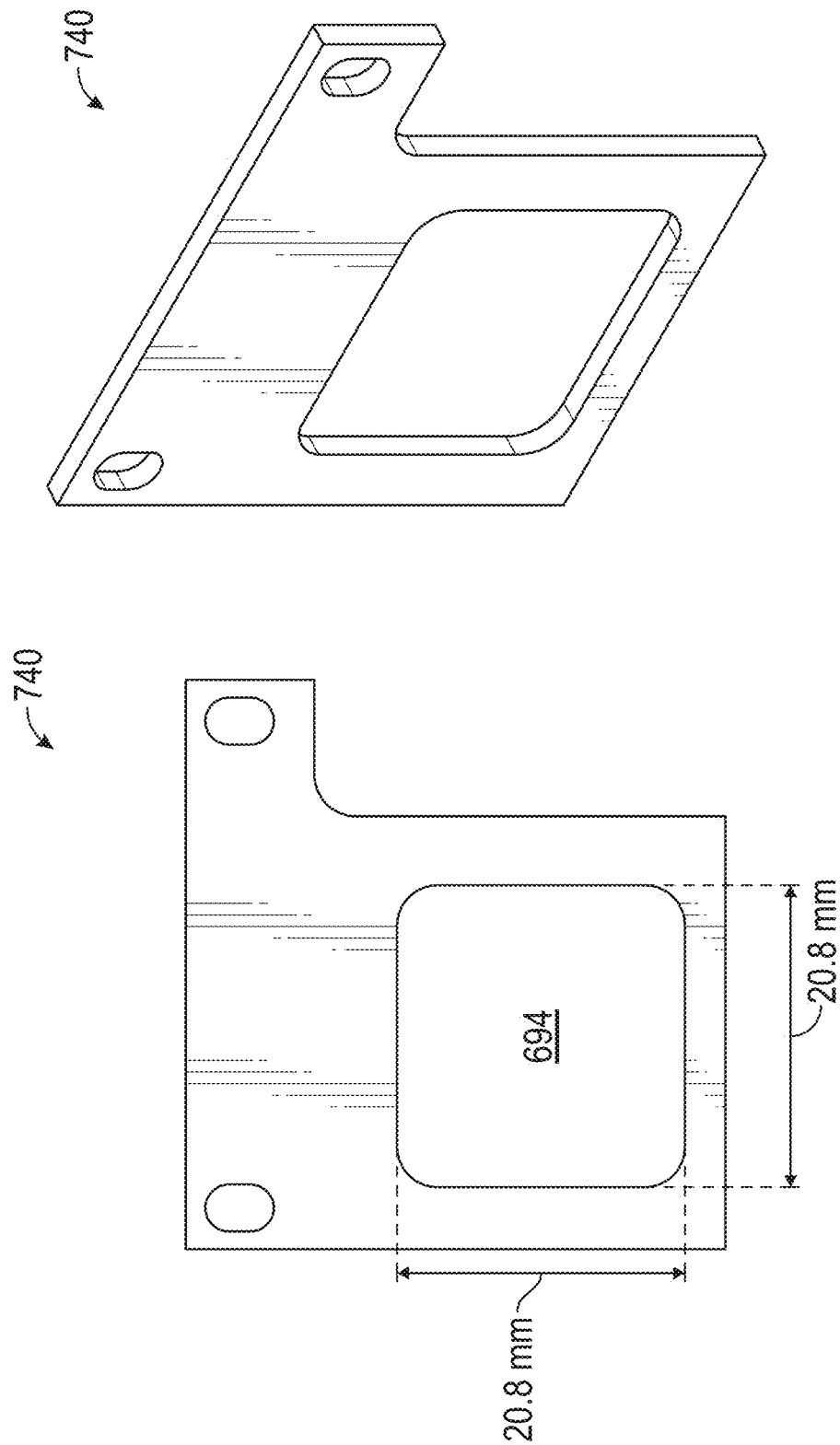
FIG. 18A illustrates an example of an aperture that can be used to block the beams reflected off the S1 surface.

FIG. 18A illustrates an example of an aperture that can be used to block the beams reflected off the S1 surface. In one example, this can be placed on the inside wall of the focus tracking module at the periscope aperture. As noted above, in one example implementation the aperture is 20.8 mm×20.8 mm, but in other examples other aperture sizes can be provided. As with the blocking member, the dimensions of the aperture can be chosen to block the unwanted reflections while providing the largest capture range possible for the S2 and S3 reflected beams relative to "best focus" considerations. FIG. 18B illustrates an example placement of the aperture 740 in front of the beam splitter 524 normal to the beam axis.

Figure 19:
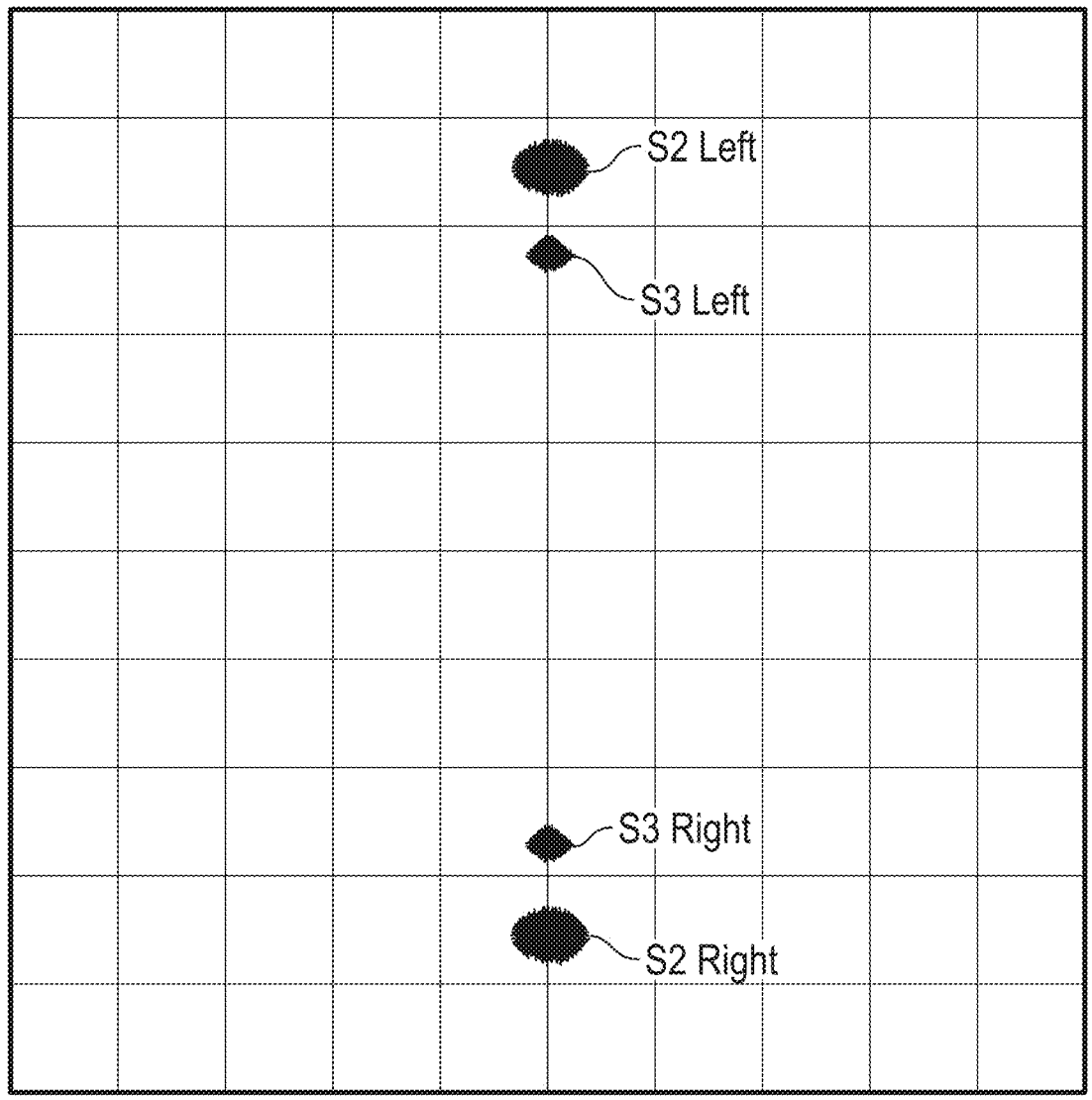
FIG. 19 shows spots from the beams at a top periscope mirror for focusing at the top of the sample.
Figure 20:
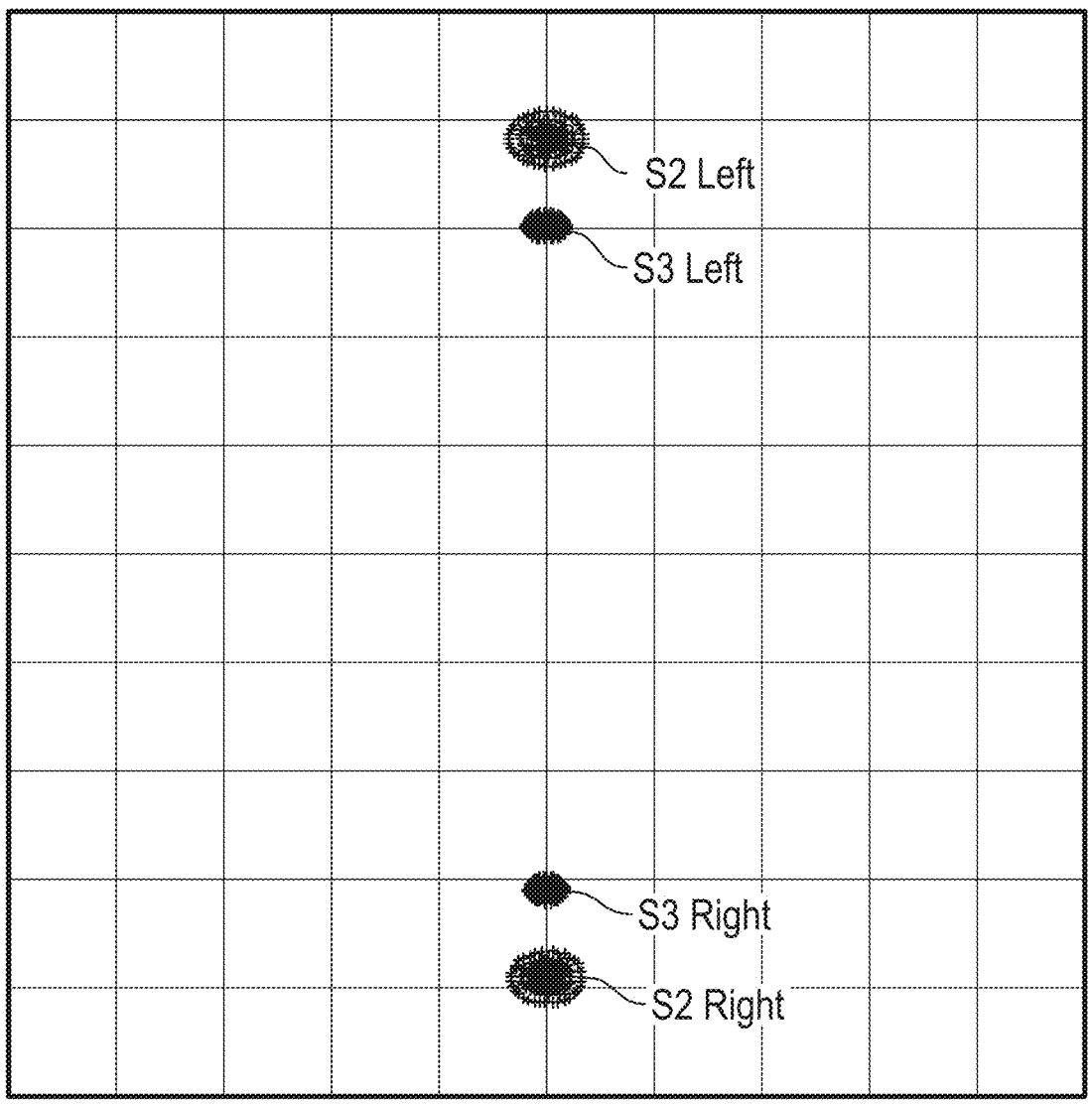
FIG. 20 shows spots from the beams at a top periscope mirror for focusing at the bottom of the sample.

FIGS. 19 and 20 show the results of the addition beam blocker 620 to block S4 reflections and a 20.8 mm×20.8 mm aperture to block S1 reflections. FIG. 19 shows spots from the beams at top periscope mirror 526 for focusing at the top of the sample (surface S2), and FIG. 20 shows spots from the beams at top periscope mirror 526 for focusing at the bottom of the sample (surface S3).

Although the foregoing was illustrated with objective focusing at surfaces S2 and S3, perfect focusing is not always achieved and therefore examples can be implemented to account for a capture range above and below the upper and lower sample. For example, the above modeling was also carried out assuming a "best focus" that accommodates focusing within +/−25 µm from the upper and lower sample surfaces. This "best focus" modeling confirmed that the above described structures are sufficient to block unwanted reflections from the S1 and S4 surfaces under best-focus operations.

Figure 21:
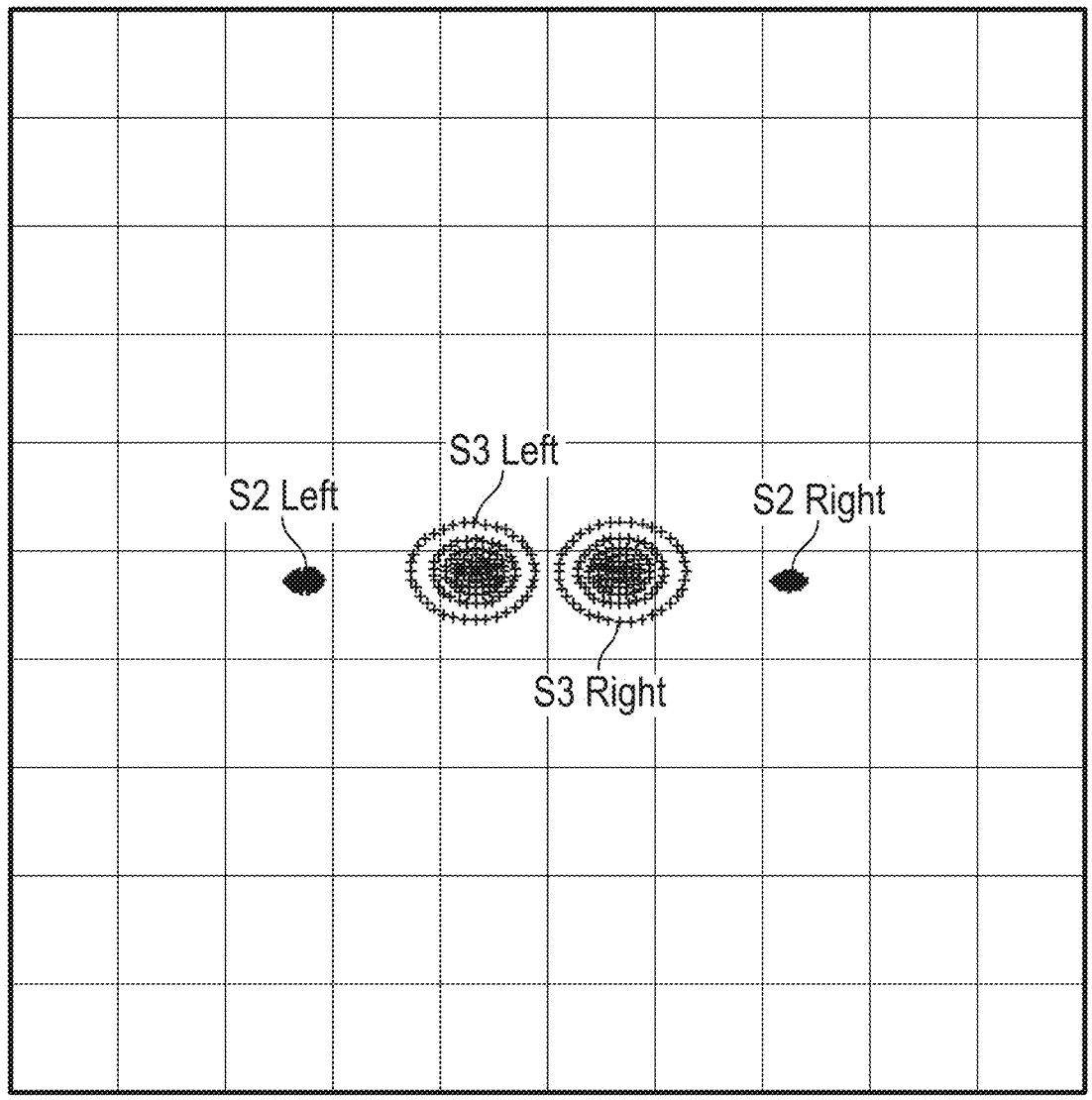
FIG. 21 illustrates spots at the camera for the S2, S3 reflected beams for imaging at the top of the capture range when focusing on S2.
Figure 22:
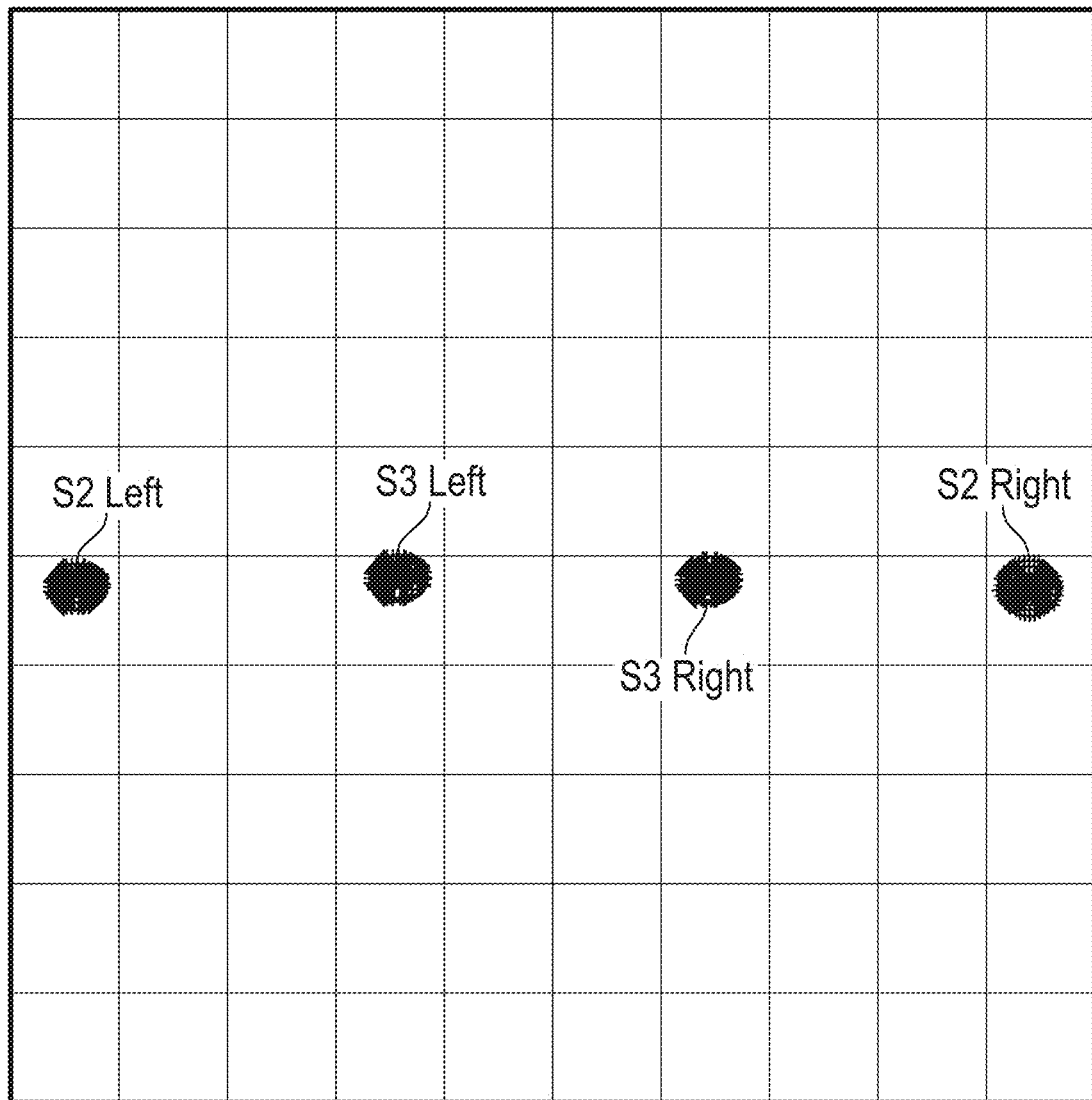
FIG. 22 illustrates spots at the camera for the S2, S3 reflected beams for imaging at the bottom of the capture range when focusing on S2.
Figure 23:
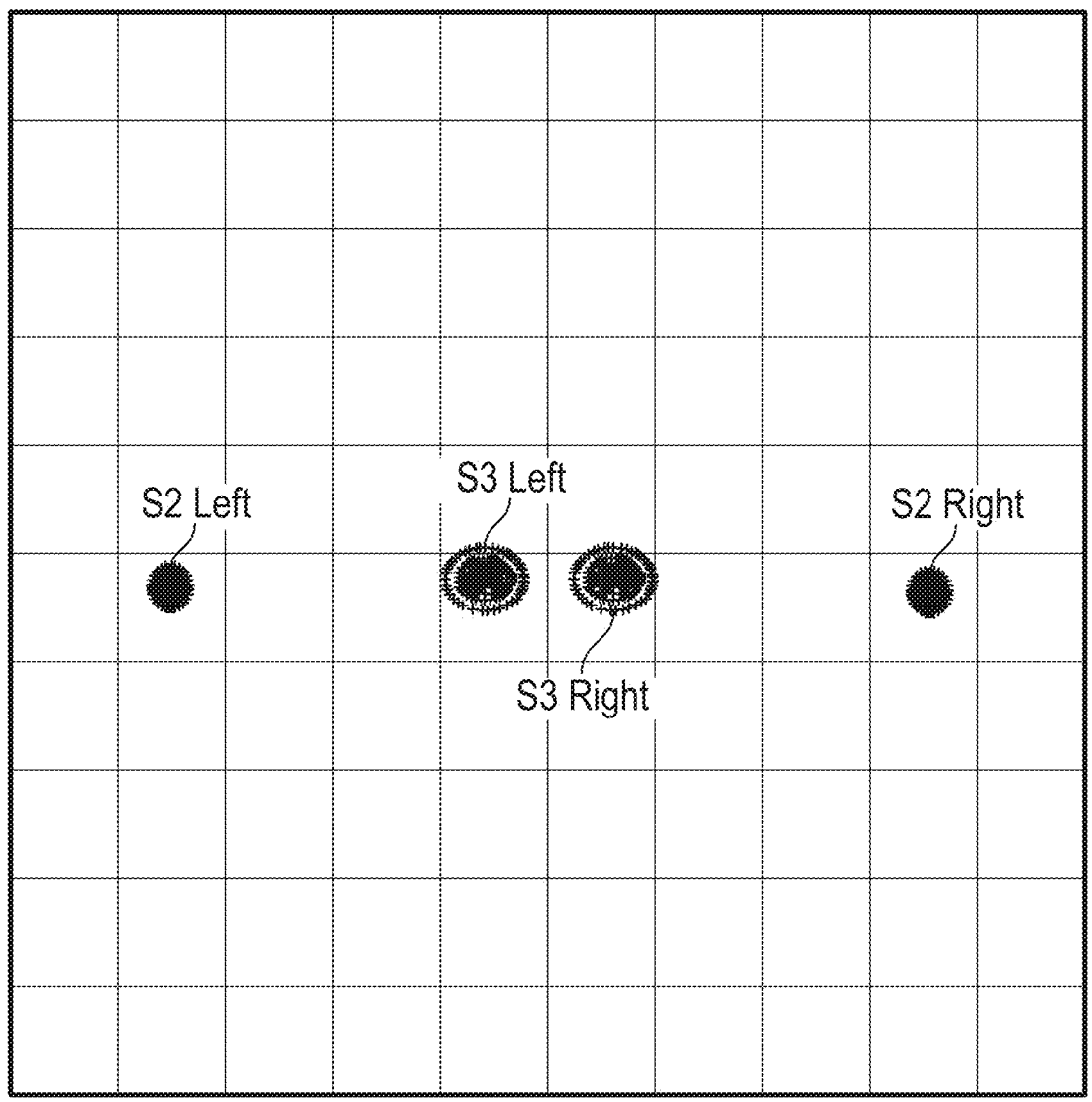
FIG. 23 illustrates spots at the camera for the S2, S3 reflected beams for imaging at the top of the capture range when focusing on S3.
Figure 24:
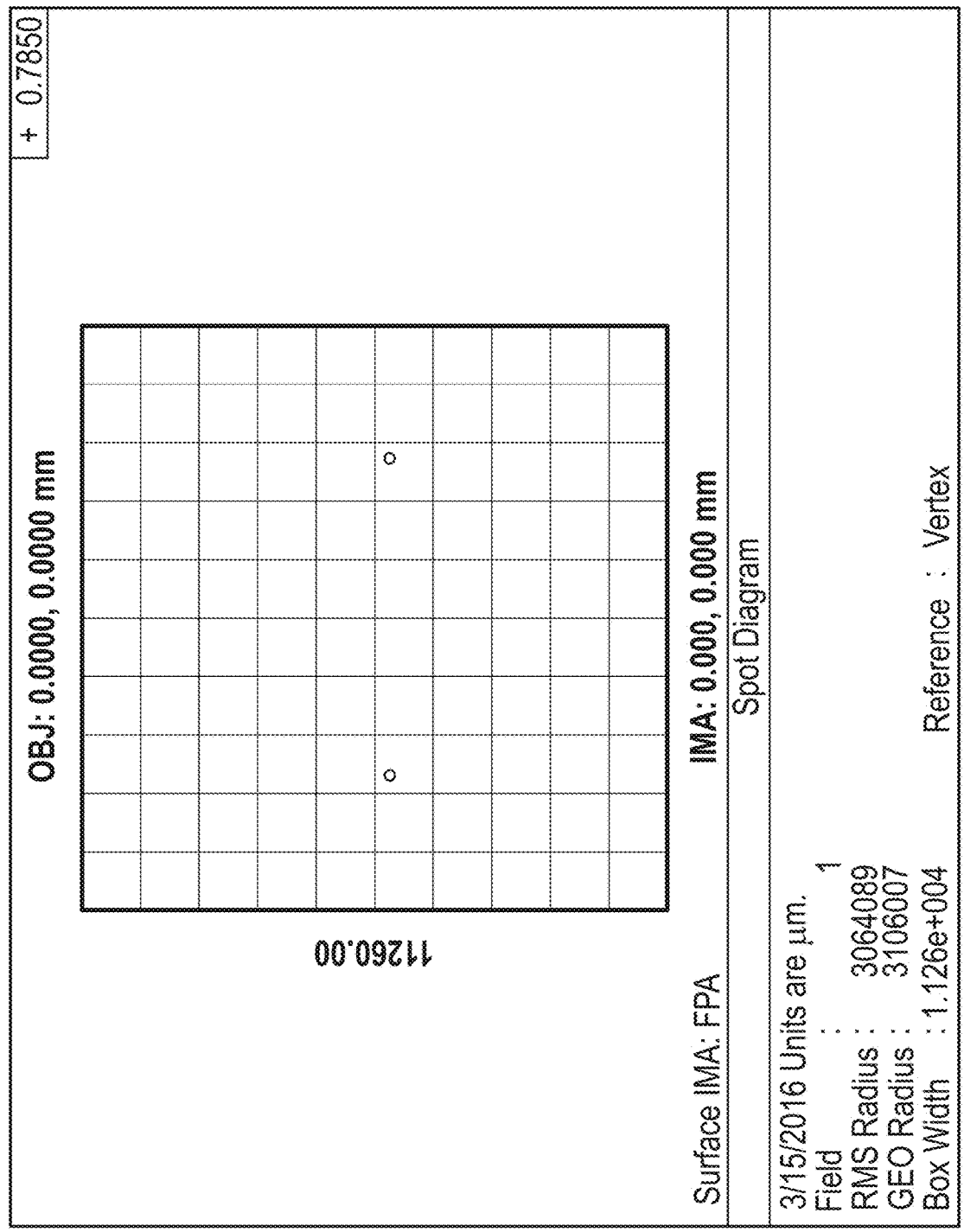
FIG. 24 illustrates spots at the camera for the S2, S3 reflected beams for imaging at the bottom of the capture range when focusing on S3.

FIGS. 21-24 are diagrams illustrating spot placement at the image sensor at the top and bottom of an example "best focus" capture range. In this instance, modeling was performed with the capture range of +/−25 µm. These diagrams show an image sensor area of 11.2 6 mm×11.26 mm. FIG. 21 illustrates spots at the camera for the S2, S3 reflected beams for imaging at the top of the capture range for focusing on S2 with the objective position 1.064 mm from S2. FIG. 22 illustrates spots at the camera for the S2, S3 reflected beams for imaging at the bottom of the capture range for focusing on S2 with the objective position 1.014 mm from S2. FIGS. 21 and 22 illustrate +/−25 µm variation from ideal focus position. FIG. 23 illustrates spots at the camera for the S2, S3 reflected beams for imaging at the top of the capture range when focusing on S3. FIG. 24 illustrates spots at the camera for the S2, S3 reflected beams for imaging at the bottom of the capture range when focusing on S3.

Figure 25B:
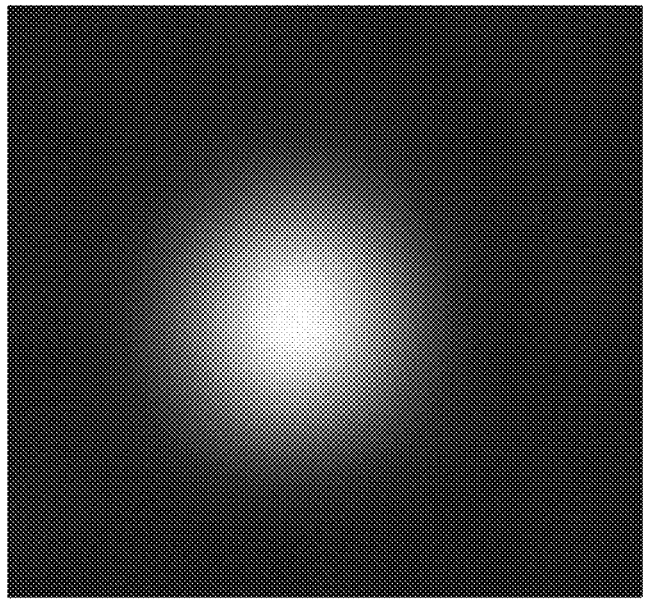
FIG. 25B illustrates, in one example, a spot profile in a beam spot on the image sensor with a laser diode operating in a low-power mode.
Figure 25A:
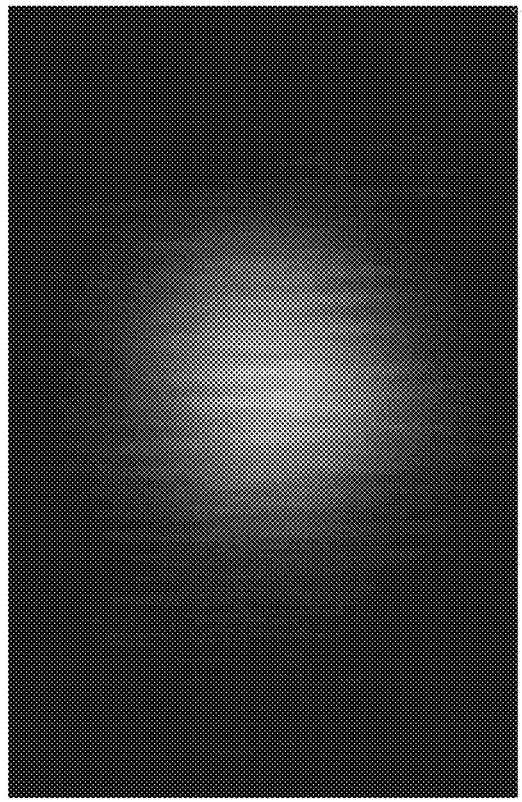
FIG. 25A illustrates, in one example, spot fringe variation in a beam spot on the image sensor with a laser diode operating in a lasing mode.

As described above, in focus tracking operations with the multi-beam system, spot separation, or the distance between the spots of the focus tracking beams on the image sensor is measured to determine focusing. Accordingly, stability of the spot separation can be an important factor in achieving accurate measurements. Spot separation stability can be impacted by factors such as movement of the focusing stage (sometimes referred to as the Z stage) spot quality/shape as a function of time, and resolution of the centroid algorithm used to resolve the spot separation. One challenge with spot separation stability is that spots inherently include fringes. Due to mode hopping of the laser, fringe patterns can change, which induces a variation in spot profile over time that affects the focus tracking module's spot separation stability. An example of this is illustrated in FIG. 25A, which illustrates spot fringe variation. This example shows spot fringe variation for laser operated at a power of 12 mW with the exposure time of 250 µs, with an OD 1.0 ND filter in place.

Operating a laser in a mode commonly referred to as Amplified Spontaneous Emission (ASE) tends to provide a cleaner spot profile. An example of this is illustrated in FIG. 25B. This example is for the same laser diode operated at 500 µW, 250 us exposure (No ND filter). In this mode the source emits temporally incoherent light, behaving more like an LED rather than a laser and has a wide optical bandwidth of 5 to 10 nm FWHM (full width at half maximum intensity). However, there are several disadvantages to operating in ASE mode, which is why typical pre-existing imaging systems are not operated in such a mode. First, ASE mode is not a lasing mode for the laser diode, therefore the output power is very low. It is generally defined as a mode below the lasing threshold in which no lasing occurs. As such, its output is temporally incoherent, and includes frequency components across a broad-spectrum.

Figure 26:
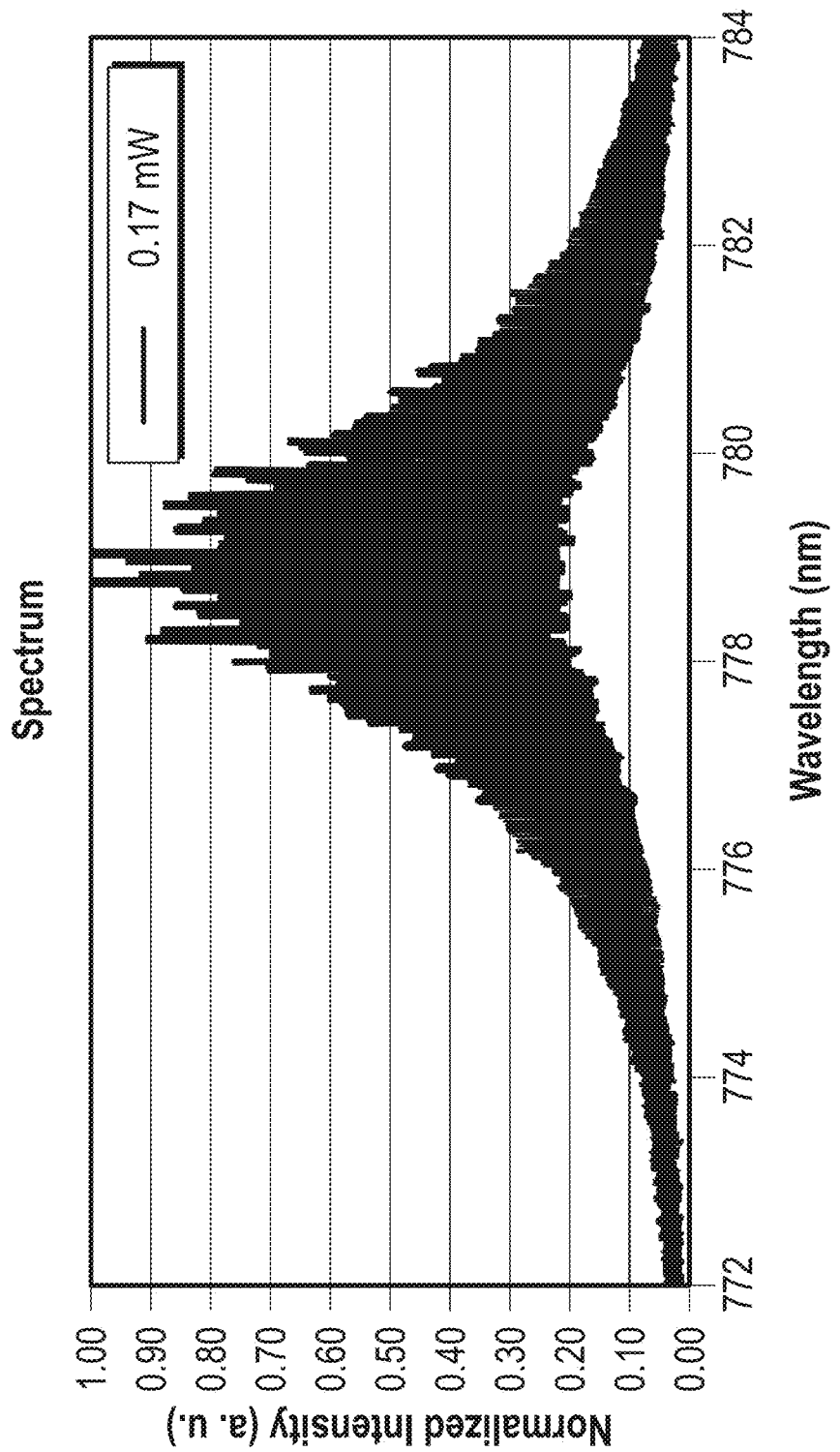
FIG. 26 is a diagram illustrating an example of a laser diode operated in an ASE mode.

FIG. 26 is a diagram illustrating an example of a laser diode operated in an ASE mode. In this example, the laser diode is operated at 0.17 mW and exhibits a relatively flat spectrum (when compared to the diode operating in a lasing mode) with frequency components across a broad range of wavelengths. There is no single mode of operation and the output is not coherent. Incoherence in the light source can lead to undesirable effects such as destructive interference and chromatic aberrations. Additionally, it may simply be impractical to operate in an ASE mode because there is not sufficient power emitted to produce a beam of sufficient intensity. There are other applications, however, in which a laser may be operated in ASE mode. In this mode, the laser diode tends to act more like an LED and, as such, it may be useful for certain applications.

Figure 27:
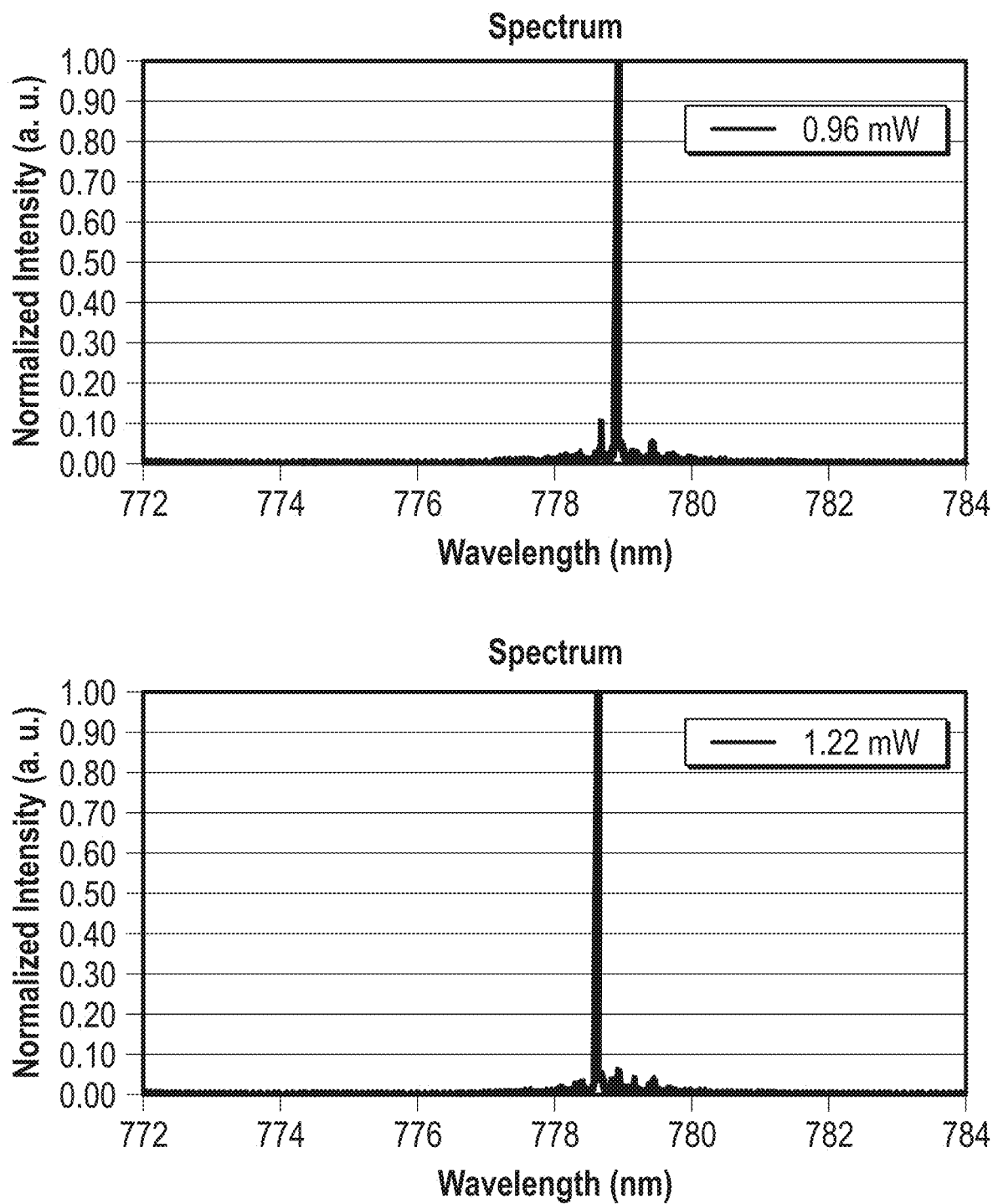
FIG. 27 is a diagram illustrating an example of a laser diode operated in a lasing mode.

FIG. 27 is a diagram illustrating an example of the same laser diode operated in a lasing mode. The diagram the top half of FIG. 27 illustrates the same laser diode operated at 0.96 mW, and the diagram in the bottom half of FIG. 27 illustrates the same laser diode operating at 1.22 mW. In both cases, the output is highly coherent with effectively a single dominant peak at the operating frequency and almost negligent secondary peaks. This is in stark contrast to the ASE mode which did not have a dominant peak.

Figure 28:
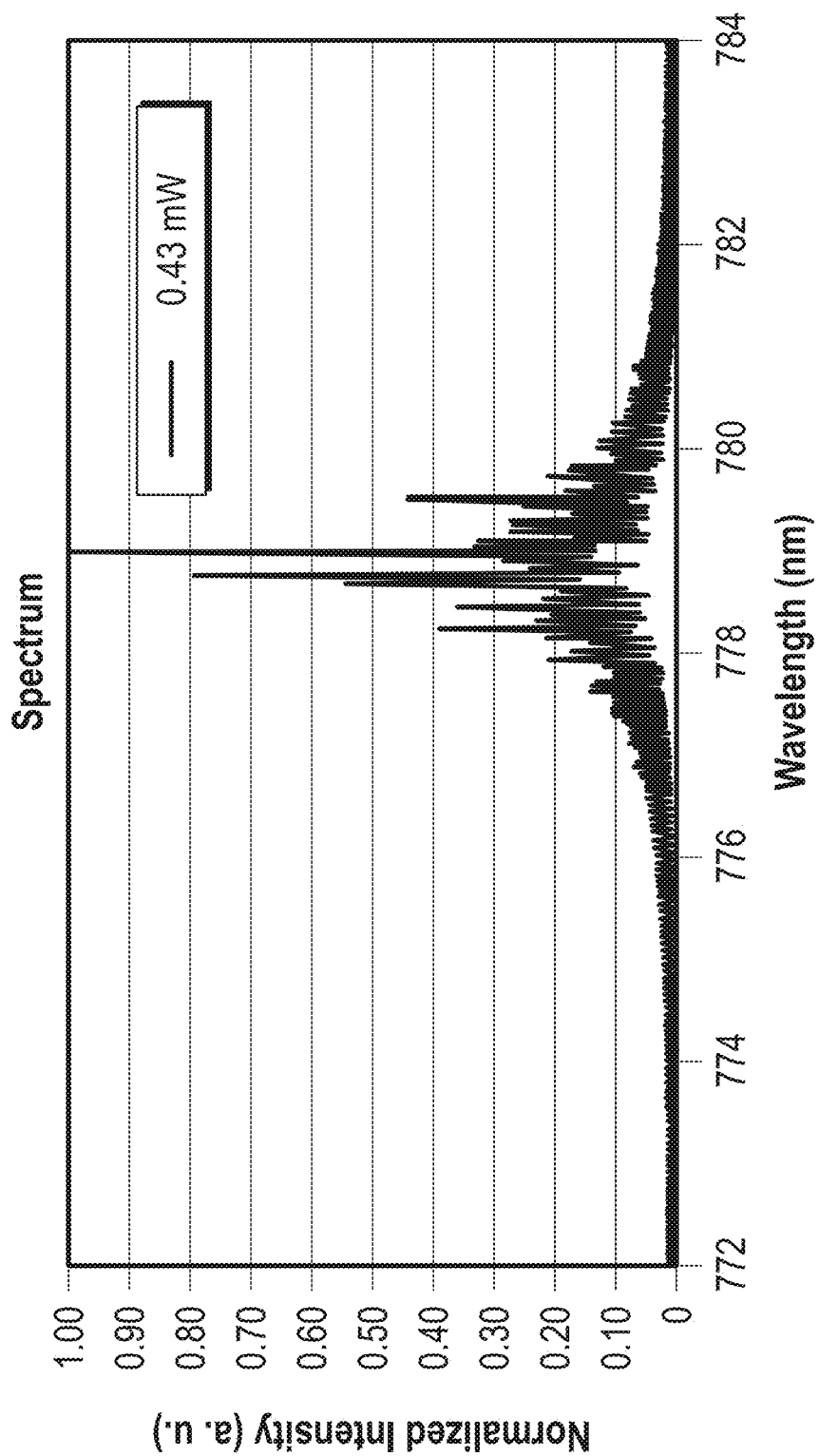
FIG. 28 is a diagram illustrating an example of a laser diode operated in a hybrid mode.

FIG. 28 is a diagram illustrating an example of a laser diode operated in a hybrid mode. FIG. 28 shows the laser in this example operating at 0.43 mW. At this power level a few dominant peaks are beginning to form but there are still strong secondary peaks. As this diagram illustrates, the laser diode is not in a strong lasing mode, yet it is also not in a full ASE mode. Power level levels may still be defined as above the lasing threshold, but the output is not fully coherent.

Because the ASE mode may produce output without enough power, operation in the ASE mode is not operationally practical. As noted above with reference to FIG. 25A, however, operating the scanning system in lasing mode creates temporally variant fringes which provides instability in spot measurement.

Figure 29:
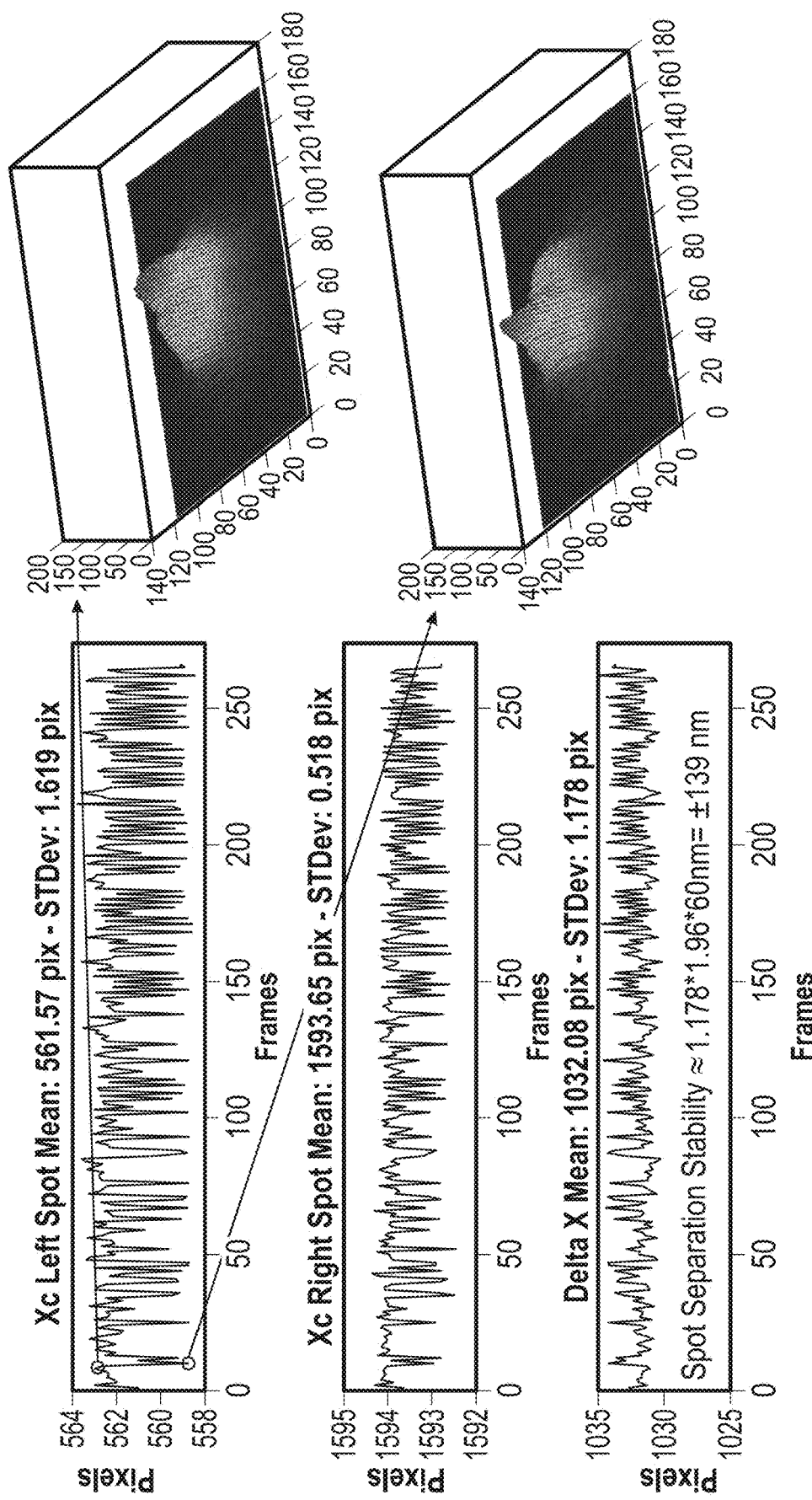
FIG. 29 illustrates instability in spot size when a laser diode is powered to operate in a lasing mode.

An example of this is illustrated at FIG. 29, which shows instability in the spot's morphology when the laser diode is powered to operate in a lasing mode in accordance with one example of the systems and methods described herein. As shown in this figure, the standard deviation of the left beam spot on the image sensor is 1.619 pixels and the standard deviation of the right beam spot on the image sensor is 0.518 pixels. However, as the graphs for the left and right spots illustrate, motion of the spot for each beam can be dramatic from one frame to the next, and indeed can shift several pixels. The beam profile for two adjacent frames of the left spot is shown in the profile images on the right-hand side of the figure. These profile images illustrate how the deviation of beam spot placement arises over time.

Because focus is determined by measuring the distance between the left and right spots on the image sensor, variations in spot placement can lead to inaccuracies in focus tracking. The impact of the movement of the left and right beams as shown in the top two graphs of FIG. 29 is illustrated in the bottom graph of the figure. This graph shows the change in distance, referred to here as Delta X, between the left and right spots over the same number of frames. This shows a standard deviation of 1.178 pixels, which leads to a spot separation stability of +/−139 nm with 95% confidence interval (~2*StDev for a Gaussian population). This is calculated as shown in the figure as (1.178*1.96)/16.67=+/−139 nm. The 16.67 factor represents the Focus tracking Gain in pixels/μm. It represents how many pixels of spot separation are obtained for every 1 μm shift of objective-to-sample distance. It is used for the conversion of a delta in spot separation (pixels) to a delta in space in z direction (nm).

The inventors have discovered that the interference fringe patterns arise due to the multilevel structure of the sample container as shown in FIG. 3A. The inventors have further discovered that this is a result of the superimposition of multiple beams and/or scattered light within the multi-layer glass sample container. Changes in the position of the sample container (e.g., in the X and Y direction) with no other changes can result in movement of the fringes.

Figure 30A:
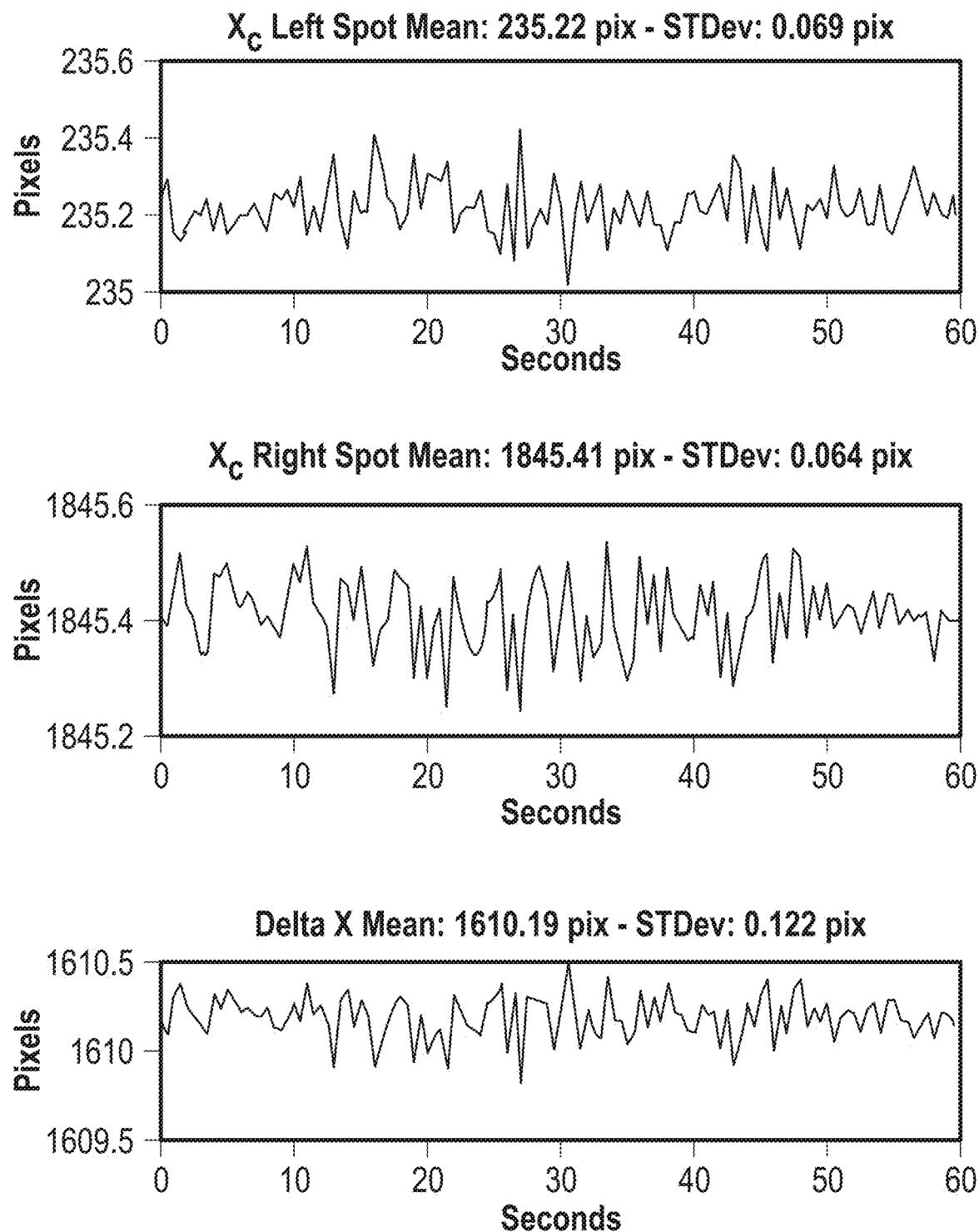
FIG. 30A illustrates an example of spot movement with a laser diode operating in a hybrid mode.
Figure 30B:
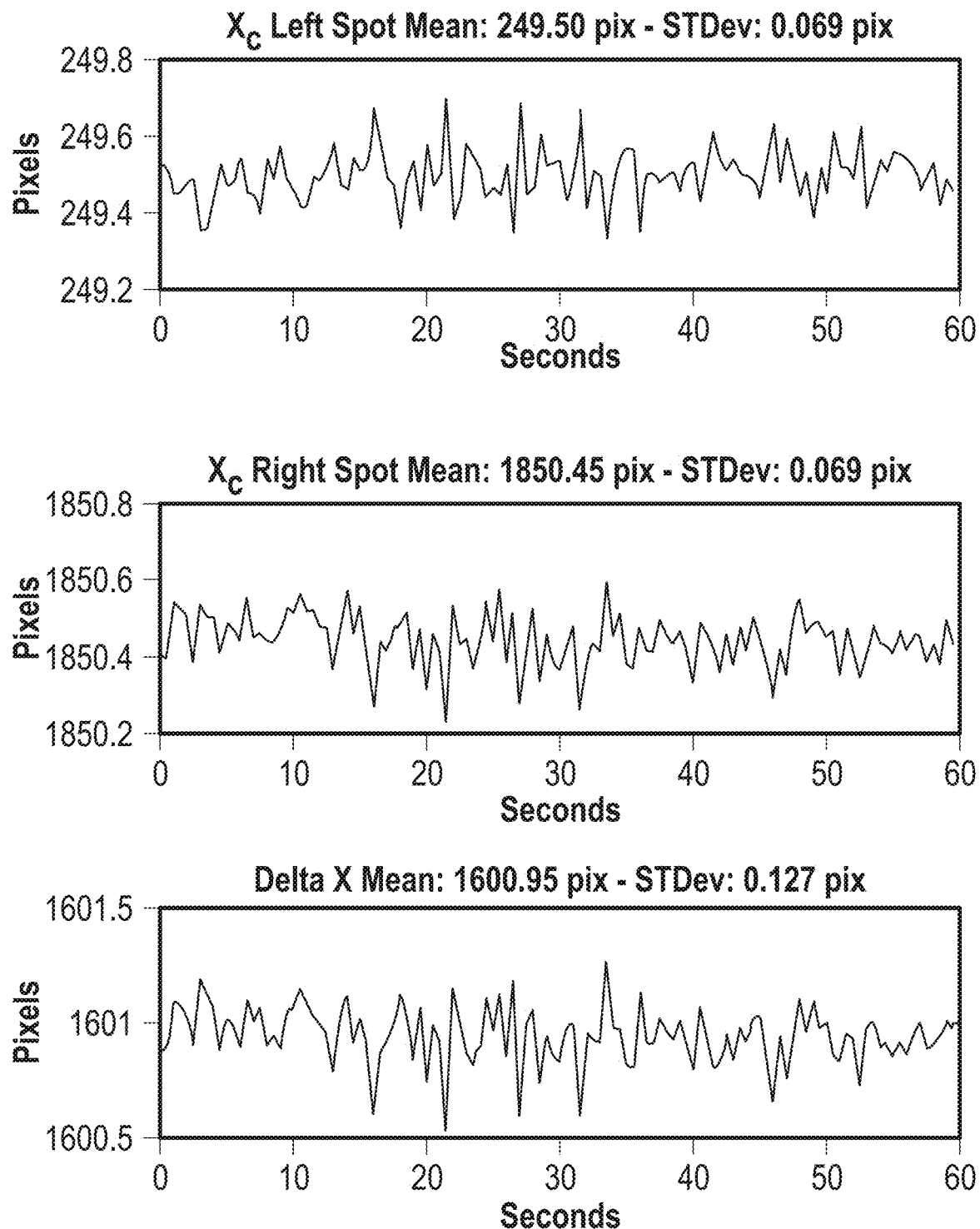
FIG. 30B illustrates an example of a spot movement with a laser diode operating in a hybrid mode.

FIGS. 30A and 30B illustrate additional examples of spot movement with the laser diode operating in a hybrid mode. Particularly, FIGS. 30A and 30B illustrate a more optimal scenario with a stable laser that is not mode hopping. As illustrated in FIG. 30A, standard deviation of the left spot is down to 0.069 pixels, and the right spot is down to 0.064 pixels. As the upper two graphs on the figure indicate, spot movement from frame to frame is generally less than one pixel. Because the movement can be additive, the Delta X difference between the left and right spots can have a standard deviation of 0.122 pixels. This reduces the spot separation stability to +/−14.3 nm ((0.122*1.96)/16.67 nm=+/−14.3 nm). Here, 16.67 is the FTM gain in pixel/μm. This is the amount of Delta X in pixel that is obtained when the objective moves 1 μm in the Z axis. This can be used to covert from pixels in Delta X to μm in the Z space and vice versa. Additionally, 1.96 is the multiplication factor for the standard deviation to express 95% confidence interval of the error of the distribution (assuming it's a Gaussian distribution).

In the example of FIG. 30B, the standard deviation of the left spot is down to 0.069 pixels, and the right spot is also down to 0.069 pixels. As the upper two graphs on the figure indicate, spot movement from frame to frame is generally less than one pixel. Because the movement can be additive, the Delta X difference between the left and right spots can have a standard deviation of 0.127 pixels. This reduces the spot separation stability to +/−15.2 nm ((0.127*1.96)/16.67 nm=+/−15.2 nm).

As noted above, it is impractical to run the laser in a pre-existing ASE mode. As also just described, accuracy suffers with the laser diode running at a power level above the lasing threshold, and this is especially true if mode hopping occurs (such as, for example, via power variations). However, the inventors have discovered that operating the laser in a hybrid mode, between the ASE mode and a full lasing mode, provide sufficient beam intensity for measurement at the image sensor and increased spot placement stability for improved measurement accuracy. This mode can be achieved in some instances by operating slightly above the lasing threshold of the laser diode. For example, this might occur slightly past the knee of the lasing curve, but is still low enough that a significant portion of the power is in the ASE state. This produces an output where a large amount of the light still has a broader spectral width resulting in significantly reduced coherence.

Operating a laser in this hybrid mode can be advantageous as compared to other light sources that might be used to attempt to achieve the same effect. Laser diodes tend to be desirable light sources because they exhibit a high reliability and low cost, due to the high volume manufacturing of this type of devices by different companies in the field. Operating laser diode in this lower power mode can even increase the typical high MTBF ratings that can be achieved by laser diodes. Therefore it is possible to achieve the result of a device with very high lifetime and MTBF rating (combination of the laser diode characteristics and very low operating power), low cost of manufacture and short enough coherence length to eliminate interference fringes caused by the sample container's multi-layer structure.

Table 1 μs a diagram illustrating spot separation stability with various alternative solutions implemented. The first group of measurements assumes a laser power of 12 mW to operate in a lasing mode, presence of an ND filter to attenuate light, and a 250 μs exposure. Here the center of mass or spot separation stability is 396.02 nm for Noise Floor 1 and 146.0 nm for Noise Floor 2. As the table illustrates, the stability improves if 2D or 1D Gaussian filtering is added. Gaussian filters can be added to mitigate the effect of fringes and provide a more uniform spot profile. As this table also illustrates, reducing the power of the laser diode to 0.5 mW reduces the center of mass error, which means greater stability. Particularly, in this example, the center of mass error is reduced to 14.6 nm for Noise Floor 1 and 15.2 nm for Noise Floor 2.

TABLE 1

| | Laser Power = 12 mW, Exp: 250 μs; ND filter | | | |
| --- | --- | --- | --- | --- |
| | Center of Mass (error in nm) | 2D Gaussian Filtering + Center of Mass (error in nm) | 1D Gaussian Filtering (FWHM = 50 pix) + Center of Mass (error in nm) | Laser Power = 0.5 mW, Exp: 250 μs Center of Mass (error in nm) |
| Noise Floor 1 at x = 28, y = −50 | 396.02 | 113.05 | 64.76 | 14.6 |
| Noise Floor 2 at x = 28, y = 50 | 146.00 | 134.66 | 46.30 | 15.2 |

Operating the laser diode at 0.5 mW as opposed to 12 mW in this example means that the laser is not truly in a lasing mode. This power level, however, is high enough that the laser diode is not operating in an ASE mode either. Instead, in this power range, the laser may be referred to as operating in a hybrid mode or a quasi-lasing mode. This is unusual for laser operations. Normally, it is intended to run the laser in a clearly identifiable lasing mode, and pre-existing systems operate laser diodes and power levels comfortably above the lasing threshold. Operating the laser in this hybrid mode is counterintuitive and atypical of laser operations.

Figure 31:
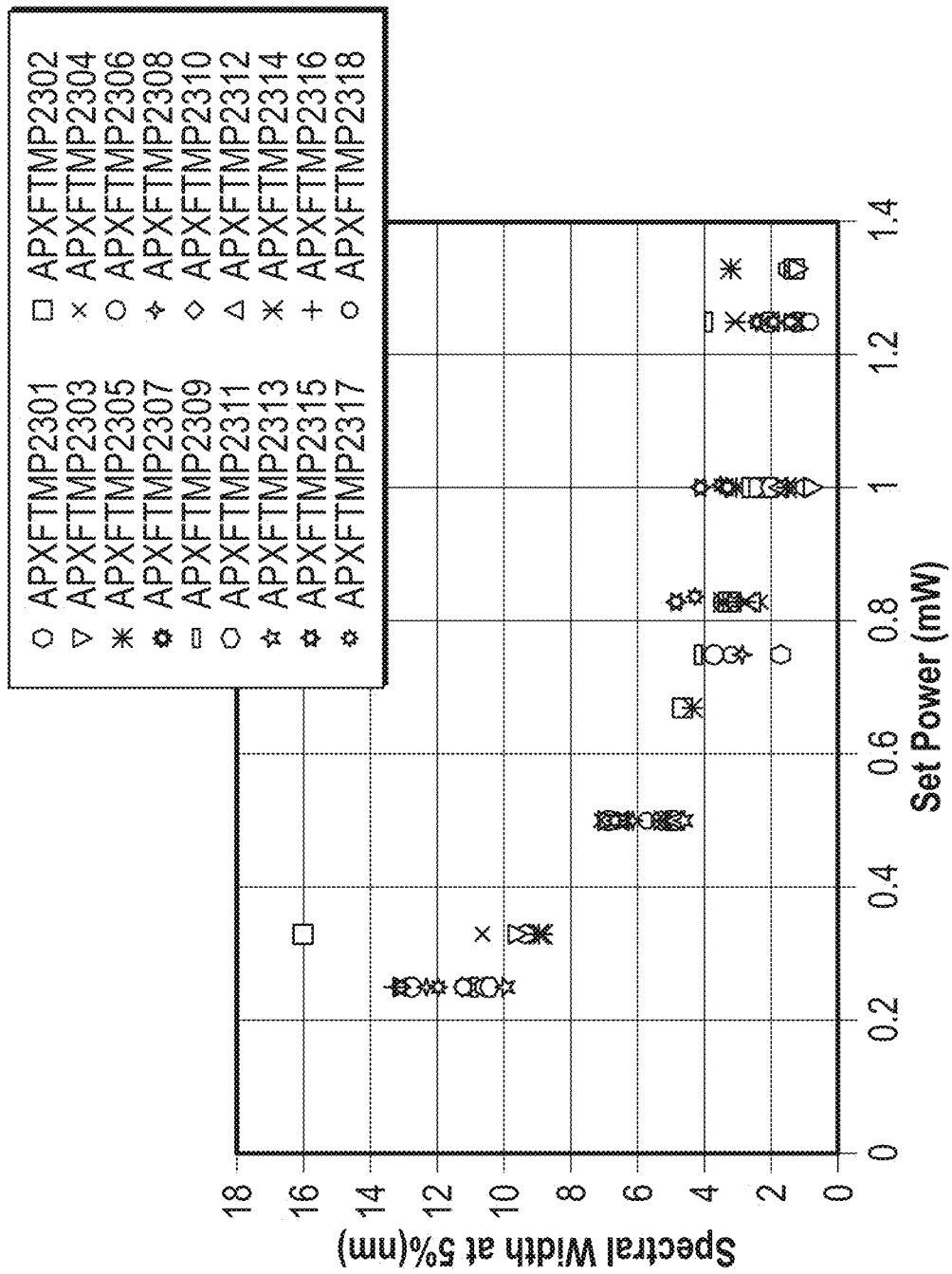
FIG. 31 is a diagram illustrating an example of the spectral width of various laser sources tested to determine the relationship between spectral width at 5% and set power.

FIG. 31 is a diagram illustrating an example of the relationship of 5% full spectral width (FW at 5%) to laser power of various laser sources. As seen in this chart, the FW at 5% increases as the set power decreases. Accordingly, various examples are configured with the laser power set to operate the laser in this hybrid mode to provide sufficient spot intensity for detection at the image sensor in a reasonable amount of time, yet to sufficiently limit the laser power so as to not create fringe patterns that introduce unwanted instability in the spot placement. Because lower intensity requires a longer exposure time for sufficient readout at the image sensor, decreasing the laser power can negatively impact the latency of the focus tracking system. Therefore, when determining whether sufficient intensity is provided, it may be useful to consider the amount of time required to complete the focus tracking measurement and whether that sufficiently achieves latency goals for the system. The amount of power applied to the laser to achieve the foregoing depends on the laser diode specified, sensitivity and speed of the image sensor (for latency considerations), latency requirements of the system and the accuracy requirements of the system.

Other examples can be implemented with the laser power set to operate the laser such that the dominant peak in the laser diode output at a given frequency has a normalized intensity of between 15%-100% greater than any secondary peaks in the laser diode output. In yet other examples the power level at which the laser diode light source is operated is selected such that the dominant peak in the laser diode output at a given frequency has a normalized intensity of between 15%-25% greater than a normalized intensity of a secondary peak in the laser diode output. In still other examples the power level at which the laser diode light source is operated is selected such that the dominant peak in the laser diode output at a given frequency has a normalized intensity of between 15%-100% greater than a normalized intensity of a secondary peaks in the laser diode output. In further examples, the power level at which the laser diode light source is operated is selected such that the dominant peak in the laser diode output at a given frequency has a normalized intensity of between 15%-200% greater than a normalized intensity of a secondary peak in the laser diode output.

Another metric that can be used for setting the power at which the light source is operated can be the maximum exposure time the system can tolerate while meeting predetermined focus tracking latency requirements. Generally speaking, as the power at which the laser is operated is reduced the amount of spot fringing is also reduced, improving focus tracking accuracy. However, below a certain power amount insufficient intensity is provided at the image sensor to enable detection of the spots or to enable detection in a sufficiently short exposure time to meet latency requirements. Therefore, the power setting can be reduced to the point where the required corresponding exposure time is at or near the maximum exposure time allowed for system latency in the focus tracking operation. In the example provided above, the exposure time for the light source operated at a 0.5 mW is 250 µs.

While various examples of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that the disclosed technology be implemented to perform the recited functionality in the same order unless the context dictates otherwise.

Although the disclosed technology is described above in terms of various example configurations and implementations, it should be understood that the various features, aspects and functionality described in one or more of the individual examples are not limited in their applicability to the particular example with which they are described, but instead can be applied, alone or in various combinations, to one or more of the other examples of the disclosed technology, whether or not such examples are described and whether or not such features are presented as being a part of a described example. Thus, the breadth and scope of the technology disclosed herein should not be limited by any of the above-described examples.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide example instances of the item in discussion, not an exhaustive or limiting list thereof; the terms "a" or "an" should be read as meaning "at least one," "one or more" or the like; and adjectives such as "pre-existing," "traditional," "normal," "standard," "known" and terms of similar meaning should not be construed as limiting the item described to a given time period or to an item available as of a given time, but instead should be read to encompass pre-existing, traditional, normal, or standard technologies that may be available or known now or at any time in the future. The term comprising is intended herein to be open-ended, including not only the recited elements, but any additional elements as well. Likewise, where this document refers to technologies that would be apparent or known to one of ordinary skill in the art, such technologies encompass those apparent or known to the skilled artisan now or at any time in the future.

The term "coupled" refers to direct or indirect joining, connecting, fastening, contacting or linking, and may refer to various forms of coupling such as physical, optical, electrical, fluidic, mechanical, chemical, magnetic, electromagnetic, optical, communicative or other coupling, or a combination of the foregoing. Where one form of coupling is specified, this does not imply that other forms of coupling are excluded. For example, one component physically coupled to another component may reference physical attachment of or contact between the two components (directly or indirectly), but does not exclude other forms of coupling between the components such as, for example, a communications link (e.g., an RF or optical link) also communicatively coupling the two components. Likewise, the various terms themselves are not intended to be mutually exclusive. For example, a fluidic coupling, magnetic coupling or a mechanical coupling, among others, may be a form of physical coupling.

The presence of broadening words and phrases such as "one or more," "at least," "but not limited to" or other like phrases in some instances shall not be read to mean that the narrower case is intended or required in instances where such broadening phrases may be absent. The use of the term "component" does not imply that the elements or functionality described or claimed as part of the component are all configured in a common package. Indeed, any or all of the various elements of a component, including structural elements, can be combined in a single package or separately maintained and can further be distributed in multiple groupings or packages.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

The terms "substantially" and "about" used throughout this disclosure, including the claims, are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Additionally, the various examples set forth herein are described in terms of example diagrams and other illustrations. As will become apparent to one of ordinary skill in the art after reading this document, the illustrated examples and their various alternatives can be implemented without confinement to the illustrated examples. For example, block diagrams and their accompanying description should not be construed as mandating a particular architecture or configuration.

We claim:

1. An imaging system, comprising:
    a laser diode light source operable in an Amplified Spontaneous Emission ("ASE") mode and in a lasing mode, the ASE mode comprising frequency components across a range of wavelengths without a single dominant peak, the lasing mode comprising a single dominant peak at an operating frequency;
    an objective lens positioned to direct a focus tracking beam from the laser diode light source onto a location in a sample container and to receive the focus tracking beam reflected from a sample in the sample container; and
    an image sensor comprising a plurality of pixel locations to receive the focus tracking beam that is reflected off of the location in the sample container, where the reflected focus tracking beam creates a spot on the image sensor;
    wherein the laser diode light source is configured to operate at a power level that is above a power level for operation in the ASE-mode and below a power level for fully operating in the lasing mode.

2. The imaging system of claim 1, wherein the power level at which the laser diode light source is operated is at an input current that is between about 2%-10% above a lasing threshold current for the laser diode light source.

3. The imaging system of claim 1, wherein a laser operating current of the laser diode light source is set between about 0.6 and 3.0 mA above a lasing threshold current.

4. The imaging system of claim 1, wherein the power level of the laser diode light source is set such that laser spectrum full width at about 5% is greater than 2 nm.

5. The imaging system of claim 1, wherein the power level at which the laser diode light source is operated is selected such that a dominant peak in a laser diode output at a given frequency has a normalized intensity of between about 15%-100% greater than any secondary peaks in the laser diode output.

6. The imaging system of claim 1, wherein the power level at which the laser diode light source is operated is selected such that a dominant peak in a laser diode output at a given frequency has a normalized intensity of between about 15%-25% greater than a normalized intensity of a secondary peak in the laser diode output.

7. The imaging system of claim 1, wherein the power level at which the laser diode light source is operated is selected such that a dominant peak in a laser diode output at a given frequency has a normalized intensity of between about 15%-100% greater than a normalized intensity of a secondary peaks in the laser diode output.

8. The imaging system of claim 1, further comprising a beam splitter to split the focus tracking beam from the laser diode light source into at least two focus tracking beams to be reflected off of the location in the sample container and provide at least two spots on the image sensor, wherein the power level at which the laser diode light source is operated is selected such that spot stability separation of the at least two spots on the image sensor is less than about +/−18 nm.

9. The imaging system of claim 1, wherein the power level at which the laser diode light source is operated is selected such that an amount of fringing on the spot on the image sensor is less than about 10% peak to peak across a profile of the spot.

10. The imaging system of claim 1, further comprising a windowed sinc filter or Blackman window filter communicatively coupled to the image sensor to receive output signals from the image sensor to reduce a standard deviation of a position of the spot over time on the image sensor.

11. The imaging system of claim 1, wherein the power level at which the laser diode light source is operated is selected as a minimum power at which an exposure time for the image sensor to sense the focus tracking beam is not longer than a time limit to meet a predetermined latency requirement for focus tracking.

12. The imaging system of claim 11, wherein the exposure time required by the image sensor is less than about 250 µs.

13. An imaging system, comprising:
    a laser diode light source operable in an Amplified Spontaneous Emission ("ASE") mode and in a lasing mode, the ASE mode comprising frequency components across a range of wavelengths without a single dominant peak, the lasing mode comprising a single dominant peak at an operating frequency;
    a beam splitter disposed in the imaging system at a position to receive a focus tracking beam from the laser diode light source and to split the focus tracking beam into at least two focus tracking beams;
    an objective lens positioned to direct the at least two focus tracking beams from the laser diode light source onto a location in a sample container and to receive reflections of the at least two focus tracking beams reflected from a sample in the sample container;

an image sensor comprising a plurality of pixel locations to receive the focus tracking beams reflected off of the location in the sample container, wherein the at least two reflected focus tracking beams create at least two spots on the image sensor;

wherein the laser diode light source is configured to operate at a power level that is selected above a power level for operation in the ASE mode and below a power level for full operation in the lasing mode such that spot stability separation of the at least two spots on the image sensor is less than about 20 nm.

14. The imaging system of claim 13, wherein the power level at which the laser diode light source is operated is selected such that spot stability separation of the at least two spots on the image sensor is between about 15 and 17 nm.

15. The imaging system of claim 13, further comprising a windowed sine filter circuit or a Blackman window filter circuit communicatively coupled to the image sensor to receive output signals from the image sensor and to reduce a standard deviation of a position of the at least two spots over time on the image sensor.

16. The imaging system of claim 13, wherein the power level at which the laser diode light source is operated is such that an amount of fringing on each of the at least two spots on the image sensor is less than about 10% peak to peak across a profile of each of the at least two spots.

17. The imaging system of claim 13, wherein the power level at which the laser diode light source is operated is selected such that a standard deviation of a position of each of the at least two spots on the image sensor is less than 10% of a pixel size of the image sensor.

18. The imaging system of claim 13, wherein the power level at which the laser diode light source is operated is selected such that spot stability separation of the at least two spots on the image sensor is less than about 5% of a pixel size of the image sensor.

19. The imaging system of claim 13, wherein the power level at which the laser diode light source is operated is selected as a minimum power at which an exposure time required by the image sensor to sense a focus tracking beam of the at least two focus tracking beams is not longer than a time limit required to meet a predetermined latency requirement for focus tracking.

20. The imaging system of claim 19, wherein the exposure time required by the image sensor is less than about 250 µs.

21. The imaging system of claim 13, wherein the power level of the laser diode light source is set below that corresponding to an onset of fringes for the at least two spots.

22. The imaging system of claim 13, wherein a laser operating current of the laser diode light source is set between about 0.6 and 3.0 mA above a lasing threshold current.

23. The imaging system of claim 21, wherein the laser power level is set such that laser spectrum full width at about 5% is greater than 2 nm.

* * * * *